US012736826B2

(12) United States Patent
Yun et al.

(10) Patent No.: US 12,736,826 B2

(45) **Date of Patent: *Sep. 15, 2026**

(54) IMAGE SENSOR INCLUDING COLOR SEPARATING LENS ARRAY AND ELECTRONIC APPARATUS INCLUDING THE IMAGE SENSOR

(71) Applicant: SAMSUNG ELECTRONICS CO., LTD., Suwon-si (KR)

(72) Inventors: Seokho Yun, Hwaseong-si (KR); Sookyoung Roh, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 416 days.

This patent is subject to a terminal disclaimer.

(21) Appl. No.: 17/078,612

(22) Filed: Oct. 23, 2020

(65) Prior Publication Data

US 2021/0124179 A1 Apr. 29, 2021

(30) Foreign Application Priority Data

Oct. 23, 2019 (KR) ........................ 10-2019-0132385
Nov. 14, 2019 (KR) ........................ 10-2019-0146210
Sep. 10, 2020 (KR) ........................ 10-2020-0116333

(51) Int. Cl.
*G02B 27/10* (2006.01)
*G02B 27/12* (2006.01)
(Continued)

(52) U.S. Cl.
CPC ....... *G02B 27/1013* (2013.01); *G02B 27/123* (2013.01); *H10F 39/182* (2025.01); *H10F 39/806* (2025.01)

(58) Field of Classification Search
CPC ......................... G02B 27/1013; G02B 27/123; G02B 5/1876; G02B 3/0056; H10F 39/182;
(Continued)

(56) References Cited

U.S. PATENT DOCUMENTS 5,737,113 A 4/1998 Kuramochi et al.
6,072,620 A 6/2000 Shiono et al.
(Continued)

FOREIGN PATENT DOCUMENTS

CN 106483594 A 3/2017
CN 107180841 A 9/2017
(Continued)

OTHER PUBLICATIONS

Merriam-Webster OnLine definition of “arrangement.” No Date!*
(Continued)

*Primary Examiner* — Nathan W Ha
(74) *Attorney, Agent, or Firm* — Sughrue Mion, PLLC

(57) ABSTRACT

An image sensor includes a sensor substrate including a first photosensitive cell and a second photosensitive cell configured to sense light and color separating lens array including a first region and a second region, wherein the first region faces the first photosensitive cell and includes first nanopost and the second region faces the second photosensitive cell and includes second nanopost. The first nanopost and the second nanopost form a phase distribution at a location where the lights pass through the first region and the second region, by the phase distribution, light having a first wavelength and light having a second wavelength different from each other from among incident light incident on the color separating lens array are branched in different directions and the light having the first wavelength is condensed onto the first photosensitive cell and the light having the second wavelength is condensed onto the second photosensitive cell.

23 Claims, 46 Drawing Sheets

(51) Int. Cl.
*H10F 39/00* (2025.01)
*H10F 39/18* (2025.01)

(58) Field of Classification Search
CPC ................. H10F 27/123; H10F 39/806; H01L 27/14625; H01L 27/14645; H01L 27/14627; H01L 27/14621
USPC .......................................................... 257/432
See application file for complete search history.

(56) References Cited

U.S. PATENT DOCUMENTS

| | | | |
|---|---|---|---|
| 7,202,896 B2 | 4/2007 | Wako et al. | |
| 7,741,664 B2 | 6/2010 | Choi et al. | |
| 8,076,745 B2 | 12/2011 | Nishiwaki | |
| 8,289,422 B2 | 10/2012 | Hiramoto et al. | |
| 8,384,818 B2 | 2/2013 | Hiramoto et al. | |
| 8,687,174 B2 | 4/2014 | Fossum et al. | |
| 9,520,423 B2 | 12/2016 | Lee et al. | |
| 9,673,241 B2 | 6/2017 | Nishiwaki et al. | |
| 9,842,876 B2 | 12/2017 | Park et al. | |
| 10,136,109 B2 | 11/2018 | Yun et al. | |
| 11,640,645 B2 * | 5/2023 | Park | G06T 7/44 382/260 |
| 2003/0231395 A1 | 12/2003 | Nakai | |
| 2006/0125948 A1 | 6/2006 | Orita et al. | |
| 2006/0284052 A1 | 12/2006 | Toshikiyo et al. | |
| 2008/0011937 A1 | 1/2008 | Toshikiyo | |
| 2008/0272454 A1 | 11/2008 | Toshikiyo et al. | |
| 2009/0115011 A1 | 5/2009 | Ushiro et al. | |
| 2009/0160965 A1 | 6/2009 | Sorek et al. | |
| 2009/0250594 A1 | 10/2009 | Tanaka et al. | |
| 2011/0018042 A1 | 1/2011 | Lee et al. | |
| 2012/0206637 A1 | 8/2012 | Hiramoto et al. | |
| 2012/0212656 A1 | 8/2012 | Hiramoto et al. | |
| 2014/0284746 A1 | 9/2014 | Suzuki et al. | |
| 2014/0327783 A1 | 11/2014 | Nishiwaki et al. | |
| 2015/0323800 A1 | 11/2015 | Nam et al. | |
| 2016/0006995 A1 | 1/2016 | Yun et al. | |
| 2016/0109716 A1 | 4/2016 | Sohn | |
| 2016/0118430 A1 | 4/2016 | Nam et al. | |
| 2016/0260762 A1 | 9/2016 | Ungnapatanin et al. | |
| 2017/0034500 A1 | 2/2017 | Arbabi et al. | |
| 2017/0077164 A1 | 3/2017 | Kawabata | |
| 2017/0090206 A1 | 3/2017 | Kim et al. | |
| 2017/0170220 A1 | 6/2017 | Nam et al. | |
| 2017/0179178 A1 | 6/2017 | Park | |
| 2017/0261368 A1 | 9/2017 | Nam et al. | |
| 2017/0337664 A1 | 11/2017 | Grahn et al. | |
| 2018/0006071 A1 | 1/2018 | Kato et al. | |
| 2018/0019265 A1 | 1/2018 | Tan et al. | |
| 2018/0164154 A1 | 6/2018 | Roh et al. | |
| 2019/0162592 A1 | 5/2019 | Khorasaninejad et al. | |
| 2019/0171026 A1 | 6/2019 | Parsons | |
| 2019/0204610 A1 | 7/2019 | Sinkular et al. | |
| 2020/0021782 A1 | 1/2020 | Sugizaki | |
| 2020/0266230 A1 | 8/2020 | Miyata et al. | |
| 2020/0285066 A1 | 9/2020 | Nam et al. | |
| 2021/0120168 A1 | 4/2021 | Shim et al. | |
| 2021/0124179 A1 | 4/2021 | Yun et al. | |
| 2021/0126030 A1 | 4/2021 | Yun et al. | |
| 2021/0126035 A1 | 4/2021 | Roh et al. | |
| 2021/0366964 A1 | 11/2021 | Ito et al. | |

FOREIGN PATENT DOCUMENTS

| | | | |
|---|---|---|---|
| CN | 112701133 | A | 4/2021 |
| EP | 2 963 923 | A1 | 1/2016 |
| JP | 62-123404 | A | 6/1987 |
| JP | 2004-20957 | A | 1/2004 |
| JP | 2007-109801 | A | 4/2007 |
| JP | 2007-184560 | A | 7/2007 |
| JP | 2009-157390 | A | 7/2009 |
| JP | 2009-252978 | A | 10/2009 |
| JP | 2014-86743 | A | 5/2014 |
| JP | 2015-215616 | A | 12/2015 |
| JP | 2017-59589 | A | 3/2017 |
| JP | 2018-11040 | A | 1/2018 |
| JP | 2019-184986 | A | 10/2019 |
| KR | 10-2009-0067059 | A | 6/2009 |
| KR | 10-2011-0114319 | A | 10/2011 |
| KR | 10-2012-0015257 | A | 2/2012 |
| KR | 10-2015-0128407 | A | 11/2015 |
| KR | 10-2016-0004641 | A | 1/2016 |
| KR | 10-2016-0046370 | A | 4/2016 |
| KR | 10-2016-0047320 | A | 5/2016 |
| KR | 10-2017-0015108 | A | 2/2017 |
| KR | 10-2017-0074572 | A | 6/2017 |
| KR | 10-1772968 | B1 | 8/2017 |
| KR | 10-2017-0105877 | A | 9/2017 |
| KR | 10-2018-0131175 | A | 12/2018 |
| KR | 10-2021-0047738 | A | 4/2021 |
| KR | 10-2021-0048399 | A | 5/2021 |
| KR | 10-2021-0048400 | A | 5/2021 |
| WO | 1997/016756 | A1 | 5/1997 |
| WO | 2009/153937 | A1 | 12/2009 |
| WO | 2014/083836 | A1 | 6/2014 |
| WO | 2019/124562 | A1 | 6/2019 |

OTHER PUBLICATIONS

Seiji Nishiwaki et al., “Efficient colour splitters for high-pixel-density image sensors”, Nature Photonics, vol. 7, DOI: 10.1038/NPHOTON.2012.345, Feb. 2013, pp. 240-246, 7 pages total.
Communication dated Mar. 25, 2021, from the European Patent Office in European Application No. 20202827.0.
Communication dated Mar. 29, 2021, from the European Patent Office in European Application No. 20202807.2.
Communication dated Mar. 25, 2021, from the European Patent Office in European Application No. 20202814.8.
Communication dated Jul. 30, 2024, issued by the Japanese Patent Office in Japanese Application No. 2020-177408.
Communication dated Oct. 1, 2024, issued by the Japanese Patent Office in Japanese Application No. 2020-177397.
Communication dated Nov. 5, 2024, issued by the Japanese Patent Office in Japanese Application No. 2020-177398.
Communication issued Apr. 30, 2024 by the Japanese Patent Office in Japanese Application No. 2020-177408.
Communication issued Mar. 18, 2025 by the China National Intellectual Property Administration for Chinese Patent Application No. 202011145510.X.
Communication issued Jan. 25, 2025 by the China National Intellectual Property Administration for Chinese Patent Application No. 202011127956.X.
Communication dated Oct. 22, 2025 issued by the China National Intellectual Property Administration in Chinese Patent Application No. 202011135596.8.
Communication dated Nov. 4, 2025 issued by the Korean Ministry of Intellectual Property in Korean Patent Application No. 10-2020-0117777.
Communication dated Dec. 5, 2025 issued by the Korean Ministry of Intellectual Property in Korean Patent Application No. 10-2020-0116333.
Communication dated Jan. 2, 2026 issued by the European Patent Office in European Patent Application No. 20202827.0.
Japanese Office Action issued in JP Patent Application No. 2025-114422; dated Jul. 21, 2026; p. 8.
MohammadSadegh Faraji-Dana et al., “Compact folded metasurface spectrometer”, Nature Communications, 2018, DOI: 10.1038/s41467-018-06495-5; p. 8.

* cited by examiner

| G | B | G | B | G | B | G | B |
|---|---|---|---|---|---|---|---|
| R | G | R | G | R | G | R | G |
| G | B | G | B | G | B | G | B |
| R | G | R | G | R | G | R | G |
| G | B | G | B | G | B | G | B |
| R | G | R | G | R | G | R | G |

FIG. 2B

| | | | | | | | |
|---|---|---|---|---|---|---|---|
| C | M | C | M | C | M | C | M |
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |

| R | G | R | G | R | G | R | G |
|---|---|---|---|---|---|---|---|
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |

110

| 111 | 112 | 111 | 112 | 111 | 112 | 111 | 112 |
|---|---|---|---|---|---|---|---|
| 113 | 114 | 113 | 114 | 113 | 114 | 113 | 114 |
| 111 | 112 | 111 | 112 | 111 | 112 | 111 | 112 |
| 113 | 114 | 113 | 114 | 113 | 114 | 113 | 114 |
| 111 | 112 | 111 | 112 | 111 | 112 | 111 | 112 |
| 113 | 114 | 113 | 114 | 113 | 114 | 113 | 114 |

130

3.00
2.50
2.00
Efficiency 1.50
1.00
0.50
0.00
630
0.2 0.7 1.2 1.7 2.2
Distance (um)

340

343 341 344 342

343 344

C C'

344 343

342 341

344 343

343

344

342 341

344 343

342 341

341 342 341 342

IMAGE SENSOR INCLUDING COLOR SEPARATING LENS ARRAY AND ELECTRONIC APPARATUS INCLUDING THE IMAGE SENSOR

CROSS-REFERENCE TO RELATED APPLICATIONS

This application is based on and claims priority under 35 U.S.C. § 119 to Korean Patent Application Nos. 10-2019-0132385, filed on Oct. 23, 2019, 10-2019-0146210, filed on Nov. 14, 2019 and 10-2020-0116333, filed on Sep. 10, 2020, in the Korean Intellectual Property Office, the disclosures of which are incorporated by reference herein in their entirety.

BACKGROUND

1. Field

The disclosure relates to an image sensor including a color separating lens array and an electronic apparatus including the image sensor, and more particularly, to an image sensor including a color separating lens array in which incident light may be separated according to wavelengths and condensed, and an electronic apparatus including the image sensor.

2. Description of Related Art

Image sensors generally detect the color of incident light by using a color filter. However, since the color filter absorbs light of other colors than light of a color corresponding to the color filter, light usage efficiency may be lowered. For example, when a red, green and blue (RGB) color filter is used, only ⅓ of incident light is transmitted through the RGB color filter, and the remaining ⅔ of the incident light is absorbed and thus, light usage efficiency is about 33%. Thus, in a color display apparatus or a color image sensor, most of light loss occurs in the color filter.

SUMMARY

One or more embodiments include an image sensor having improved light usage efficiency by using a color separating lens array in which incident light may be separated according to wavelengths and condensed.

One or more embodiments also include an electronic apparatus including the image sensor.

Additional aspects will be set forth in part in the description which follows and, in part, will be apparent from the description, or may be learned by practice of the presented embodiments of the disclosure.

According to an aspect of the disclosure, there is provided an image sensor comprising: a sensor substrate comprising a first photosensitive cell and a second photosensitive cell configured to sense light; and a color separating lens array comprising a first region and a second region, wherein the first region faces the first photosensitive cell and comprises first nanopost and the second region faces the second photosensitive cell and comprises second nanopost, wherein at least one of a first size, a first shape or a first arrangement of the first nanopost is different from at least one of a second size, a second shape or a second arrangement of the second nanopost, and wherein the first and the second nanopost form a phase distribution at a location where the lights pass through the first region and the second region, by the phase distribution, light having a first wavelength and light having a second wavelength different from each other from among incident light incident on the color separating lens array are branched in different directions and the light having the first wavelength is condensed onto the first photosensitive cell and the light having the second wavelength is condensed onto the second photosensitive cell.

With respect to the light of the first wavelength, the first nanopost and the second nanopost may form, at a location immediately after the light passes through the color separating lens array, a phase distribution of 2Nπ at a position corresponding to a center of the first photosensitive cell, a phase distribution of (2N−2)π at a position corresponding to a center of the second photosensitive cell, and N is an integer greater than 0.

With respect to a light of the second wavelength, the first nanopost and the second nanopost may form, at the location immediately after the light passes through the color separating lens array, a phase distribution of (2M−1)π at a position corresponding to a center of the first photosensitive cell, a phase distribution of 2Mπ at a position corresponding to a center of the second photosensitive cell, and M is an integer greater than 0.

The image sensor may further comprise a spacer layer arranged between the sensor substrate and the color separating lens array.

The spacer layer may have a thickness corresponding to a focal length of the color separating lens array with respect to a center wavelength of a wavelength band of incident light that is to be color separated by the color separating lens array.

According to an example embodiment, when a theoretical thickness of the spacer layer is $h_t$, a pitch of each photosensitive cell is p, a refractive index of the spacer layer is n and a center wavelength of a wavelength band of light that is to be color separated by the color separating lens array is $\lambda_0$, the theoretical thickness $h_t$ of the spacer layer is expressed by the following equation:

$$h_t = \frac{np^2}{\lambda_0} - \frac{\lambda_0}{4n},$$

and an actual thickness h of the spacer layer is selected within a range of $h_t - p \le h \le h_t + p$.

The sensor substrate may further comprise a third photosensitive cell and a fourth photosensitive cell configured to sense the light, and the color separating lens array may further comprise a third region and a fourth region, wherein the third region may face the third photosensitive cell and may comprise third nanopost and the fourth region may face the fourth photosensitive cell and may comprise fourth nanopost, and wherein at least one of a third size, a third shape or a third arrangement of the third nanopost may be different from at least one of a fourth size, a fourth shape or a fourth arrangement of the fourth nanopost.

The first through fourth nanoposts may form a phase distribution at a location where the lights pass through the first through fourth regions, by the phase distribution, light having a first wavelength, light having a second wavelength and light having a third wavelength different from one another from among incident light incident on the color separating lens array are branched in different directions, light having a first wavelength is condensed onto the first photosensitive cell and the fourth photosensitive cell, light having a second wavelength is condensed onto the second photosensitive cell and light having a third wavelength is condensed onto the third photosensitive cell.

The light having the first wavelength may be green light, the light having the second wavelength may be blue light, and the light having the third wavelength may be red light.

With respect to the light of the first wavelength, the first through fourth nanoposts may form, at a location immediately after the light passes through the color separating lens array, a phase distribution of $2N\pi$ at a position corresponding to a center of the first photosensitive cell and a center of the fourth photosensitive cell, a phase distribution of $(2N-2)\pi$ at a position corresponding to a center of the second photosensitive cell and a center of the third photosensitive cell, and N is an integer greater than 0.

With respect to the light of the second wavelength, the first through fourth nanopost may form, at the location immediately after the light passes through the color separating lens array, a phase distribution of $(2M-1)\pi$ at a position corresponding to a center of the first photosensitive cell and a center of the fourth photosensitive cell, a phase distribution of $2M\pi$ at a position corresponding to a center of the second photosensitive cell, a phase distribution that is greater than $(2M-2)\pi$ and less than $(2M-1)\pi$ at a position corresponding to a center of the third photosensitive cell, and M is an integer greater than 0.

With respect to the light of the third wavelength, the first through fourth nanopost may form, at the location immediately after the light passes through the color separating lens array, a phase distribution of $(2L-1)\pi$ at a position corresponding to a center of the first photosensitive cell and a center of the fourth photosensitive cell, a phase distribution of $2L\pi$ at a position corresponding to a center of the third photosensitive cell, a phase distribution that is greater than $(2L-2)\pi$ and less than $(2L-1)\pi$ at a position corresponding to a center of the second photosensitive cell, and L is an integer greater than 0.

The image sensor may have a pixel arrangement structure in which a plurality of unit pixels including a red pixel, a green pixel and a blue pixel are arranged in a Bayer pattern, and among the first through fourth nanoposts, nanoposts in regions corresponding to the green pixel from among the first through fourth regions may have different distribution rules in a first direction and a second direction perpendicular to the first direction.

Among the first through fourth nanoposts, nanoposts in regions corresponding to the blue pixel and the red pixel from among the first through fourth regions may have a symmetrical distribution rule in the first direction and the second direction.

One of the first through fourth nanoposts located in a center of a region corresponding to the green pixel from among the first through fourth regions has a greater cross-sectional area than another of the first through fourth nanoposts located in a region corresponding to a pixel of another color.

In a region corresponding to the green pixel from among the first through fourth regions, one of the first through fourth nanoposts located in a center of the region may have a greater cross-sectional area than another of the first through fourth nanoposts located on a periphery of the region.

The color separating lens array may further comprise a plurality of first regions and a plurality of second regions, which are arranged to protrude from an edge of the sensor substrate and do not face any photosensitive cell of the sensor substrate in a vertical direction.

At least one of the first nanopost and the second nanopost may comprises a lower post and an upper post stacked on the lower post, and wherein the lower post and the upper post may be stacked to be offset from one another.

A degree of the offset between the lower post and the upper post may increase from a central portion to a periphery portion of the image sensor.

According to an aspect of the disclosure, there is provide an image sensor comprising: a sensor substrate comprising a plurality of first photosensitive cells and a plurality of second photosensitive cells alternately arranged along a first row and a plurality of third photosensitive cells and a plurality of fourth photosensitive cells alternately arranged along a second row adjacent to the first row; and a color separating lens array comprising a plurality of first regions each facing the plurality of first photosensitive cells and comprising first nanopost, a plurality of second regions each facing the plurality of second photosensitive cells and comprising second nanopost, a plurality of third regions each facing the plurality of third photosensitive cells and comprising third nanopost, and a plurality of fourth regions each facing the plurality of fourth photosensitive cells and comprising fourth nanopost, wherein at least one of a shape, a size and an arrangement of the first through fourth nanoposts are configured to: with respect light incident in the first region, condense light having a first wavelength is condensed onto the first photosensitive cell located directly below the first region, branch light having a second wavelength onto the second photosensitive cell adjacent to the first photosensitive cell in a horizontal direction, and branch light having a third wavelength onto the third photosensitive cell adjacent to the first photosensitive cell in a vertical direction, and with respect to light incident in the second region, condense light having the second wavelength onto the second photosensitive cell located directly below the second region, branch light having the first wavelength onto the first photosensitive cell adjacent to the second photosensitive cell in the horizontal direction and onto the fourth photosensitive cell adjacent to the second photosensitive cell in a vertical direction, and branch light having a third wavelength onto the third photosensitive cell adjacent to the second photosensitive cell in a diagonal direction.

The light having the first wavelength may be green light, the light having the second wavelength may be blue light, and the light having the third wavelength may be red light.

According to an aspect of the disclosure, there is provide an electronic apparatus comprising: an image capturing unit configured to focus light reflected from an object and to form an optical image; and the image sensor discussed above configured to convert the optical image formed by the image capturing unit into an electrical signal.

The electronic apparatus may comprise a smart phone, a mobile phone, a personal digital assistant (PDA), a laptop computer, a personal computer (PC), a home appliance, a security camera, a medical camera, a vehicle, or an Internet of Things (IoT) device.

According to an aspect of the disclosure, there is provide an image sensor comprising: a substrate comprising a first photosensitive cell and a second photosensitive cell configured to sense light; a color separating lens array provided on the substrate, the color separating lens array comprising a first region overlapping the first photosensitive cell in a plan view and a second region overlapping the second photosensitive cell in the plan view; one or more first nanoposts provided in a first arrangement in the first region; and one or more second nanoposts provided in a second arrangement in the second region, wherein at least one of a first size, a first shape or the first arrangement of the one or more first nanoposts is different from at least one of a second size, a second shape or the second arrangement of the one or more first nanoposts.

Each of the one or more of the first nanoposts may comprise a lower post and an upper post stacked on the lower post, and wherein the lower post and the upper post may be stacked to be offset from one another, wherein a first offset corresponding to the lower post and the upper post of a first one or more of the first nanoposts closer to a center portion of the image sensor may be smaller than a second offset corresponding to the lower post and the upper post of a second one or more of the first nanoposts that is farther from the center portion than the first one or more of the first nanoposts.

According to an aspect of the disclosure, there is provide an electronic apparatus comprising: one or more optical elements configured to focus light reflected from an object and form an optical image; and an image sensor configured to convert the optical image formed by the image capturing unit into an electrical signal, the image sensor comprising: a substrate comprising a first photosensitive cell and a second photosensitive cell configured to sense light; a color separating lens array provided on the substrate, the color separating lens array comprising a first region overlapping the first photosensitive cell in a plan view and a second region overlapping the second photosensitive cell in the plan view; one or more first nanoposts provided in a first arrangement in the first region; and one or more second nanoposts provided in a second arrangement in the second region, wherein at least one of a first size, a first shape or the first arrangement of the one or more first nanoposts is different from at least one of a second size, a second shape or the second arrangement of the one or more first nanoposts.

According to an aspect of the disclosure, there is provide a method of manufacturing an image sensor comprising: forming a first photosensitive cell and a second photosensitive cell on a substrate; forming a color separating lens array on the substrate, the color separating lens array comprising a first region overlapping the first photosensitive cell in a plan view and a second region overlapping the second photosensitive cell in the plan view; forming one or more first nanoposts in a first arrangement in the first region; and forming one or more second nanoposts provided in a second arrangement in the second region, wherein at least one of a first size, a first shape or the first arrangement of the one or more first nanoposts is different from at least one of a second size, a second shape or the second arrangement of the one or more first nanoposts.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 2A through 2C illustrate various pixel arrangements of a pixel array of the image sensor according to example embodiments;

DETAILED DESCRIPTION

Figure 1:
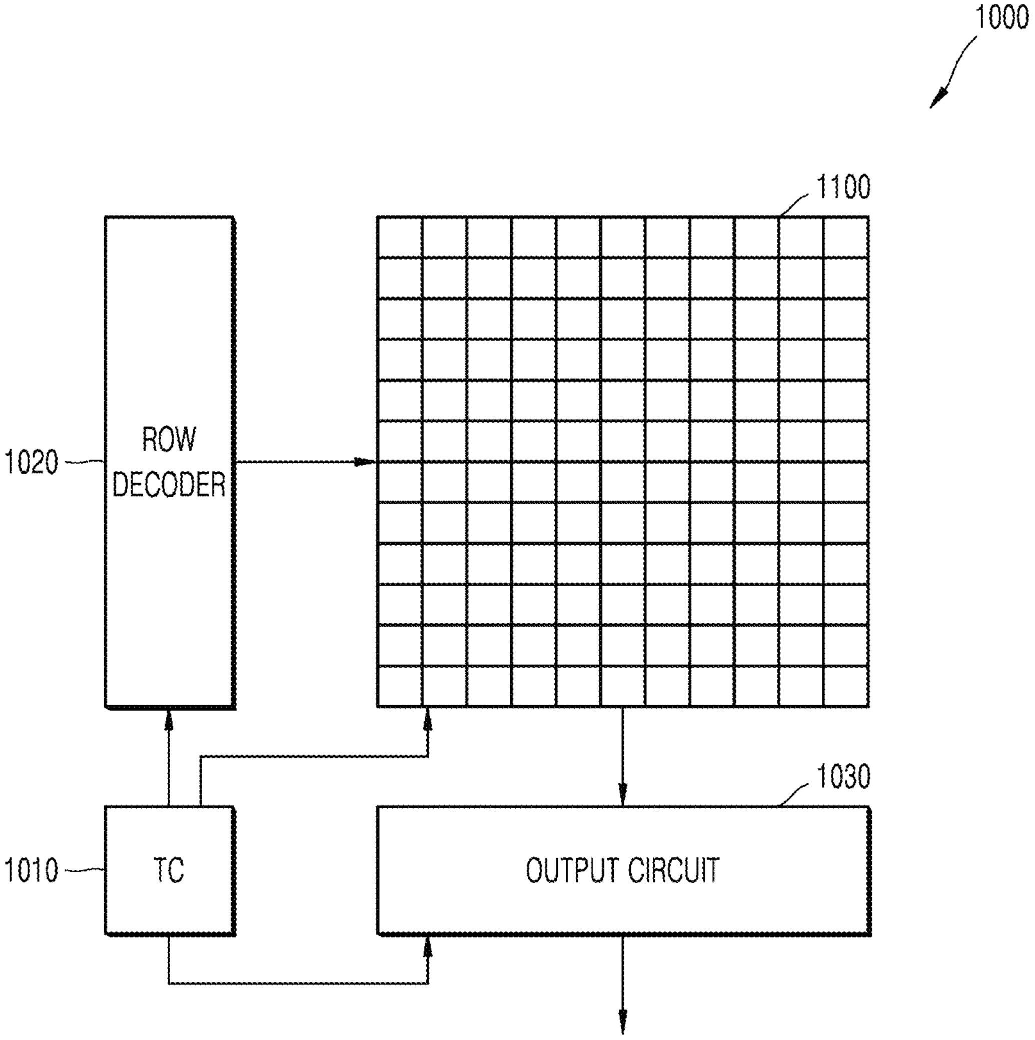
FIG. 1 is a schematic block diagram of an image sensor according to an example embodiment.

Reference will now be made in detail to example embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, an image sensor including a color separating lens array and an electronic apparatus including the image sensor will be described in detail with reference to the accompanying drawings. Example embodiments described below are just examples, and there may be various modifications from these example embodiments. Like reference numerals in the following drawings refer to like elements, and sizes of components in the drawings may be exaggerated for clarity and convenience of explanation.

Hereinafter, the expression described as "above" or "on" may include not only those that are directly in contact, but also those that are in a non-contact manner. For instance, the expression described as "above" or "on" may include not only a first element that is directly above, below, left or right in contact with a second element, but also a first element that may be above, below, left or right a second element in a non-contact manner.

It will be understood that although the terms "first," "second," etc. may be used herein to describe various components, these components should not be limited by these terms. These components are only used to distinguish one component from another. These terms do not limit that materials or structures of components are different from one another.

As used herein, the singular forms "a," "an" and "the" are intended to include the plural forms as well, unless the context clearly indicates otherwise. It will be further understood that when a portion is referred to as "comprises" another component, the portion may not exclude another component but may further comprise another component unless the context states otherwise.

Also, the terms " . . . unit," " . . . module" used herein specify a unit for processing at least one function or operation, and this may be implemented with hardware or software or a combination of hardware and software.

The use of the terms of "the above-described" and similar indicative terms may correspond to both the singular forms and the plural forms.

Operations that constitute a method may be performed in an appropriate order unless the context clearly indicates that the operations have to be performed in a described order. Also, the use of all exemplary terms (for examples, etc.) is only to describe a technical spirit in detail, and the scope of rights is not limited by these terms unless the context is limited by the claims.

FIG. 1 is a schematic block diagram of an image sensor according to an example embodiment. Referring to FIG. 1, an image sensor 1000 may include a pixel array 1100, a timing controller (TC) 1010, a row decoder 1020, and an output circuit 1030. The image sensor may be a charge coupled device (CCD) image sensor or a complementary metal oxide semiconductor (CMOS) image sensor.

The pixel array 1100 may include two-dimensionally arranged pixels along a plurality of rows and columns. The row decoder 1020 may select one from among rows of the pixel array 1100 in response to a row address signal output from the timing controller 1010. The output circuit 1030 may output photosensitive signals in units of columns from a plurality of pixels arranged along the selected row. To this end, the output circuit 1030 may include a column decoder and an analog to digital converter (ADC). For example, the output circuit 1030 may include a plurality of ADCs arranged by columns between the column decoder and the pixel array 1100, or one ADC arranged at an output terminal of the column decoder. The timing controller 1010, the row decoder 1020, and the output circuit 1030 may be implemented with one chip or separate chips. A processor for processing an image signal output through the output circuit 1030 may be implemented with one chip together with the timing controller 1010, the row decoder 1020, and the output circuit 1030.

The pixel array 1100 may include a plurality of pixels that detect lights having different wavelengths. The plurality of pixels may be arranged in various ways, as shown in FIGS. 2A through 2C.

Figure 2A:
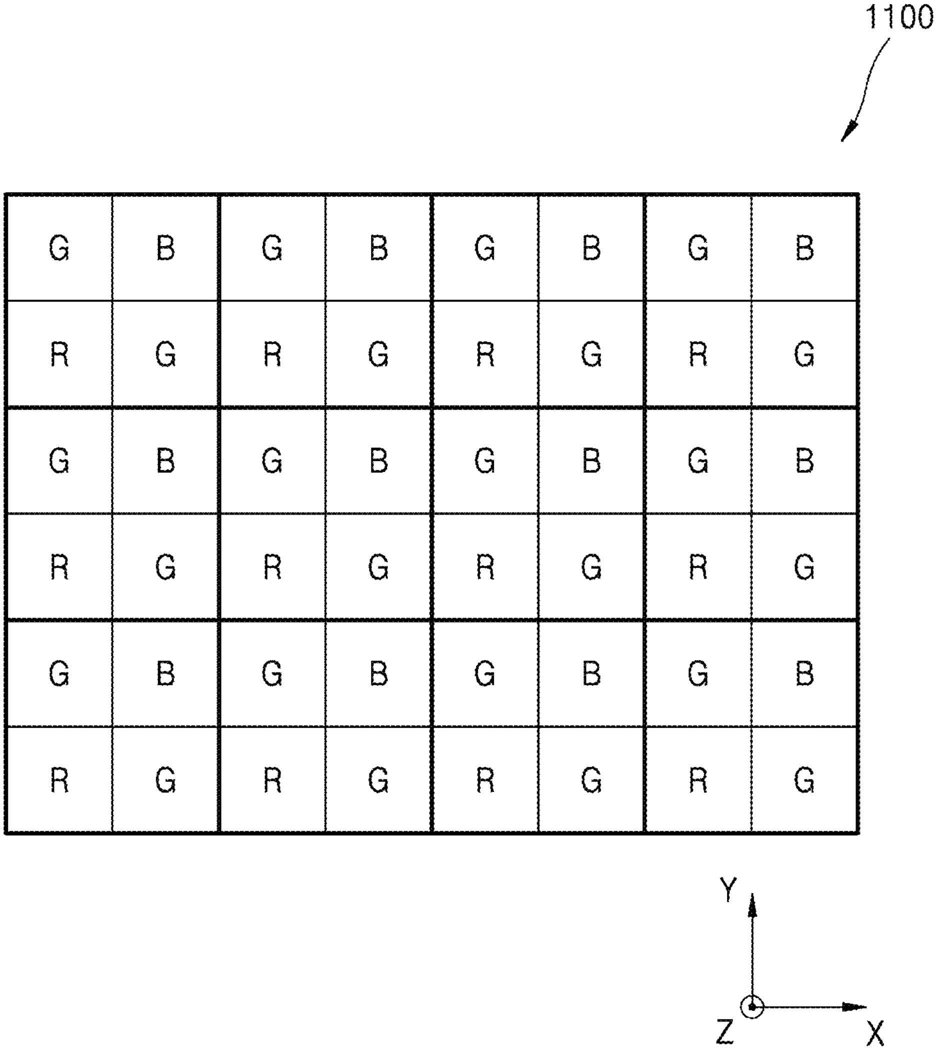

FIG. 2A shows a Bayer pattern provided in the image sensor 1000 according to an example embodiment. Referring to FIG. 2A, one unit pixel of the pixel array 1100 may include four quadrant regions, and first through fourth quadrants may be a blue pixel B, a green pixel G, a red pixel R, and a green pixel G, respectively. These unit pixels may be repeatedly arranged two-dimensionally in a first direction (X-direction) and a second direction (Y-direction). In other words, two green pixels G may be arranged in one diagonal direction within a 2×2 array-type unit pixel, and one blue pixel B and one red pixel R may be arranged in the other diagonal direction. Looking at the overall pixel arrangement of the pixel array 1100, a first row in which a plurality of green pixels G and a plurality of blue pixels B are alternately arranged in the first direction, and a second row in which a plurality of red pixels R and a plurality of green pixels G are alternately arranged in the first direction, may be repeatedly arranged.

However, the arrangement method of the pixel array 1100 is not limited to the Bayer pattern, and various arrangement methods other than the Bayer pattern are possible. For example, referring to FIG. 2B, the arrangement of a CYGM method in which a magenta pixel M, a cyan pixel C, a yellow pixel Y and a green pixel G constitute one unit pixel, is also possible. Also, referring to FIG. 2C, the arrangement of an RGBW method in which the green pixel G, the red pixel R, the blue pixel B and a white pixel W constitute one unit pixel, is also possible.

Figure 2C:
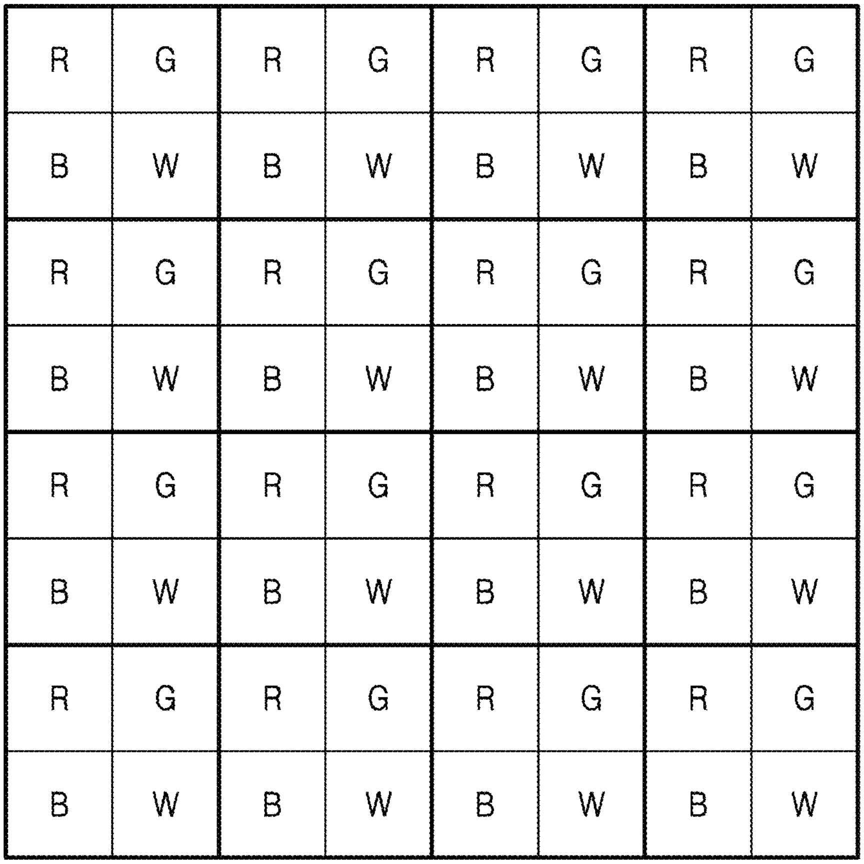

Although FIGS. 2A-2C illustrate that the unit pixels may have the shape of a 2×2 array, the disclosure is not limited thereto. According to another example embodiment, the unit pixel may have the shape of a 3×2 array. Moreover, pixels of the pixel array 1100 may be arranged in various ways according to color characteristics of the image sensor 1000. Hereinafter, for convenience, the pixel array 1100 of the image sensor 1000 has a Bayer pattern. However, the principles of embodiments described below may be applied to a pixel arrangement other than the Bayer pattern.

Figure 3:
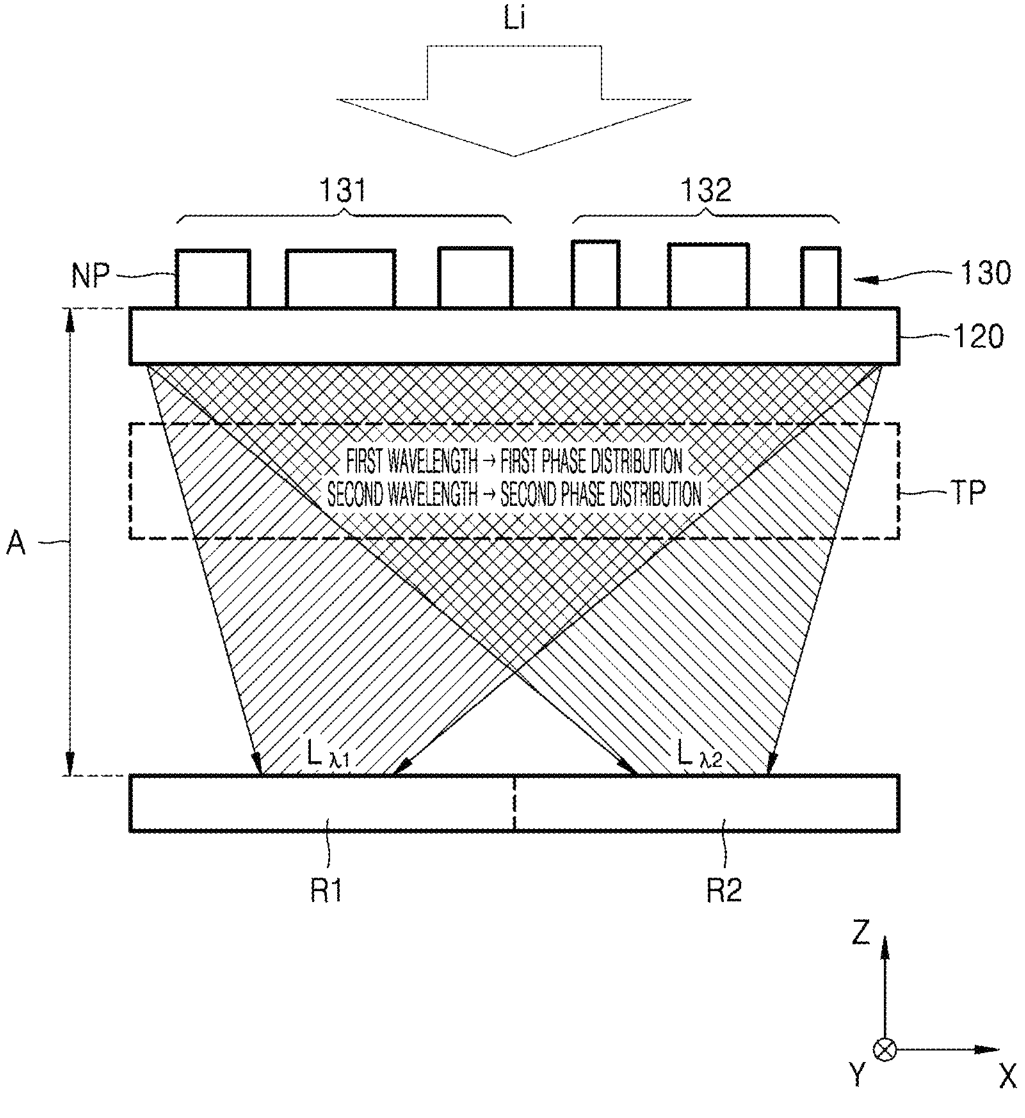
FIG. 3 is a conceptual diagram showing a schematic structure and an operation of a color separating lens array according to an example embodiment.

According to an embodiment, the pixel array 1100 of the image sensor 1000 may include a color separating lens array configured to condense light of a color corresponding to each pixel. FIG. 3 is a conceptual diagram showing a schematic structure and an operation of a color separating lens array according to an embodiment. Referring to FIG. 3, a color separating lens array 130 may include nanoposts NP. According to an example embodiment, the color separating lens array 130 may include nanoposts NP arranged on the same plane according to a specific rule. According to an example embodiment, the specific rule may be a predetermined rule. According to an example embodiment, the color separating lens array 130 may be arranged on a spacer layer 120.

Here, the rule that is applied to parameters such as the shape, size (width, height), spacing, and arrangement shape of the nanoposts NP, may be determined according to a target phase distribution TP to be implemented on incident light $L_i$ by the color separating lens array 130. The target phase distribution TP may be determined considering first and second target regions R1 and R2 at which incident light $L_i$ is to be separated according to wavelength and condensed. The target phase distribution TP is shown between the color separating lens array 130 and the first and second target regions R1 and R2, but this is just for convenience of illustration. The actual target phase distribution TP may refer to a phase distribution at a location immediately after the incident light $L_i$ passes through the color separating lens array 130, for example, on a bottom surface of the color separating lens array 130 or a top surface of the spacer layer 120.

The color separating lens array 130 may include a first region 131 and a second region 132, and each of the first region 131 and the second region 132 may include one or a plurality of nanoposts NP. The first region 131 and the second region 132 may be arranged to face in one-to-one correspondence with the first target region R1 and the second target region R2, respectively. Although it is shown that three nanoposts NP are respectively arranged in the first region 131 and the second region 132, this is exemplary and the disclosure is not limited thereto. Also, although it is shown that the nanoposts NP are entirely located in one of the first region 131 and the second region 132, the disclosure is not limited thereto, and some of the nanoposts NP may be arranged at a boundary between the first region 131 and the second region 132.

The nanoposts NP of the color separating lens array 130 may form a phase distribution in which light having different wavelengths included in the incident light $L_i$ is branched in different directions and condensed. For example, the shape, size, and arrangement of the nanoposts NP distributed in the first region 131 and the second region 132 may be determined to form the target phase distribution TP in which light $L\lambda_1$ of a first wavelength included in the incident light $L_i$ has a first phase distribution and light $L\lambda_2$ of a second wavelength included in the incident light $L_i$ has a second phase distribution. The light $L\lambda_1$ of the first wavelength and the light $L\lambda_2$ of the second wavelength may be respectively condensed at target regions R1 and R2 at a certain separation distance A from the nanoposts NP according to the target phase distribution TP.

According to an example embodiment, the light $L\lambda_1$ of the first wavelength and the light $L\lambda_2$ of the second wavelength being condensed may include the light $L\lambda_1$ of the first wavelength and the light $L\lambda_2$ of the second wavelength being respectively concentrated at target regions R1 and R2 at a certain separation distance A from the nanoposts NP according to the target phase distribution TP. According to an example embodiment, the light $L\lambda_1$ of the first wavelength and the light $L\lambda_2$ of the second wavelength being condensed may include the light $L\lambda_1$ of the first wavelength and the light $L\lambda_2$ of the second wavelength being respectively focused at target regions R1 and R2 at a certain separation distance A from the nanoposts NP according to the target phase distribution TP.

According to an example embodiment, the nanoposts NP of the color separating lens array 130 may form a phase distribution in which light having different wavelengths included in the incident light $L_i$ is divided in different directions and condensed.

According to an example embodiment, a rule in which the nanoposts NP are arranged in the first region 131, and a rule in which the nanoposts NP are arranged in the second region 132, may be different from each other. In other words, one of the shape, size and arrangement of the nanoposts NP provided in the first region 131 may be different from the shape, size and arrangement of the nanoposts NP provided in the second region 132.

The nanoposts NP may have a shape dimension of a sub-wavelength smaller than a wavelength band to be branched. The nanoposts NP may have a shape dimension smaller than a shorter wavelength of the first wavelength and the second wavelength, and when the incident light $L_i$ is visible light, for example, the nanoposts NP may have a smaller dimension than 400 nm, 300 nm, or 200 nm.

The nanoposts NP may be made of a material having a refractive index higher than that of a surrounding material. For example, the nanoposts NP may be made of c-Si, p-Si, a-Si and III-V compound semiconductors (GaP, GaN, GaAs, etc.), SiC, $TiO_2$, SiN, and/or combinations thereof. The nanoposts NP having a difference in refractive index from the surrounding material may change the phase of passing light. This is due to phase delay caused by the shape dimension of the sub-wavelength, and the degree of phase delay may be determined by the detailed shape dimension and arrangement shape of the nanoposts NP. The surrounding material may be made of a dielectric material having a refractive index lower than the nanoposts NP, for example, $SiO_2$ or air.

According to an example embodiment, a first wavelength λ1 and a second wavelength λ2 may be in a visible light wavelength band. However, embodiments are not limited thereto, and various wavelength bands may be implemented according to the shape, size, spacing and arrangement of the arranged nanoposts NP. FIG. 3 illustrates that lights of two wavelengths are branched and condensed. However, embodiments are not limited thereto, and the incident light may be branched and condensed in three directions or more according to wavelengths.

Hereinafter, an example in which the above-described color separating lens array 130 is applied to the pixel array 1100 of the image sensor 1000, will be described in more detail.

Figure 4A:
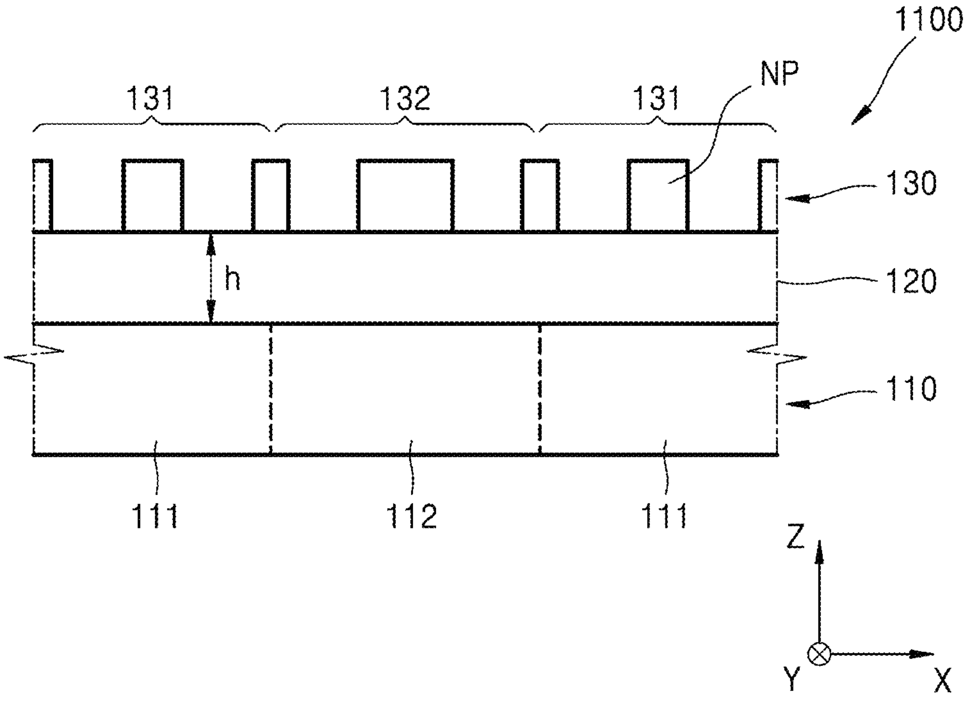
FIGS. 4A and 4B are cross-sectional views of a pixel array of an image sensor according to an example embodiment.
Figure 4B:
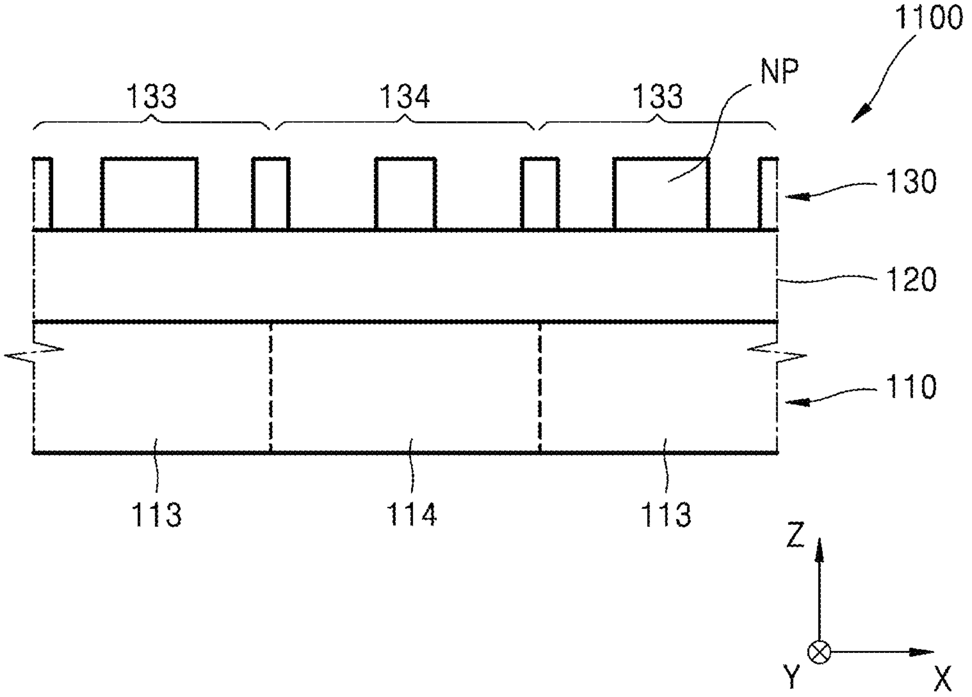
Figure 5A:
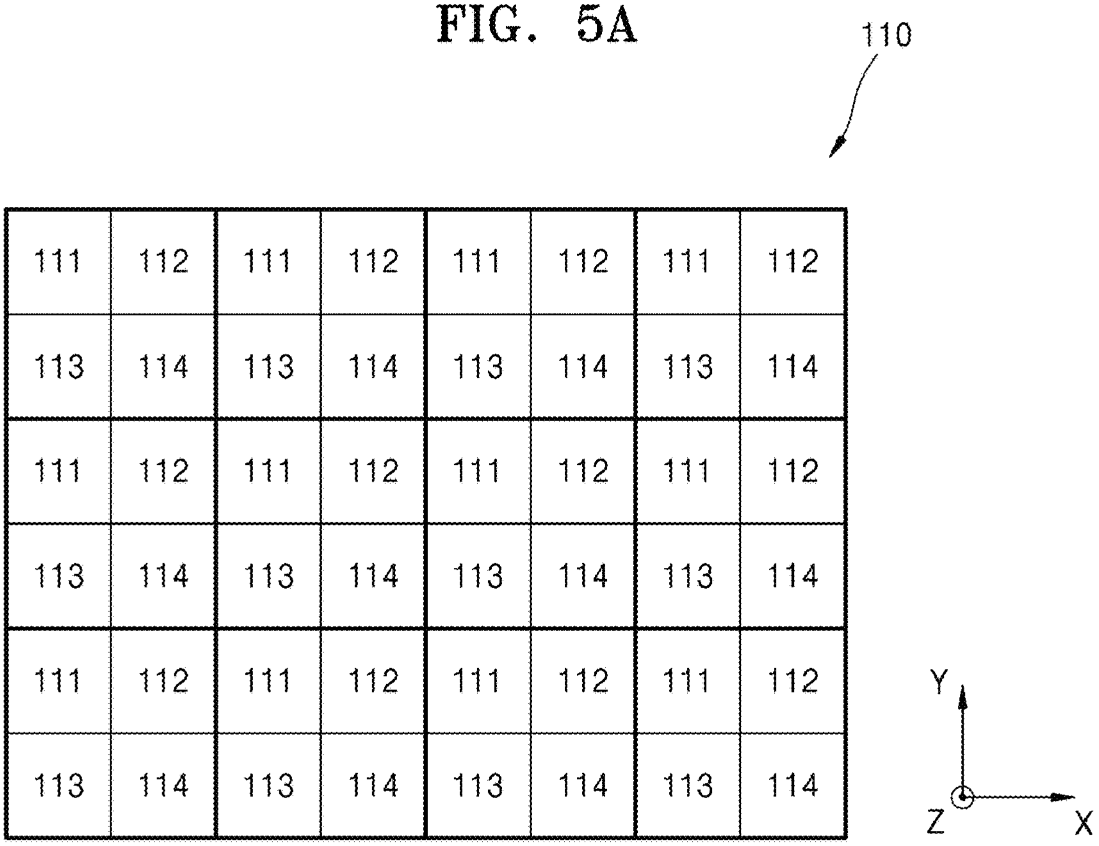
FIG. 5A is a plan view showing the arrangement of photosensitive cells in the pixel array of the image sensor according to an example embodiment.
Figure 5B:
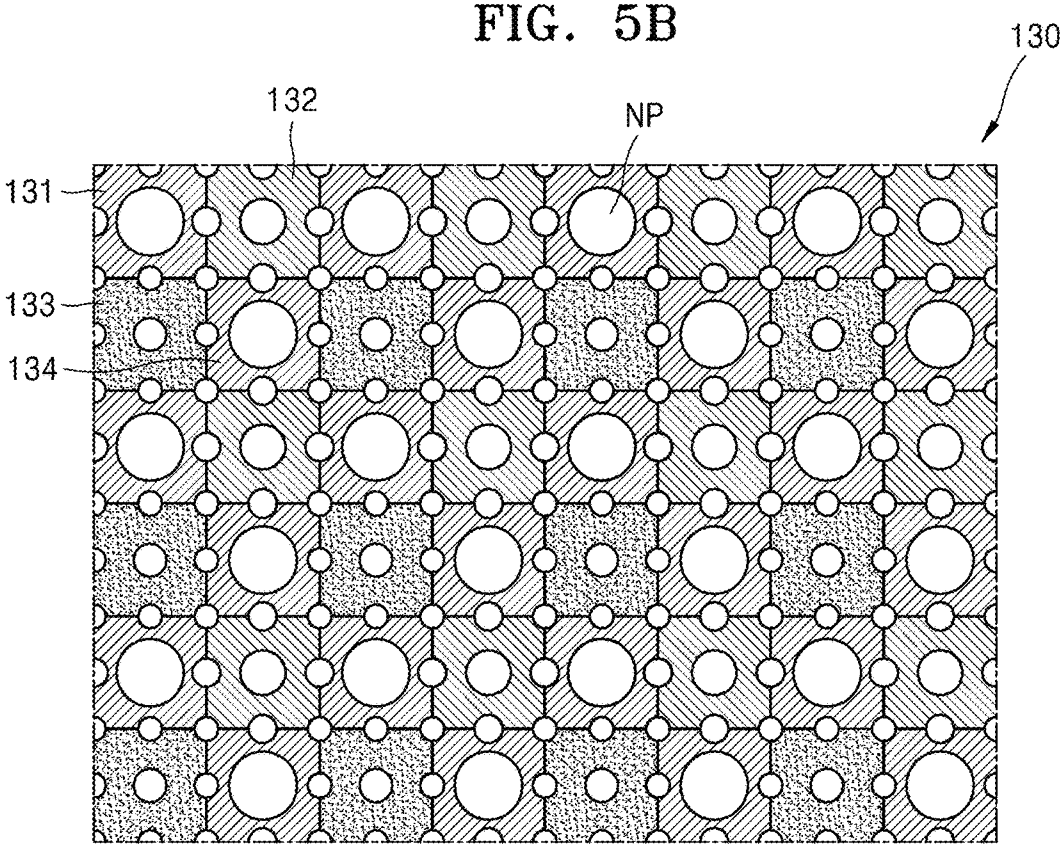
FIG. 5B is a plan view showing the shape of the arrangement of a plurality of nanoposts in a plurality of regions of the color separating lens array in the pixel array of the image sensor according to an example embodiment.

FIGS. 4A and 4B are cross-sectional views of a pixel array according to an example embodiment, FIG. 5A is a plan view showing the arrangement of photosensitive cells of the pixel array according to an example embodiment, and FIG. 5B is a plan view showing the shape of the arrangement of the nanoposts of the color separating lens array according to an example embodiment.

Referring to FIGS. 4A and 4B, the pixel array 1100 may include a sensor substrate 110 including a plurality of photosensitive cells 111, 112, 113, and 114 for sensing light, a transparent spacer layer 120 arranged on the sensor substrate 110, and the color separating lens array 130 arranged on the spacer layer 120. According to an example embodiment as illustrated in FIG. 5A, photosensitive cells 111 and 112 may be provided in one row and photosensitive cells 113 and 114 may be provided in another row.

The sensor substrate 110 may include a first photosensitive cell 111, a second photosensitive cell 112, a third photosensitive cell 113, and a fourth photosensitive cell 114, which convert light into an electrical signal. These photosensitive cells, for example, as shown in FIG. 4A, the first photosensitive cell 111 and the second photosensitive cell 112 may be alternately arranged in the first direction (X-direction), and in cross-sections having different Y-direction locations, as shown in FIG. 4B, the third photosensitive cell 113 and the fourth photosensitive cell 114 may be alternately arranged. This region division is for sensing incident light by pixel unit. For example, the first photosensitive cell 111 and the fourth photosensitive cell 114 may sense light having a first wavelength that corresponds to a first pixel, and the second photosensitive cell 112 may sense light having a second wavelength that corresponds to a second pixel, and the third photosensitive cell 113 may sense light having a third wavelength that corresponds to a third pixel. Hereinafter, light having a first wavelength is illustrated as green light, light having a second wavelength is illustrated as blue light, and light having a third wavelength are illustrated as red light, and the first pixel, the second pixel, and the third pixel are illustrated as a green pixel G, a blue pixel B, and a red pixel R, respectively. According to an example embodiment, a separator for separating cells may be further formed on the sensor substrate 110.

The spacer layer 120 may be provided to maintain a distance h between the sensor substrate 110 and the color separating lens array 130 while supporting the color separating lens array 130, and may be made of a transparent material with respect to visible light. For example, the spacer layer 120 may be made of a dielectric material having a refractive index lower than the refractive index of the nanoposts NP of the color separating lens array 130, such as $SiO_2$, siloxane-based spin on glass (SOG), and having a low absorption rate in a visible light band.

The color separating lens array 130 may include the nanoposts NP arranged according to a specific rule. According to an example embodiment, the color separating lens array 130 may further include a protective layer for protecting the nanoposts NP. The protective layer may be made of a dielectric material having a refractive index lower than the refractive index of the material for forming the nanoposts NP.

The color separating lens array 130 may be divided into a plurality of regions 131, 132, 133, and 134 that face in one-to-one correspondence with the plurality of photosensitive cells 111, 112, 113 and 114. One or a plurality of nanoposts NP may be arranged in each of the plurality of regions 131, 132, 133, and 134, and any one of the shape, size and arrangement of the nanoposts NP may be different from each other according to regions.

According to an example embodiment, regions of the color separating lens array 130 may be divided so that light having a first wavelength may be branched into and condensed onto the first photosensitive cell 111 and the fourth photosensitive cell 114, light having a second wavelength may be branched into and condensed onto the second photosensitive cell 112 and light having a third wavelength may be branched into and condensed onto the third photosensitive cell 113, and the size, shape and arrangement of the nanoposts NP may be determined according to regions.

When the pixel array 1100 has the Bayer pattern shown in FIG. 2A, the first photosensitive cell 111 and the fourth photosensitive cell 114 of FIG. 5A may correspond to the green pixel G, and the second photosensitive cell 112 may correspond to the blue pixel B, and the third photosensitive cell 113 may correspond to the red pixel R. Referring to FIG. 5B, the first and fourth regions 131 and 134 of the color separating lens array 130 may correspond to the green pixel G, the second region 132 of the color separating lens array 130 may correspond to the blue pixel B, and the third region 133 of the color separating lens array 130 may correspond to the red pixel R. Thus, the color separating lens array 130 may include a plurality of unit pattern arrays that are two-dimensionally arranged, and each of the plurality of unit pattern arrays may include the first region 131, the second region 132, the third region 133, and the fourth region 134, which are arranged in the form of 2×2.

As shown in FIG. 5B, the first and fourth regions 131 and 134 that correspond to the green pixel G, the second region 132 that corresponds to the blue pixel B, and third region 133 that corresponds to the red pixel R may include nanoposts NP having a cylindrical shape with circular cross-sections. The nanoposts NP having different cross-sectional areas may be arranged in the centers of the first region 131, the second region 132, the third region 133, and the fourth region 134, and the nanoposts NP may be arranged in the center of the boundary between the pixels and at a crossing point of the pixel boundary. The nanoposts NP arranged at the boundary between the pixels may have smaller cross-sectional areas than those of the nanoposts NP arranged in the center of the pixel.

Figure 5C:
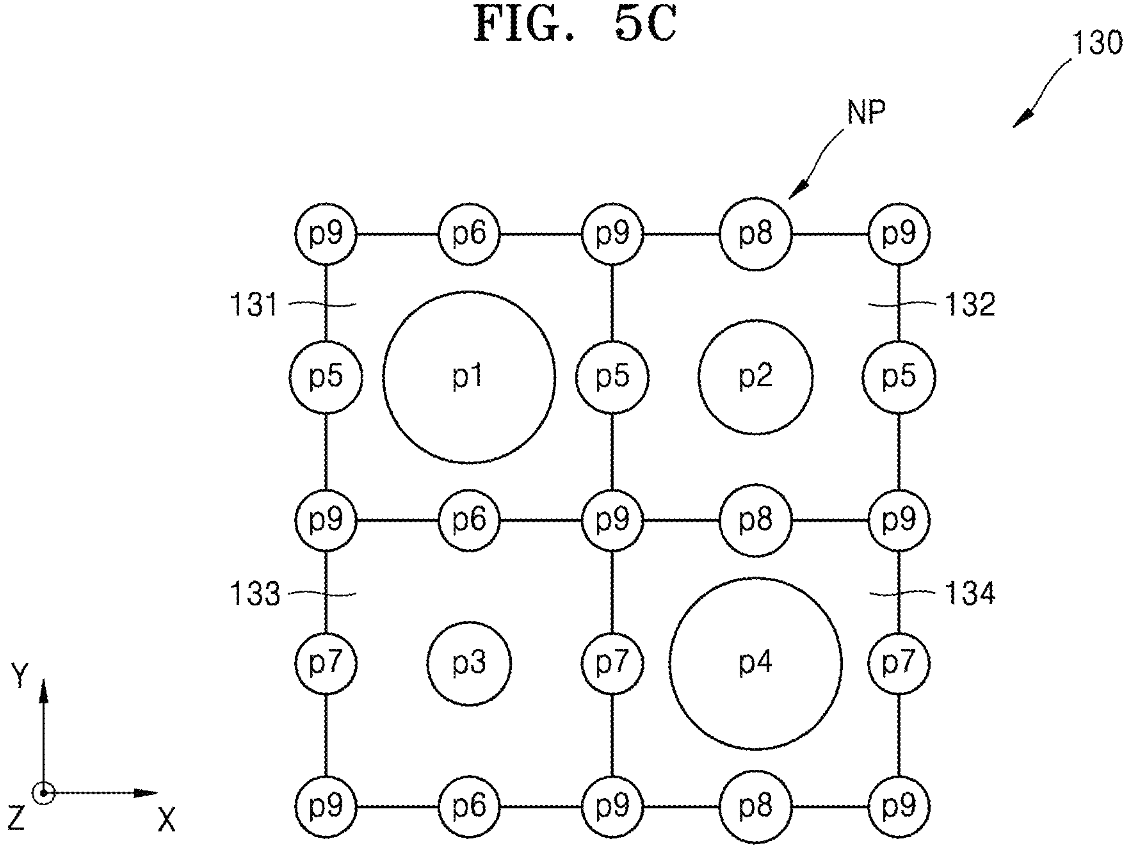
FIG. 5C is an enlarged view and a detailed plan view of part of FIG. 5B.

FIG. 5C illustrates the arrangement of the nanoposts NP in some regions of FIG. 5B, i.e., in the first through fourth regions 131, 132, 133, and 134 that constitute the unit pattern arrays, in detail. In FIG. 5C, the nanoposts NP are indicated by p1 to p9 according to detailed locations in the unit pattern array. Referring to FIG. 5C, among the nanoposts NP, the cross-sectional area of the nanoposts p1 arranged in the center of the first region 131 and the nanoposts p4 arranged in the center of the fourth region 134 may be greater than the cross-sectional area of the nanoposts p2 arranged in the center of the second region 132 or the nanoposts p3 arranged in the center of the third region 133, and the cross-sectional area of the nanoposts p2 arranged in the center of the second region 132 may be greater than the cross-sectional area of the nanoposts p3 arranged in the center of the third region 133. However, this is just an example, and the nanoposts NP having various shapes, sizes and arrangements may be applied if necessary.

The nanoposts NP provided in the first and fourth regions 131 and 134 that correspond to the green pixel G may have different distribution rules in the first direction (X-direction) and the second direction (Y-direction). For example, the nanoposts NP arranged in the first and fourth regions 131 and 134 may have different size arrangements in the first direction (X-direction) and the second direction (Y-direction). As shown in FIG. 5C, among the nanoposts NP, the cross-sectional area of the nanoposts p5 that are located at a boundary between the first region 131 and the second region 132 adjacent to the first region 131 in the first direction (X-direction) and the cross-sectional area of the nanoposts p6 that are located at a boundary between the first region 131 and the third region 133 adjacent to the first region 131 in the second direction (Y-direction) may be different from each other. Similarly, the cross-sectional area of the nanoposts p7 that are located at a boundary between the third region 133 and the fourth region 134 adjacent to the third region 131 in the first direction (X-direction) and the cross-sectional area of the nanoposts p8 that are located at a boundary between the third region 133 and the second region 132 adjacent to the third region 133 in the second direction (Y-direction) may be different from each other.

On the other hand, the nanoposts NP arranged in the second region 132 that corresponds to the blue pixel B and in the third region 133 that corresponds to the red pixel R may have a symmetrical distribution rule in the first direction (X-direction) and the second direction (Y-direction). As shown in FIG. 5C, among the nanoposts NP, the cross-sectional area of the nanoposts p5 located at a boundary between pixels adjacent to the second region 132 in the first direction (X-direction) and the cross-sectional area of the nanoposts p8 located at a boundary between pixels adjacent to the second region 132 in the second direction (Y-direction) may be the same, and the cross-sectional area of the nanoposts p7 located at a boundary between pixels adjacent to the third region 133 in the first direction (X-direction) and the cross-sectional area of the nanoposts p6 located at a boundary between pixels adjacent to the third region 133 in the second direction (Y-direction) may be the same.

Also, the nanoposts P9 arranged at a location where four edges of each of the first region 131, the second region 132, the third region 133 and the fourth region 134, i.e., four regions cross one another, may have the same cross-sectional area.

The distribution of the nanoposts NP in FIG. 3C is according to the pixel arrangement of the Bayer pattern. In both the blue pixel B and the red pixel R, pixels adjacent in the first direction (X-direction) and the second direction (Y-direction) are the same as the green pixel G, whereas, in the green pixel G that corresponds the first region 131, the pixels adjacent in the first direction (X-direction) are blue pixels B, and the pixels adjacent in the second direction (Y-direction) are red pixels R, which are different from each other. In the green pixel G that corresponds to the fourth region 134, the pixels adjacent in the first direction (X-direction) are the red pixels R, and the pixels adjacent in the second direction (Y-direction) are the blue pixels B, which are different from each other. In the green pixel G that corresponds to the first region 131 and the fourth region 134, the pixels adjacent in four diagonal directions are green pixels G, which are the same, and in the blue pixel B corresponding to the second region 132, the pixels adjacent in four diagonal directions are red pixels R, which are the same, and in the red pixel G corresponding to the third region 133, the pixels adjacent in four diagonal directions are blue pixels B, which are the same. Thus, in the second region 132 and the third region 133 each corresponding to the blue pixel B and the red pixel R, the nanoposts NP may be arranged in the form of 4-fold symmetry, and in the first and fourth regions 131 and 134 corresponding to the green pixel G, the nanoposts NP may be arranged in the form of 2-fold symmetry. In particular, the first region 131 and the fourth region 134 may be rotated by 90 degrees with respect to each other.

Although the nanoposts NP have a symmetrical circular cross-sectional shape according to example embodiments, the disclosure is not limited thereto, and some nanoposts having an asymmetrical cross-sectional shape may be included. For example, in the first region 131 and the fourth region 134 that correspond to the green pixel G, nanoposts having an asymmetrical cross-sectional shape with different widths in the first direction (X-direction) and the second direction (Y-direction) may be employed, and in the second region 132 and the third region 133 that correspond to the blue pixel B and the red pixel R, respectively, nanoposts having a symmetrical cross-sectional shape with the same widths in the first direction (X-direction) and the second direction (Y-direction) may be employed.

The arrangement pattern of the color separating lens array 130 is an example for implementing a target phase distribution in which light of the first wavelength is branched and condensed onto the first photosensitive cell 111 and the fourth photosensitive cell 114, light of the second wavelength is branched and condensed onto the second photosensitive cell 112 and light of the third wavelength is branched and condensed onto the third photosensitive cell 113, and is not limited to the illustrated pattern. The arrangement pattern may be provided according to a specific rule.

The shape, size and arrangement of the nanoposts NP in each region of the color separating lens array 130 may be determined so that light having the first wavelength, at a location that the light passes through the color separating lens array 130, may form a phase by which the light having the first wavelength is condensed onto the first photosensitive cell 111 and the fourth photosensitive cell 114 and does not proceed to the adjacent second photosensitive cell 112 and the third photosensitive cell 113.

Similarly, the shape, size and arrangement of the nanoposts NP in each region of the color separating lens array 130 may be determined so that light having the second wavelength, at a location that the light passes through the color separating lens array 130, may form a phase by which the light having the second wavelength is condensed onto the second photosensitive cell 112 and does not proceed to the adjacent first photosensitive cell 111, the third photosensitive cell 113 and the fourth photosensitive cell 114.

Also, similarly, the shape, size and arrangement of the nanoposts NP in each region of the color separating lens array 130 may be determined so that light having the third wavelength, at a location that the light passes through the color separating lens array 130 may form a phase by which the light having the third wavelength is condensed onto the third photosensitive cell 113 and does not proceed to the adjacent first photosensitive cell 111, the second photosensitive cell 112 and the fourth photosensitive cell 114.

The shape, size and/or arrangement of the nanoposts NP that satisfy all these conditions may be determined, and light immediately after passing through the color separating lens array 130 may have the following target phase distribution. The phase of the light having the first wavelength immediately after passing through the color separating lens array 130, in other words, the phase of the light having the first wavelength on the bottom surface of the color separating lens array 130 or the top surface of the spacer layer 120 may be $2N\pi$ in the center of the first region 131 corresponding to the first photosensitive cell 111 and the center of the fourth region 134 corresponding to the fourth photosensitive cell 114 and $(2N-2)\pi$ in the center of the second region 32 corresponding to the second photosensitive cell 112 and in the center of the third region 133 corresponding to the third photosensitive cell 113. Here, N is an integer that is greater than 0. In other words, the phase of the light having the first wavelength immediately after passing through the color separating lens array 130 may be maximized in the center of the first region 131 and the center of the fourth region 134, and as the distance from the center of the first region 131 and the center of the fourth region 134 gradually decreases in a concentric circle shape, the phase of the light having the first wavelength may be minimized in the center of the second region 132 and the center of the third region 132. For example, when N=1, the phase of a green light passing through the color separating lens array 130 may be $2\pi$ in the center of the first region 131 and the center of the fourth region 134 and $\pi$ in the center of the second region 132 and the center of the third region 132. Here, the phase may refer to a phase value relative to a phase immediately before light passes through the nanoposts NP.

Also, the phase of the light having the second wavelength immediately after passing through the color separating lens array 130 may be $2M\pi$ in the center of the second region 132 corresponding to the second photosensitive cell 112 and $(2M-1)\pi$ in the center of the first region 131 corresponding to the first photosensitive cell 111 and the center of the fourth region 134 corresponding to the fourth photosensitive cell 114, and may be greater than $(2M-2)\pi$ and less than $(2M-1)\pi$ in the center of the third region 133 corresponding to the third photosensitive cell 113. Here, M is an integer that is greater than 0. In other words, the phase of the light having the second wavelength immediately after passing through the color separating lens array 130 may be maximized in the center of the second region, and as the distance from the center of the second region 132 gradually decreases in a concentric circular shape, the phase of the light having the second wavelength may be locally minimized in the centers of the first region 131, the fourth region 134 and the third region 133. For example, when M=1, the phase of the blue light that passes through the color separating lens array 130 may be $2\pi$ in the center of the second region 132, $\pi$ in the center of the first region 131 and the center of the fourth region 134 and about $0.2\pi$ to about $0.7\pi$ in the center of the third region 133.

Also, similarly, the phase of the light having the third wavelength immediately after passing the color separating lens array 130 may be $2L\pi$ in the center of the third region 133 corresponding to the third photosensitive cell 113 and $(2L-1)\pi$ in the centers of the first region 131 corresponding to the first photosensitive cell 111 and the fourth region 134 corresponding to the fourth photosensitive cell 114 and may be greater than $(2L-2)\pi$ and less than $(2L-1)\pi$ in the center of the second region 132 corresponding to the second photosensitive cell 112. Here, L is an integer that is greater than 0. In other words, the phase of the light having the third wavelength immediately after passing through the color separating lens array 130 may be maximized in the center of the third region 133, and as the distance from the center of the third region 133 gradually decreases in a concentric circle shape, the phase of the light having the third wavelength may be locally minimized in the centers of the first region 131, the fourth region 134, and the second region 132. For example, when L=1, the phase of the red light that passes through the color separating lens array 130 may be $2\pi$ in the center of the third region 133, $\pi$ in the center of the first region 131 and the center of the fourth region 134, and about $0.2\pi$ to $0.7\pi$ in the center of the second region 132.

As mentioned above, the target phase distribution refers to the phase distribution of light immediately after passing through the color separating lens array 130. When the light passing through the color separating lens array 130 has this phase distribution, lights having the first through fourth wavelengths may be condensed onto the first photosensitive cell 111, the second photosensitive cell 112, the third photosensitive cell 113, and the fourth photosensitive cell 114, respectively. In other words, the light that passes through the color separating lens array 130 may attain the same optical effect as being be branched according to wavelengths, proceeding in different directions and being condensed.

According to an example embodiment, a certain propagation distance requirement may be determined so that the light having the corresponding wavelength may be condensed onto the corresponding photosensitive cell. Thus, the thickness h of the spacer layer 120 may be determined accordingly. For example, according to an example embodiment, the thickness h of the spacer layer 120 may be changed according to a wavelength λ to be branched, a pixel size and the arrangement period p of a photosensitive cell. The thickness h of the spacer layer 120 may be greater than the center wavelength λ of the wavelength band of visible light to be branched and may be in the range of 1p to 3*p* when being compared with the photosensitive cell arrangement period p that is a distance between adjacent photosensitive cell centers. In detail, the thickness h of the spacer layer 120 may be between 500 nm and 5 μm. More details for setting the thickness h of the spacer layer 120 will be described later with reference to FIGS. 10A through 10E, FIGS. 11A through 11E, and FIGS. 12A through 12E.

Figure 6A:
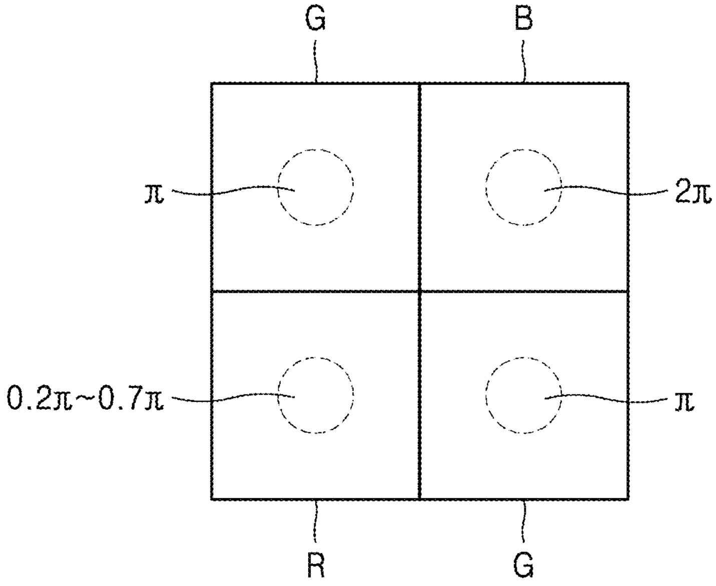
FIGS. 6A and 6B are views illustrating a phase distribution shape of a blue light passing through a color separating lens array and a computer simulation of a focusing distribution of the blue light in a photosensitive cell facing the same according to example embodiments.
Figure 6B:
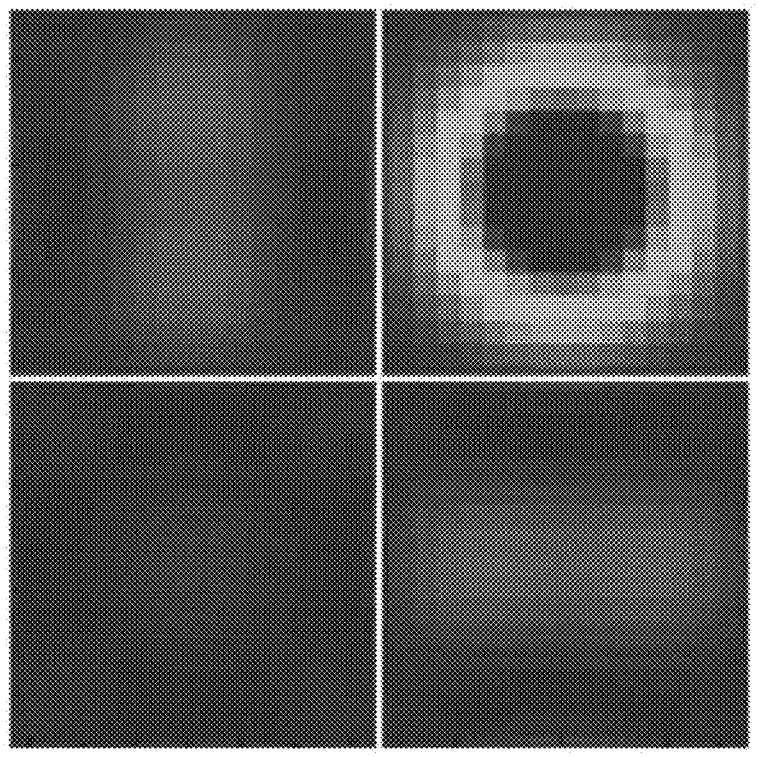
Figure 6C:
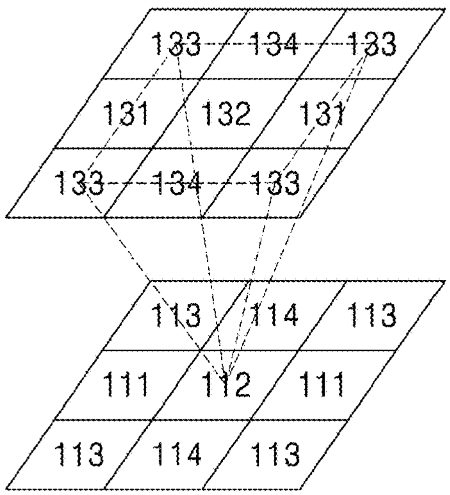
FIG. 6C illustrates a proceeding direction of the blue light incident on and around the second region of the color separating lens array corresponding to the blue pixel according to an example embodiment.
Figure 6D:
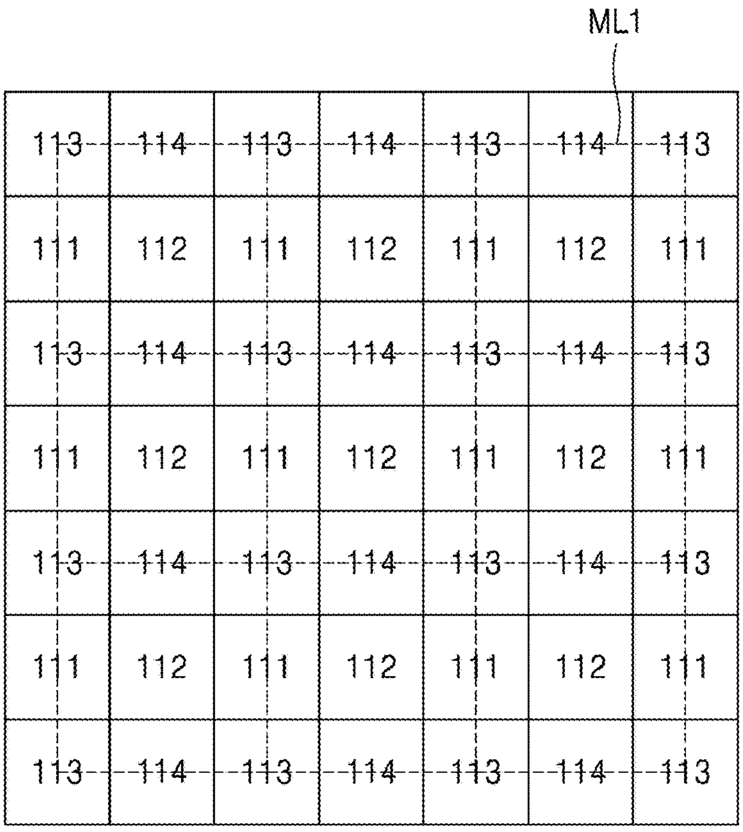
FIG. 6D illustrates a color separating lens array for the blue light and a micro lens array that acts equivalently to the color separating lens array according to an example embodiment.

FIGS. 6A and 6B are views illustrating a phase distribution shape of a blue light passing through a color separating lens array according to an example embodiment and a computer simulation of a focusing distribution of the blue light in a photosensitive cell facing the same, FIG. 6C illustrates a proceeding direction of the blue light incident on and around the second region of the color separating lens array corresponding to the blue pixel B according to an example embodiment, and FIG. 6D illustrates a color separating lens array for the blue light and a micro lens array that acts equivalently to the color separating lens array according to an example embodiment.

According to the phase distribution illustrated in FIG. 6A, the phase of the blue light in the center of a region corresponding to the blue pixel B may be approximately 2π, and the phase of the blue light in the center of a region corresponding to the adjacent green pixel G may be approximately π, and the phase of the blue light in the center of a region corresponding to the red pixel R in a diagonal direction may be approximately less than π (for example, about 0.2π to 0.7π).

The phase distribution may represent a focusing distribution of the blue light shown in FIG. 6B. Most of the blue light may be condensed onto a region corresponding to the blue pixel B, and the blue light hardly reaches a region corresponding to the other pixels.

As a result, the blue light incident on and around the second region 132 corresponding to the blue pixel B passes through the color separating lens array 130 and then proceeds towards the second photosensitive cell, as shown in FIG. 6C. For example, among incident light incident on the second region 132 of the color separating lens array 130 and part of the other regions surrounding the second region 132, the blue light may be condensed onto the second photosensitive cell 112 directly below the second region 132. In other words, the blue light from the second region 132 corresponding to the blue pixel B, the blue light from two first regions 131 adjacent to the second region 132 in a horizontal direction, the blue light from two fourth regions 134 adjacent to the second region 132 in a vertical direction, and the blue light from four third regions 113 adjacent to the second region 132 in a diagonal direction are incident on one blue pixel B.

Thus, as shown in FIG. 6D, the color separating lens array 130 may play an equivalent role to an array of a plurality of micro lenses ML1 arranged around the second photosensitive cell 112 for blue light. Since each equivalent micro lens ML1 is greater than the corresponding second photosensitive cell 112, blue light incident on another region surrounding the second photosensitive cell 112 as well as blue light incident on a region of the second photosensitive cell 112 may also be condensed onto the second photosensitive cell 112. For example, each micro lens ML1 may be about four times greater than the corresponding second photosensitive cell 112, and four sides of each micro lens ML1 may be parallel to four sides of the second photosensitive cell 112.

Figure 7A:
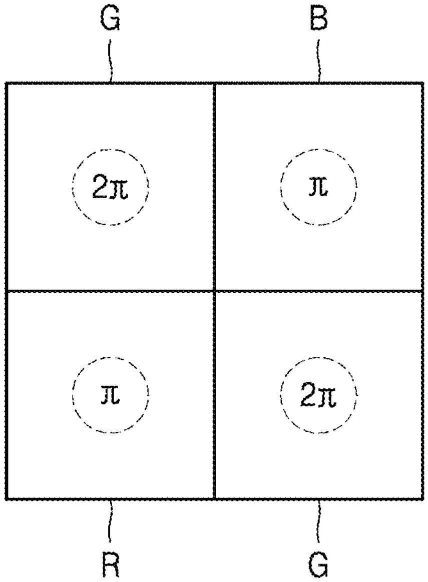
FIGS. 7A and 7B are views illustrating a phase distribution shape of a green light passing through a color separating lens array and a computer simulation of a focusing distribution of the green light in a photosensitive cell facing the same according to example embodiments.
Figure 7B:
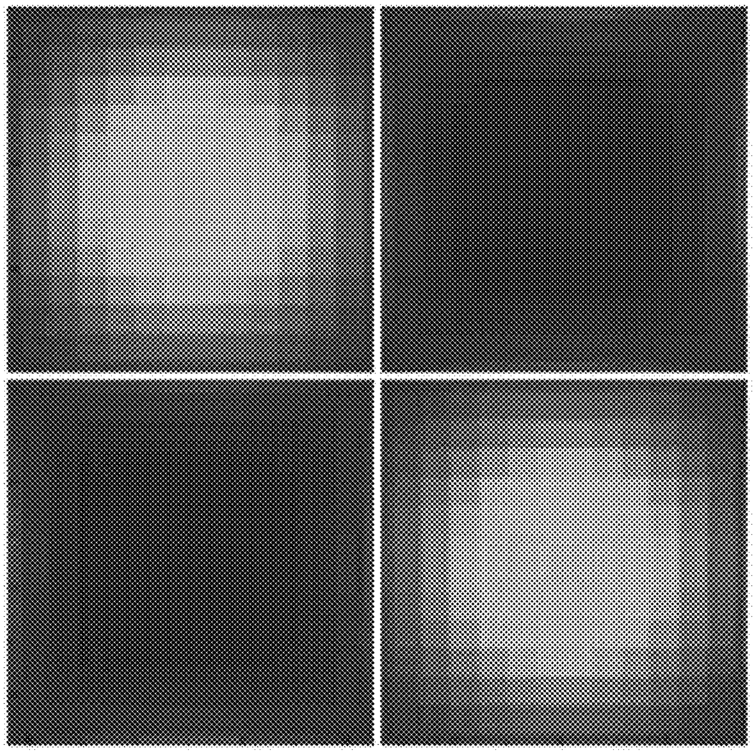
Figure 7C:
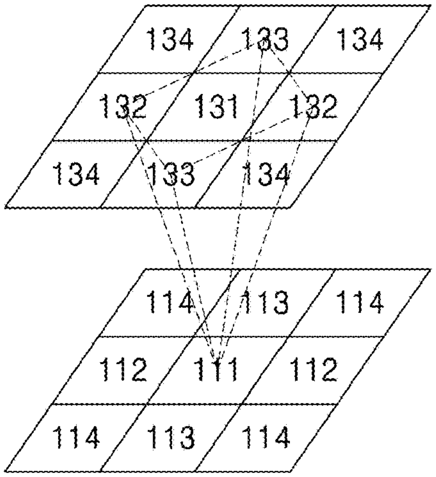
FIG. 7C illustrates a proceeding direction of the green light incident on and around the first region and the fourth region of the color separating lens array corresponding to the green pixel according to an example embodiment.
Figure 7D:
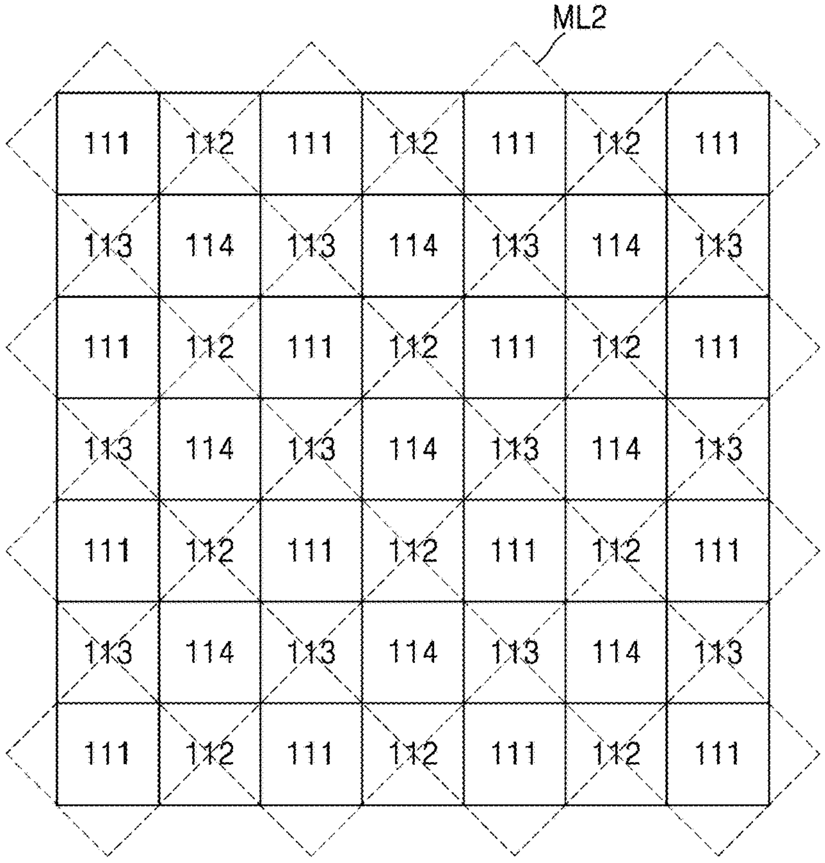
FIG. 7D illustrates a color separating lens array for the green light and a micro lens array that acts equivalently to the color separating lens array according to an example embodiment.

FIGS. 7A and 7B are views illustrating a phase distribution shape of a green light passing through a color separating lens array and a computer simulation of a focusing distribution of the green light in a photosensitive cell facing the same, FIG. 7C illustrates a proceeding direction of the green light incident on and around the first region and the fourth region of the color separating lens array corresponding to the green pixel, and FIG. 7D illustrates a color separating lens array for the green light and a micro lens array that acts equivalently to the color separating lens array.

According to the phase distribution illustrated in FIG. 7A, the phase of the green light in the center of a region corresponding to the green pixel G may be approximately 2π, and the phase of the green light in the center of a region each corresponding to the adjacent blue pixel B and the red pixel R may be approximately π.

The phase distribution may represent a focusing distribution of the green light shown in FIG. 7B. The green light may be condensed onto a region each corresponding to two green pixels G, and the green light hardly reaches a region corresponding to the other pixels.

As a result, the green light incident on and around the first and fourth regions 131 and 134 corresponding to the green pixel G passes through the color separating lens array 130 and then proceeds to the first photosensitive cell 111, as shown in FIG. 7C. For example, among incident light incident on the first region 131 of the color separating lens array 130 and part of the other regions surrounding the first region 131, the green light may be condensed onto the first photosensitive cell 111 directly below the first region 131. In other words, the green light from the first region 131 or the fourth region 134 corresponding to the green pixel G, and the green light from two second regions 132 and two third regions 133 adjacent to the first region 131 or the fourth region 134 in horizontal and vertical directions are incident on one green pixel G.

Thus, as shown in FIG. 7D, the color separating lens array 130 may play an equivalent role to an array of a plurality of micro lenses ML2 arranged around the first photosensitive cell 111 and the fourth photosensitive cell 114 for green light. Since each equivalent micro lens ML2 is greater than the corresponding first photosensitive cell 111 or fourth photosensitive cell 114, green light incident on another region surrounding the first photosensitive cell 111 and the fourth photosensitive cell 114 as well as green light incident on a region of the first photosensitive cell 111 and the fourth photosensitive cell 114 may also be condensed onto the first photosensitive cell 111 and the fourth photosensitive cell 114. For example, each micro lens ML2 may be about twice greater than the corresponding first photosensitive cell 111 or fourth photosensitive cell 114 and may be arranged adjacent to the corresponding first photosensitive cell 111 or fourth photosensitive cell 114 in a diagonal direction.

Figure 8A:
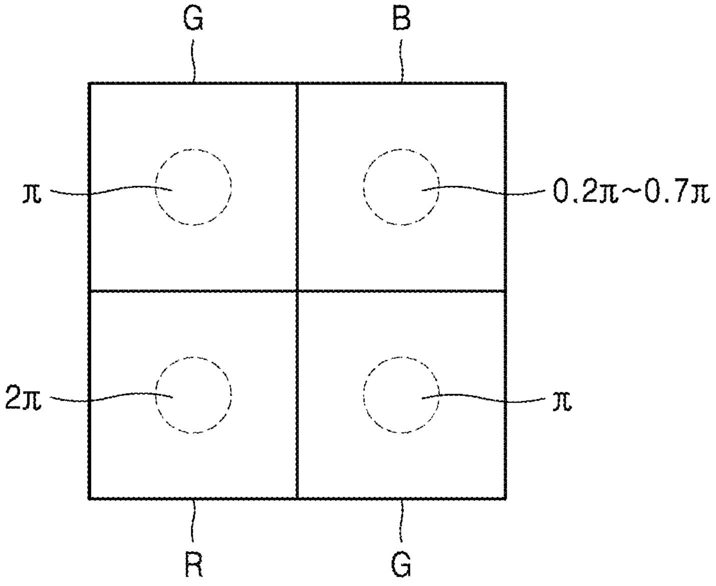
FIGS. 8A and 8B are views illustrating a phase distribution shape of a red light passing through a color separating lens array according to an example embodiment and a computer simulation of a focusing distribution of the red light in a photosensitive cell facing the same.
Figure 8B:
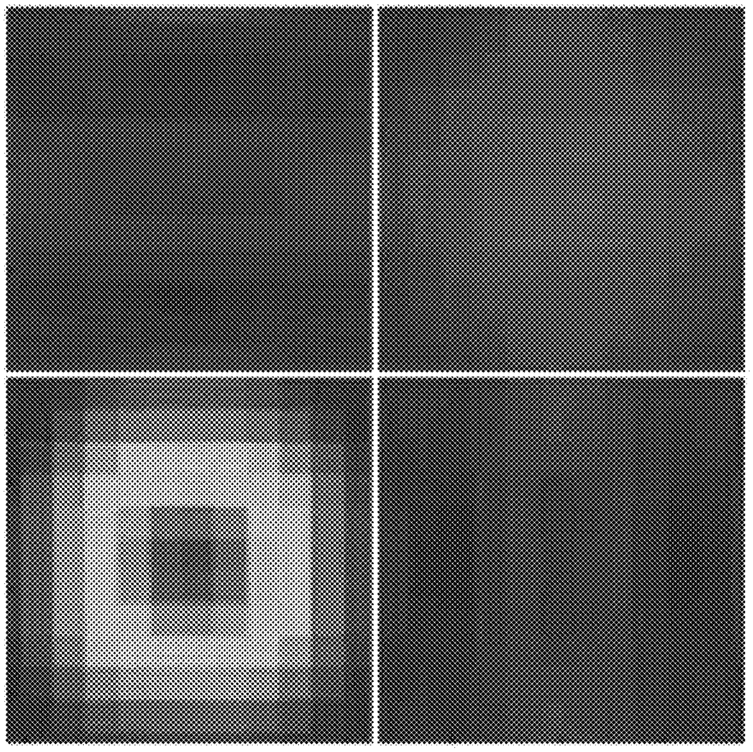
Figure 8C:
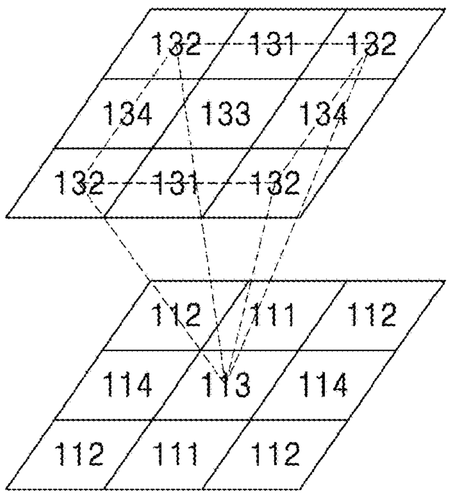
FIG. 8C illustrates a proceeding direction of the red light incident on and around the third region of the color separating lens array corresponding to the red pixel according to an example embodiment.
Figure 8D:
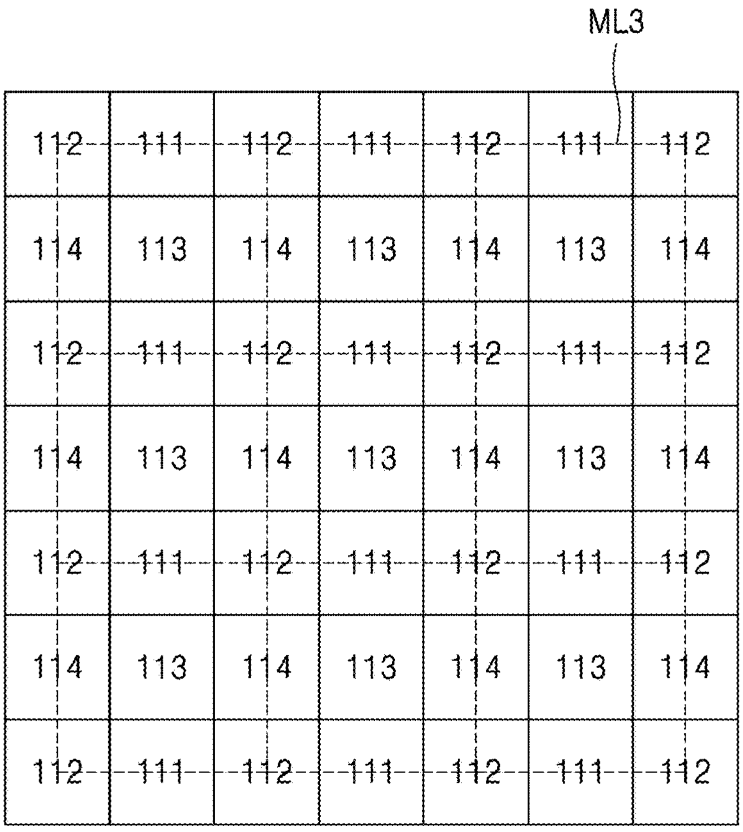
FIG. 8D illustrates a color separating lens array for the red light R and a micro lens array that acts equivalently to the color separating lens array according to an example embodiment.

FIGS. 8A and 8B are views illustrating a phase distribution shape of red light passing through a color separating lens array and a computer simulation of a focusing distribution of the red light in a photosensitive cell facing the same, FIG. 8C illustrates a proceeding direction of the red light incident on and around the third region of the color separating lens array corresponding to the red pixel, and FIG. 8D illustrates a color separating lens array for the red light R and a micro lens array that acts equivalently to the color separating lens array.

According to the phase distribution illustrated in FIG. 8A, the phase of the red light in the center of a region corresponding to the red pixel R may be approximately 2π, and the phase of the red light in the center of a region corresponding to the adjacent green pixel G may be approximately π, and the phase of the red light in the center of a region corresponding to the blue pixel B in a diagonal direction may be approximately less than π (for example, about 0.2π to 0.7π).

The phase distribution may represent a focusing distribution of the red light shown in FIG. 8B. The red light may be condensed onto a region corresponding to the red pixel R, and the red light hardly reaches a region corresponding to the other pixels.

As a result, the light incident on and around the third region 133 corresponding to the red pixel R passes through the color separating lens array 130 and then proceeds, as shown in FIG. 8C. For example, among incident light incident on the third region 133 of the color separating lens array 130 and part of the other regions surrounding the third region 133, the red light may be condensed onto the third photosensitive cell 113 directly below the third region 133. In other words, the red light from the third region 133 corresponding to the red pixel R, the red light from two fourth regions 134 adjacent to the third region 133 in a horizontal direction, the red light from two first regions 131 adjacent to the third region 133 in a vertical direction, and the red light from four second regions 132 adjacent to the third region 133 in a diagonal direction are incident on one red pixel R.

Thus, as shown in FIG. 8D, the color separating lens array 130 may play an equivalent role to an array of a plurality of micro lenses ML3 arranged around the third photosensitive cell 113 for red light. Since each equivalent micro lens ML3 is greater than the corresponding third photosensitive cell 113, red light incident on another region surrounding the third photosensitive cell 113 as well as red light incident on a region of the third photosensitive cell 113 may also be condensed onto the third photosensitive cell 113. For example, each micro lens ML3 may be about four times greater than the corresponding third photosensitive cell 113, and four sides of each micro lens ML3 may be parallel to four sides of the third photosensitive cell 113.

Paths of the blue light, the green light, and the red light described in FIGS. 6C, 7C, and 8C may have a shape in which light incident on each region is branched for each color, and may be described as below.

Figure 9A:
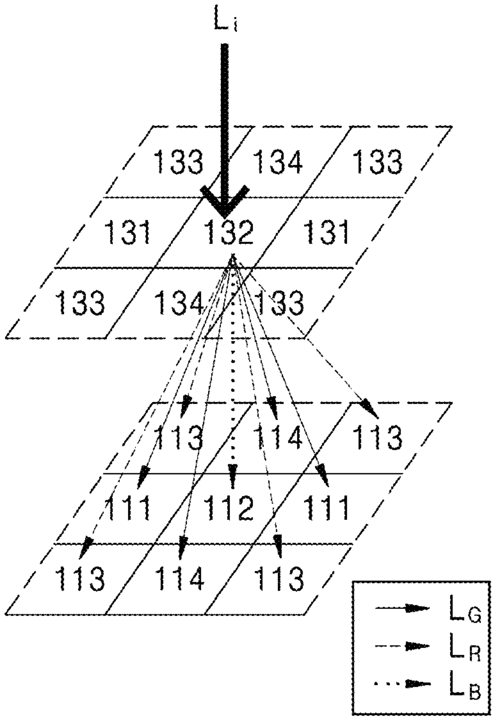
FIGS. 9A, 9B, and 9C illustrate a proceeding direction for each color of light incident on a region corresponding to a blue pixel, a region corresponding to a green pixel, and a region corresponding to a red pixel according to example embodiment.

FIG. 9A illustrates a proceeding direction for each color of light incident on a region corresponding to the blue pixel. Referring to FIG. 9A, among light $L_i$ incident on the second region 132 corresponding to the blue pixel B, a blue light $L_B$ proceeds to the second photosensitive cell 112 directly below the second region 132. Among incident light $L_i$ incident on the second region 132, a green light LG mostly proceeds to two first photosensitive cells 111 adjacent to the second photosensitive cell 112 in a horizontal direction and to two fourth photosensitive cells 114 adjacent to the second photosensitive cell 112 in a vertical direction. Among the incident light $L_i$, a red light $L_R$ mostly proceeds to four third photosensitive cells 113 adjacent to the second photosensitive cell 112 in a diagonal direction.

Figure 9B:
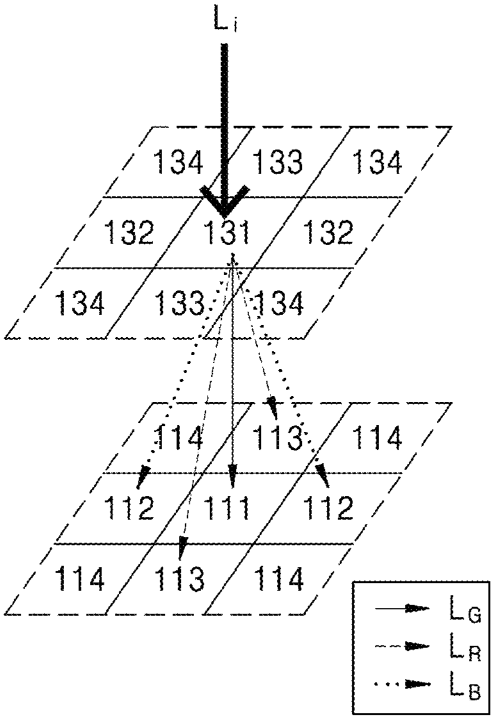

FIG. 9B illustrates a proceeding direction for each color of light incident on a region corresponding to the green pixel. Referring to FIG. 9B, among light $L_i$ incident on the first region 131 corresponding to the green pixel G, a green light $L_G$ proceeds to the first photosensitive cell 111 directly below the first region 131. Among incident light $L_i$ incident on the first region 131, the blue light $L_B$ proceeds to two second photosensitive cells 112 adjacent to the first photosensitive cell 111 in a horizontal direction, and the red light $L_R$ mostly proceeds to two third photosensitive cells 113 adjacent to the first photosensitive cell 111 in a vertical direction.

Figure 9C:
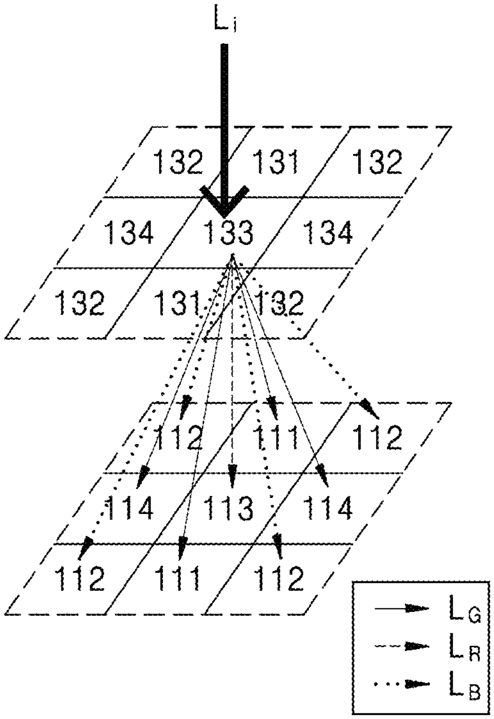

FIG. 9C illustrates a proceeding direction of light incident on a region corresponding to the red pixel. Among the light $L_i$ incident on the third region 133 corresponding to the red pixel R, the red light $L_R$ proceeds to the third photosensitive cell 113 directly below the third region 133. Among the incident light $L_i$ incident on the third region 133, the green light LG proceeds to two first photosensitive cells 111 adjacent to the third photosensitive cell 113 in a vertical direction and to two four photosensitive cells 114 adjacent to the third photosensitive cell 113 in a horizontal direction. The blue light $L_B$ among the incident light $L_i$ mostly proceeds to four second photosensitive cells 112 adjacent to the third photosensitive cell 113 in a diagonal direction.

Such a color separation and condensation may be more efficiently performed by properly setting the thickness of the spacer layer 120. For example, when a refractive index of the spacer layer 120 with respect to the wavelength of $\lambda_0$ is n and a pitch of a photosensitive cell is p, a theoretical thickness $h_t$ of the spacer layer 120 may satisfy the following equation 1.

$$h_t = \frac{np^2}{\lambda_0} - \frac{\lambda_0}{4n} \quad \text{[Equation 1]}$$

Here, the theoretical thickness $h_t$ of the spacer layer 120 may refer to a focal length with respect to light having a wavelength of $\lambda_0$ is condensed onto a top surface of the photosensitive cells 111, 112, 113 and 114 by the color separating lens array 130. In other words, light having a wavelength of $\lambda_0$ may be focused at a distance $h_t$ from the bottom surface of the color separating lens array 130 while passing through the color separating lens array 130.

As described in equation 1, the theoretical thickness $h_t$ of the spacer layer 120 may differ according to the pitch p of the photosensitive cells 111, 112, 113, and 114 and the refractive index n of the spacer layer 120. For example, assuming that a center wavelength $\lambda_0$ of a visible light band is 540 nm, the pitch p of the photosensitive cells 111, 112, 113 and 114 is 0.8 μm and the refractive index n of the spacer layer 120 at a wavelength of 540 nm is 1.46, the theoretical thickness $h_t$ of the spacer layer 120, i.e., an optimum distance between the bottom surface of the color separating lens array 130 and the top surface of a sensor substrate 110 may be about 1.64 μm. However, the theoretical thickness of the spacer layer 120 need not be limited to only the theoretical thickness $h_t$ described in equation 1. For example, the actual thickness of the spacer layer 120 may be selected within a certain range based on the theoretical thickness $h_t$ of equation 1 considering the efficiency of the color separating lens array 130.

Figure 10A:
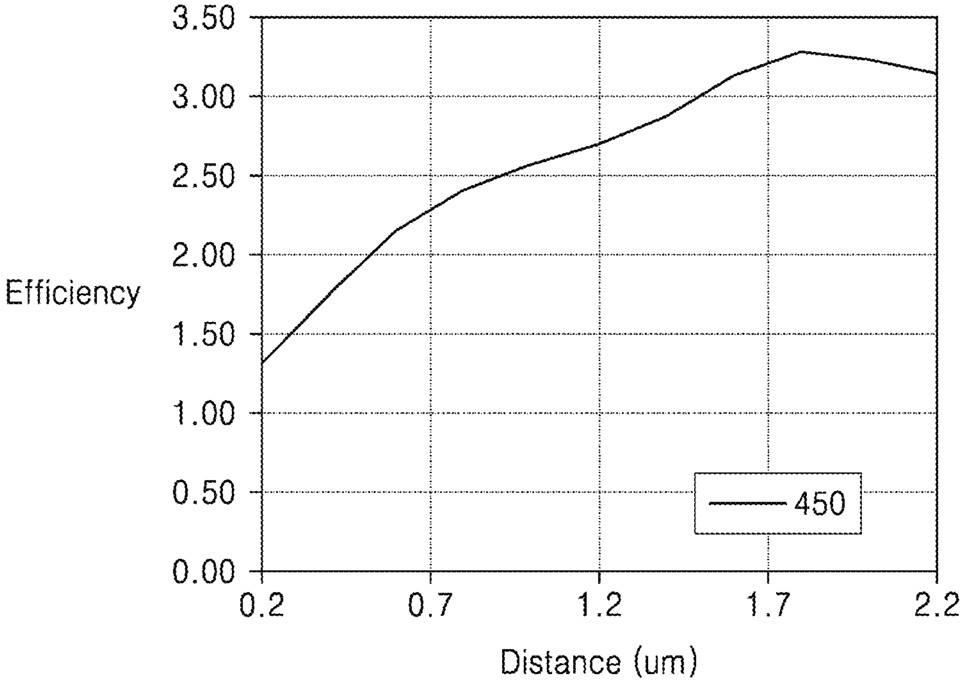
FIGS. 10A through 10E are graphs illustrating a change of efficiency of the color separating lens array according to a distance between the color separating lens array and the sensor substrate when a pitch of each of the photosensitive cells is 0.7 μm.
Figure 10B:
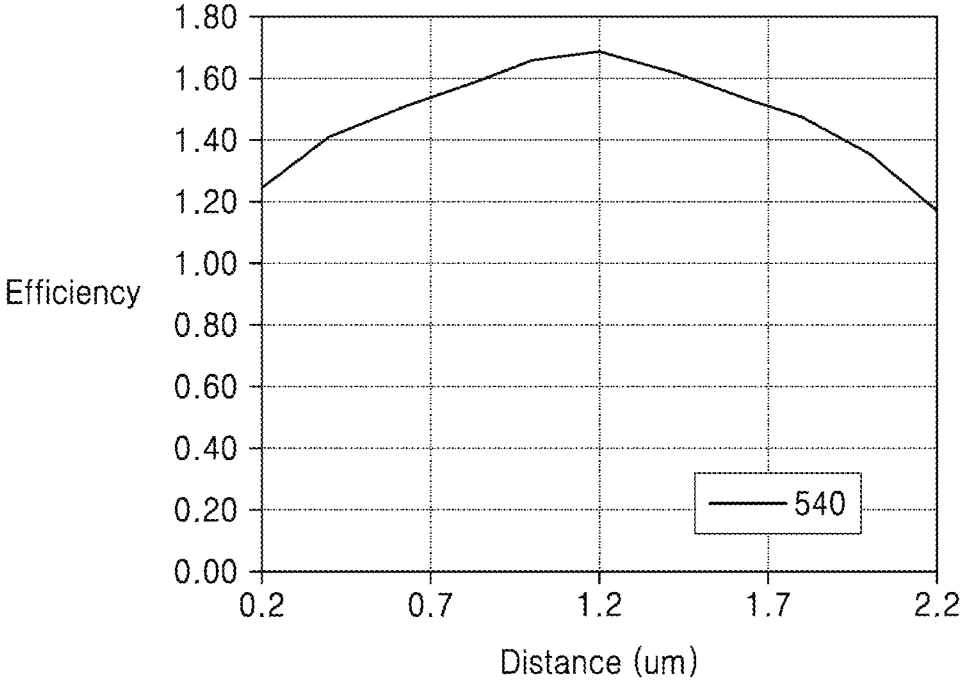
Figure 10C:
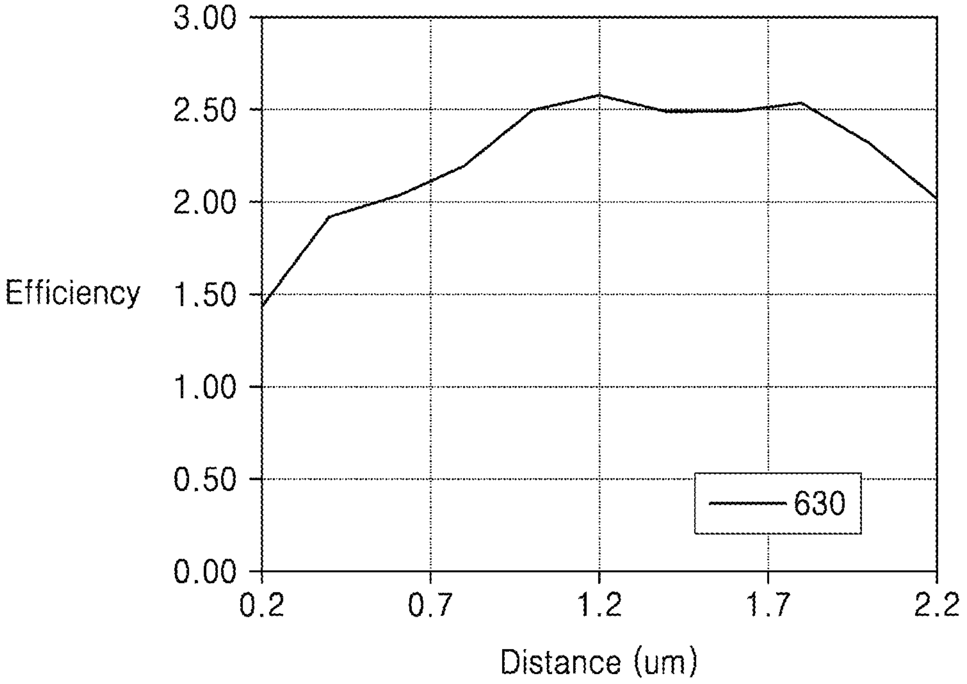

FIGS. 10A through 10E are graphs illustrating a change of efficiency of the color separating lens array 130 according to a distance between the color separating lens array 130 and the sensor substrate 110 when a pitch of each of the photosensitive cells 111, 112, 113, and 114 is 0.7 μm. FIG. 10A illustrates condensation efficiency of the color separating lens array 130 with respect to blue light incident on the second photosensitive cell 112 from the first through fourth regions 131, 132, 133, and 134 that constitute one unit pattern array of the color separating lens array 130, FIG. 10B illustrates condensation efficiency of the color separating lens array 130 with respect to green light incident on the first photosensitive cell 111 and the fourth photosensitive cell 114 from the first through fourth regions 131, 132, 133, and 134 that constitute one unit pattern array of the color separating lens array 130, and FIG. 10C illustrates condensation efficiency of the color separating lens array 130 with respect to red light incident on the third photosensitive cell 113 from the first through fourth regions 131, 132, 133, and 134 that constitute one unit pattern array of the color separating lens array 130.

In FIGS. 10A and 100, because four regions are provided to one photosensitive cell, a maximum value is theoretically 4. In FIG. 10B, because four regions are provided to two photosensitive cells, a maximum value is theoretically 2. A distance at which the condensation efficiency of the color separating lens array 130 is highest, in the graphs of FIGS. 10A through 10C, becomes the theoretical thickness $h_t$ that satisfies equation 1. As shown in FIGS. 10A through 100, the theoretical thickness $h_t$ slightly differs according to wavelengths.

Figure 10D:
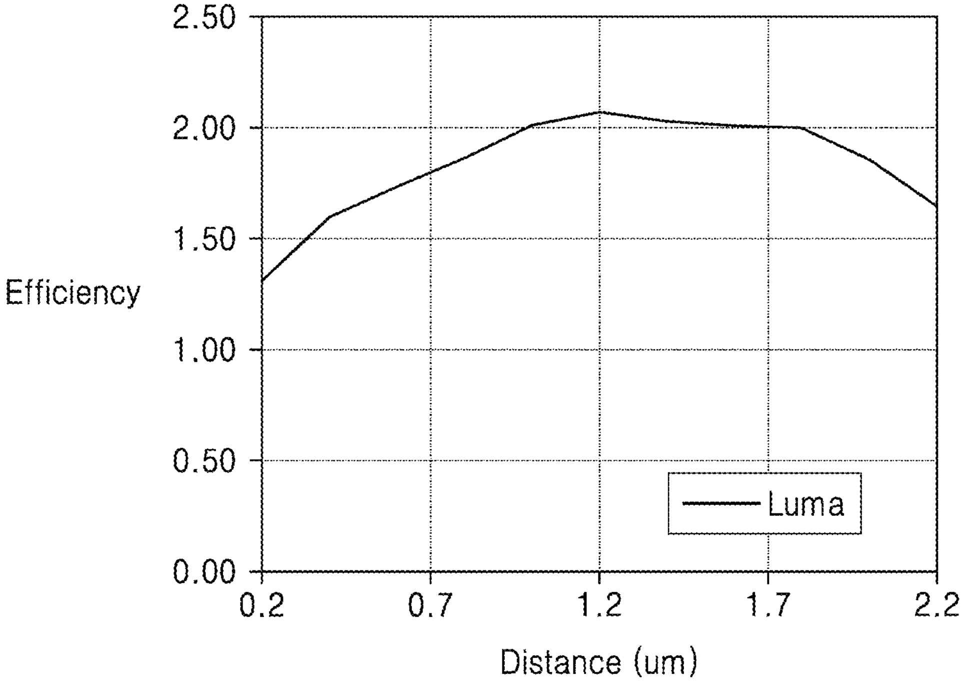
Figure 10E:
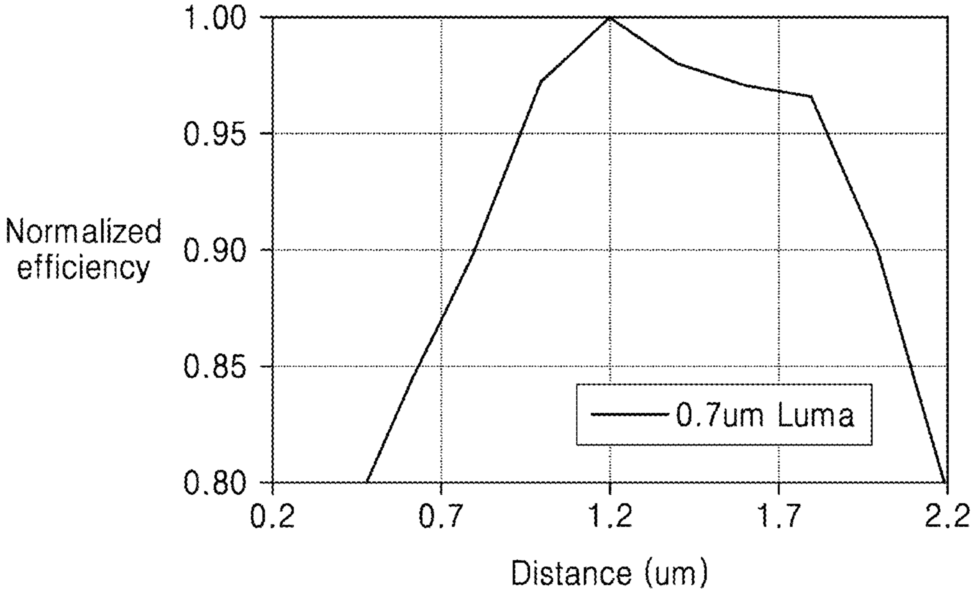
Figure 11A:
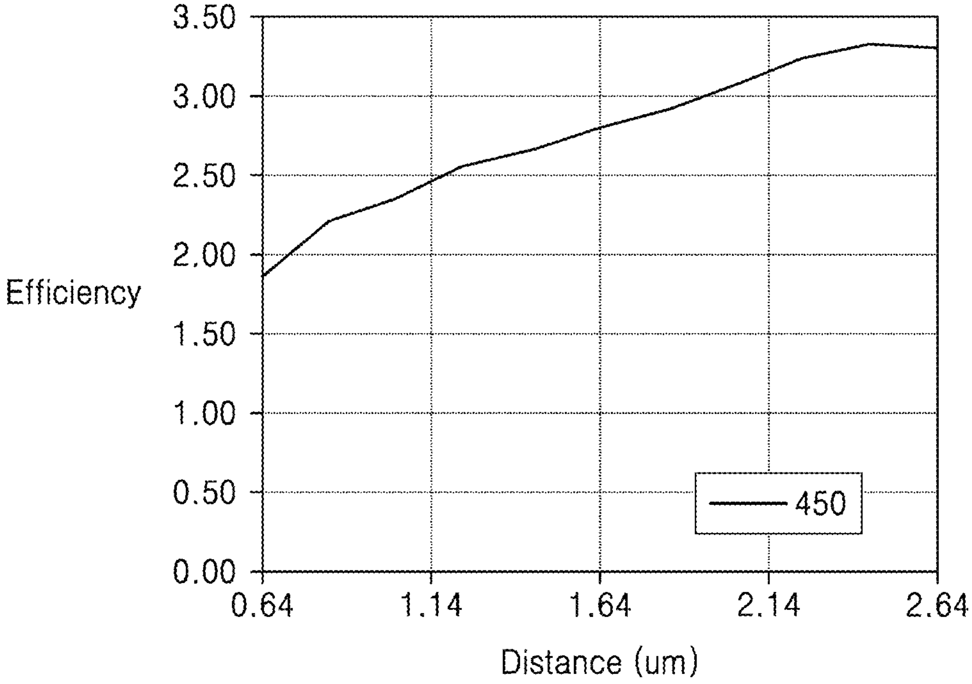
FIGS. 11A through 11E are graphs illustrating a change of efficiency of the color separating lens array according to a distance between the color separating lens array and the sensor substrate when a pitch of each of the photosensitive cells is 0.8 μm.
Figure 11B:
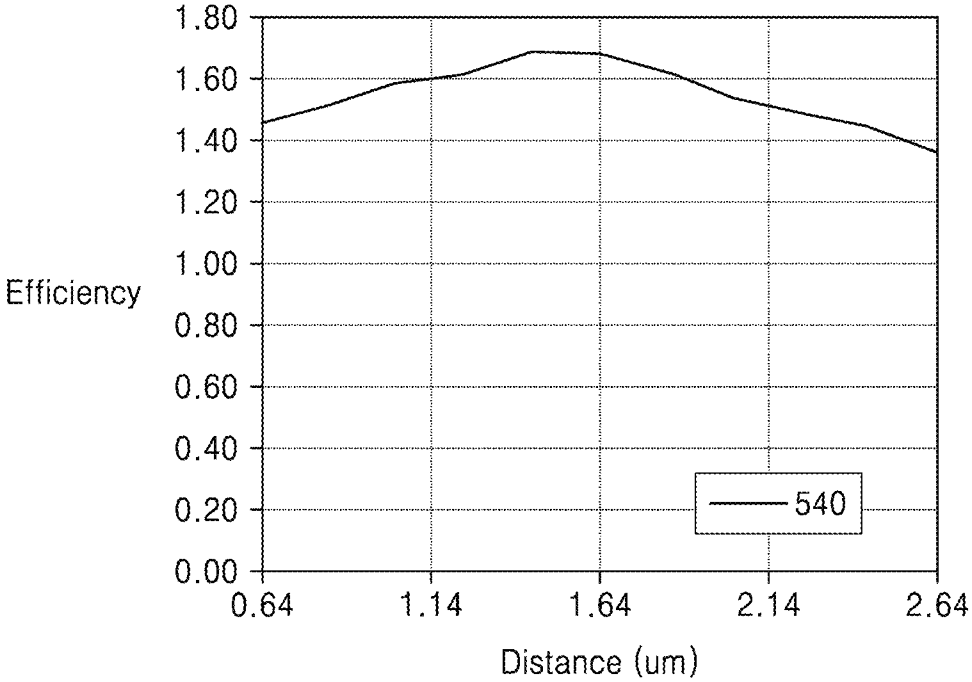
Figure 11C:
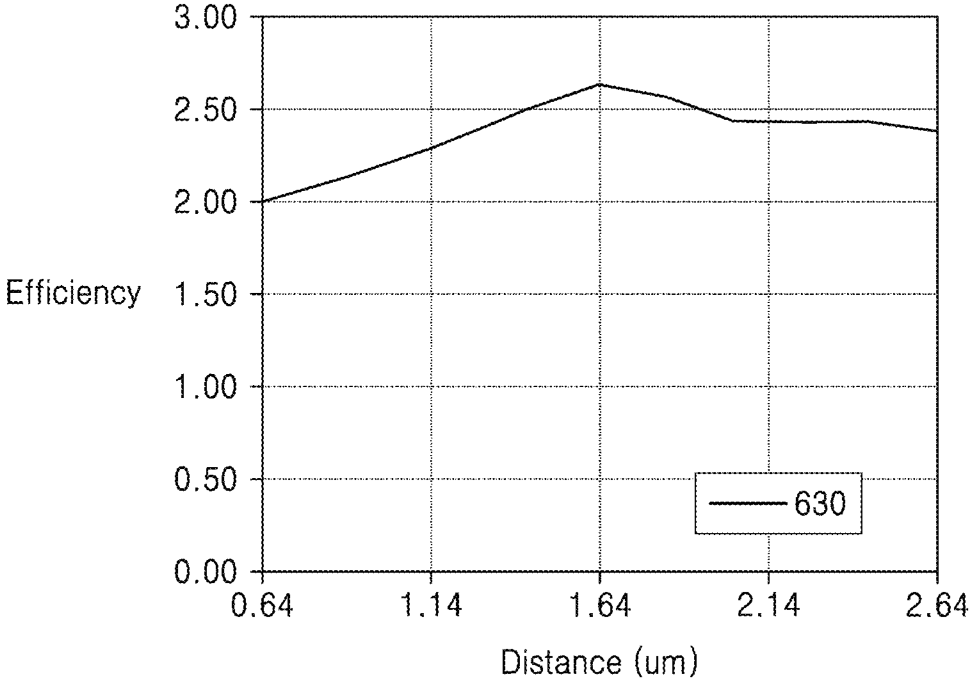
Figure 11D:
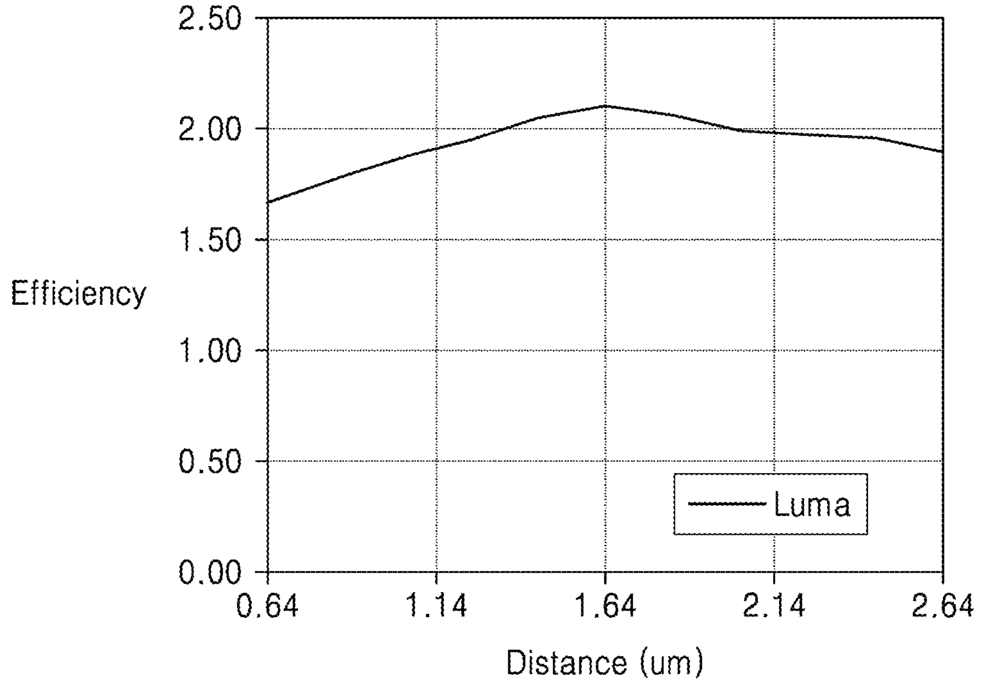
Figure 11E:
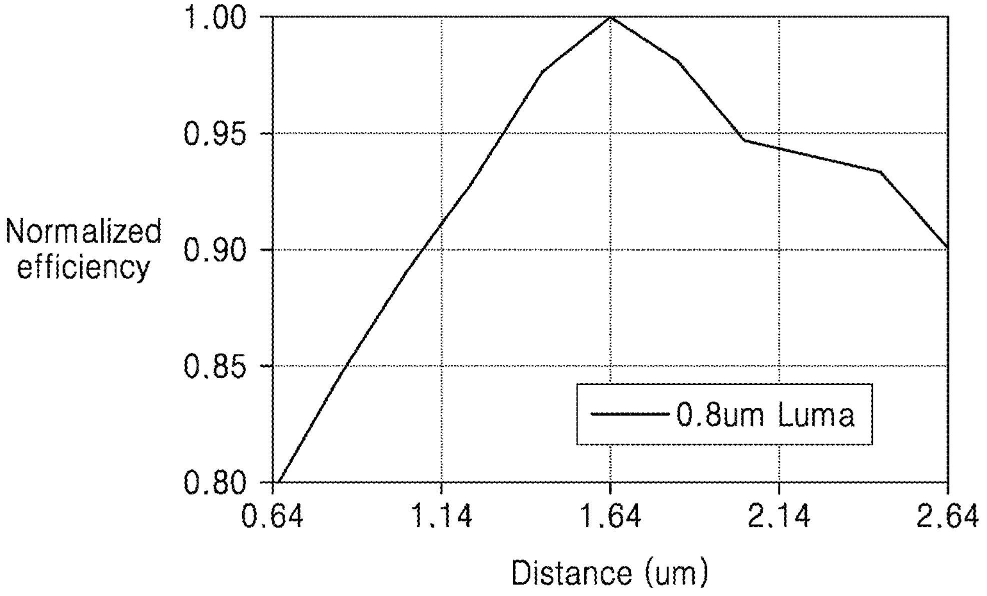
Figure 12A:
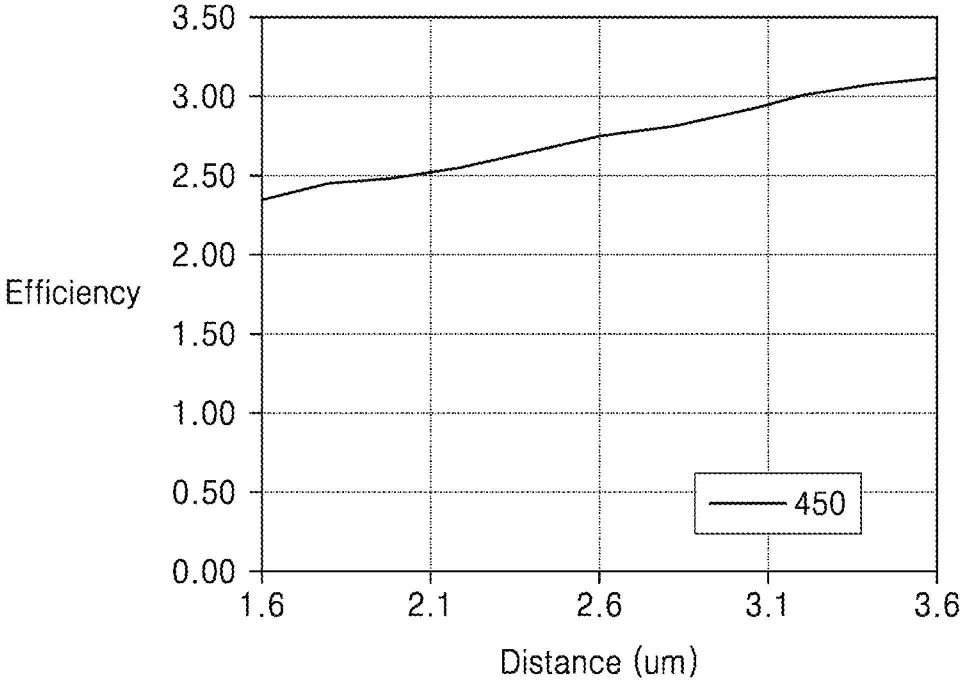
FIGS. 12A through 12E are graphs illustrating a change of efficiency of the color separating lens array according to a distance between the color separating lens array and the sensor substrate when a pitch of each of the photosensitive cells is 1.0 μm.
Figure 12B:
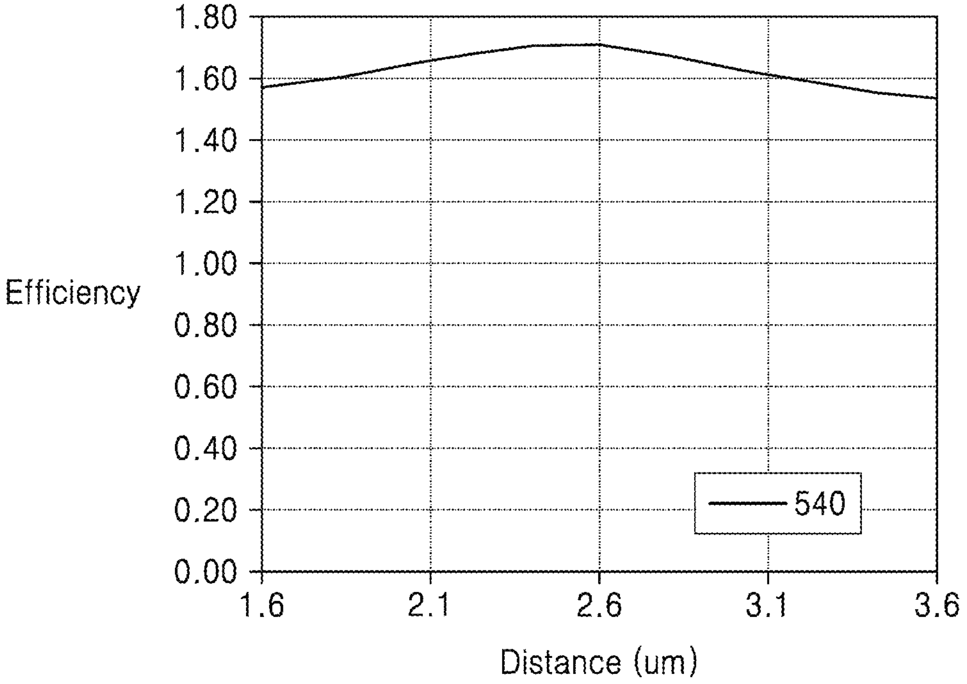
Figure 12C:
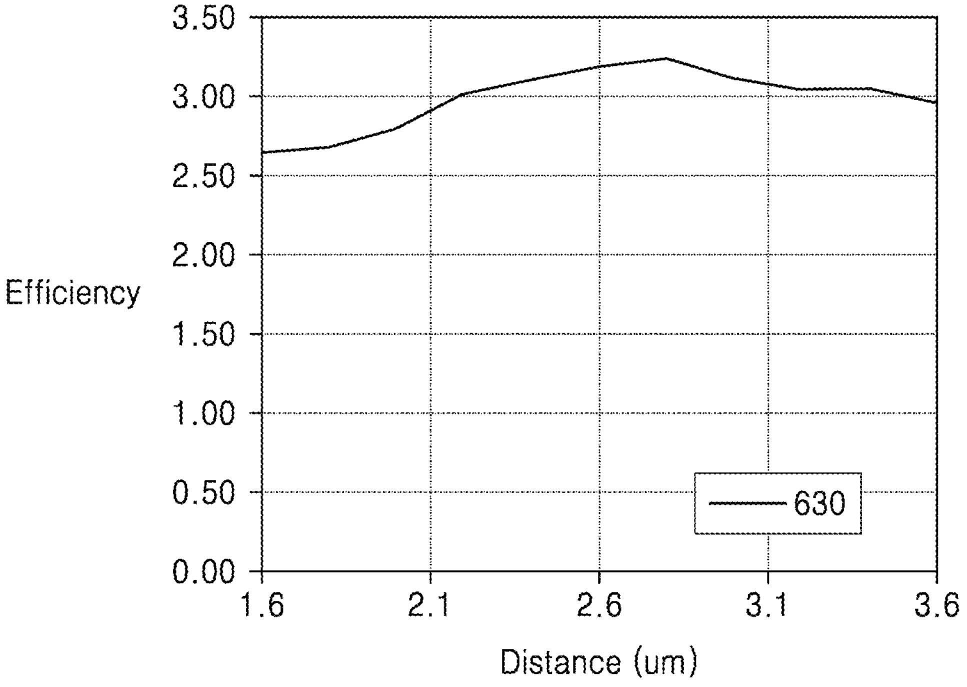
Figure 12D:
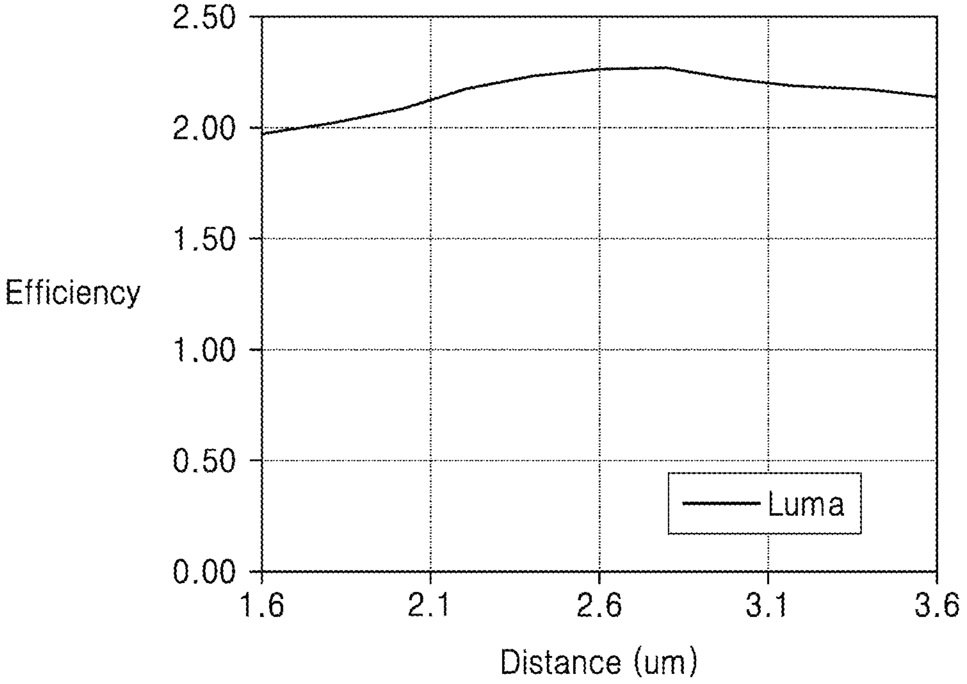
Figure 12E:
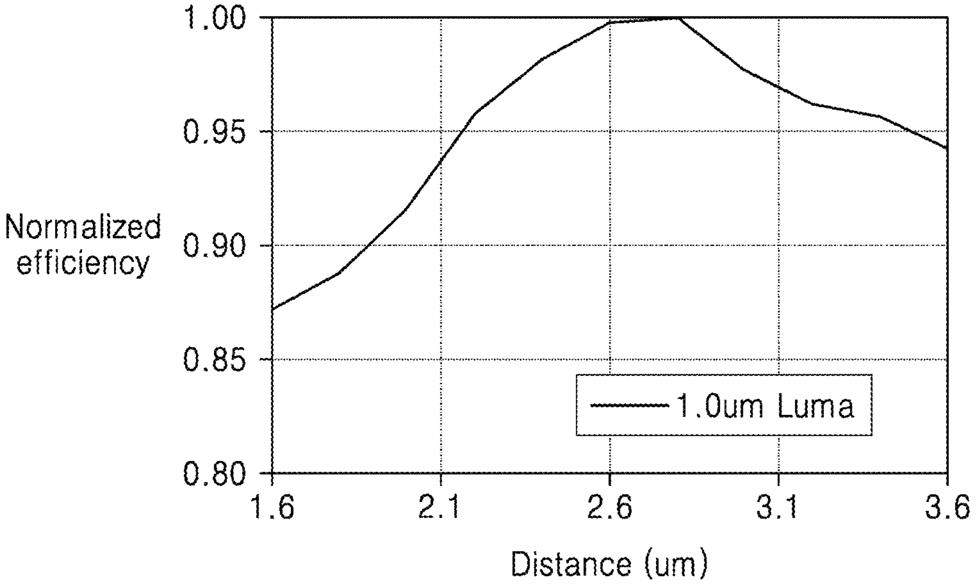

FIG. 10D is a graph illustrating a change of efficiency of a color separating lens array considering sensitivity characteristics of the human eyes with respect to visible light. For example, the human eyes typically has the highest sensitivity to green light and the lowest sensitivity to blue light. As such, according to an example embodiment, the lowest weight may be given to the graph of FIG. 10A and the highest weight may be given to FIG. 10B. Also, according to an example embodiment, a weight higher than the blue light to the graph of FIG. 100. Thus, the graph of FIG. 10D may be obtained by giving the lowest weight to the graph of FIG. 10A, giving a weight higher than the blue light to the graph of FIG. 100 and giving the highest weight to FIG. 10B and averaging the summed values. FIG. 10E is a graph showing the result of normalizing the graph of FIG. 10D.

Referring to the graphs of FIGS. 10D and 10E, when a pitch of each of the photosensitive cells 111, 112, 113 and 114 is 0.7 μm, the efficiency of the color separating lens array 130 with respect to the entire visible light considering sensitivity characteristics of the human eyes may be highest at a distance of about 1.2 μm. Also, the efficiency of the color separating lens array 130 may be about 80% of the maximum efficiency at a distance of about 0.5 μm and about 95% of the maximum efficiency at a distance of about 1.9 μm.

FIGS. 11A through 11E are graphs illustrating a change of efficiency of the color separating lens array 130 according to a distance between the color separating lens array 130 and the sensor substrate 110 when a pitch of each of the photosensitive cells 111, 112, 113, and 114 is 0.8 μm. Referring to FIGS. 11A through 11E, when the pitch of each of the photosensitive cells 111, 112, 113 and 114 is 0.8 μm, the efficiency of the color separating lens array 130 with respect to the entire visible light considering sensitivity characteristics of the human eyes is highest at a distance of about 1.64 μm. Also, the efficiency of the color separating lens array 130 may be about 85% of the maximum efficiency at a distance of about 0.8 μm and about 93% of the maximum efficiency at a distance of about 2.5 μm.

FIGS. 12A through 12E are graphs illustrating a change of efficiency of the color separating lens array 130 according to a distance between the color separating lens array 130 and the sensor substrate 110 when a pitch of each of the photosensitive cells 111, 112, 113, and 114 is 1.0 μm. Referring to FIGS. 12A through 12E, when the pitch of each of the photosensitive cells 111, 112, 113 and 114 is 1.0 μm, the efficiency of the color separating lens array 130 with respect to the entire visible light considering sensitivity characteristics of the human eyes is highest at a distance of about 2.6 μm. Also, the efficiency of the color separating lens array 130 may be about 87% of the maximum efficiency at a distance of about 1.6 μm and about 94% of the maximum efficiency at a distance of about 3.6 μm.

As a result, even when the actual thickness h of the spacer layer 120 is greater or less than the theoretical thickness $h_t$ of the spacer layer 120 by the pitch p of each of the photosensitive cells 111, 112, 113 and 114, the color separating lens array 130 may have the high efficiency of about 80%, 90%, or about 95% of the maximum efficiency. Considering the above-described results, the actual thickness h of the spacer layer 120 may be selected within a range of $h_t-p \leq h \leq h_t+p$.

Since the above-described color separating lens array 130 may branch incident light according to wavelengths without absorbing or blocking the incident light and may condense the branched light onto a specific region, the light usage efficiency of the image sensor may be enhanced. Also, since the color separating lens array 130 has enhanced color separating performance, the image sensor that employs the color separating lens array 130 may have excellent color purity. Also, since the image sensor that employs the color separating lens array 130 may maintain the Bayer pattern method that is generally adopted in the image sensor, the same image processing algorithm as an existing pixel structure may be utilized. Furthermore, since the color separating lens array 130 serves as a lens for condensing incident light, the image sensor that employs the color separating lens array 130 does not require a separate micro lens for condensing light onto each pixel.

Figure 13:
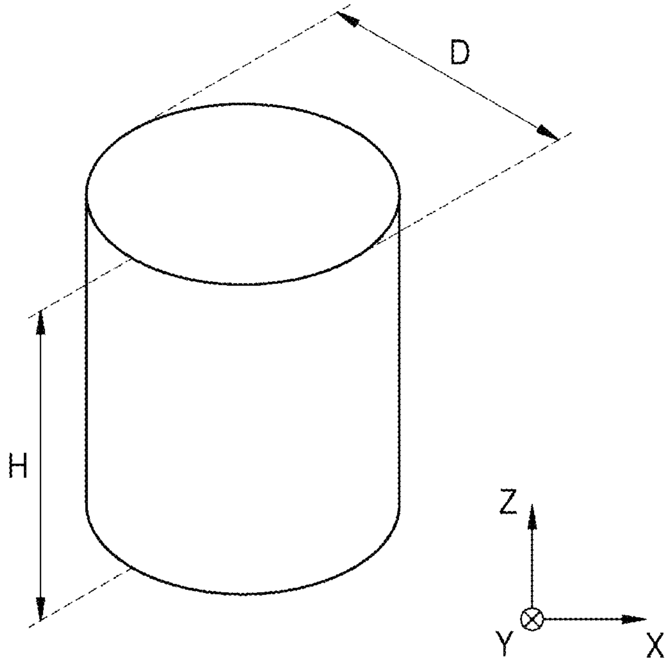
FIG. 13 is a perspective view showing an exemplary shape of nanoposts that may be adopted in a color separating lens array according to an example embodiment.

FIG. 13 is a perspective view showing an exemplary shape of nanoposts that may be provided in a color separating lens array according to an example embodiment. Referring to FIG. 13, the nanoposts may have a cylindrical shape with a diameter D and a height H. The diameter D and/or the height H may have a value of a sub-wavelength, and the diameter D may differ according to a location where the nanoposts are arranged.

In addition, the nanoposts may have a shape of a pillar with various cross-sectional shapes. FIGS. 14A through 14H are plan views showing an exemplary shape of nanoposts that may be provided in the color separating lens array 130 of the image sensor.

Figure 14A:
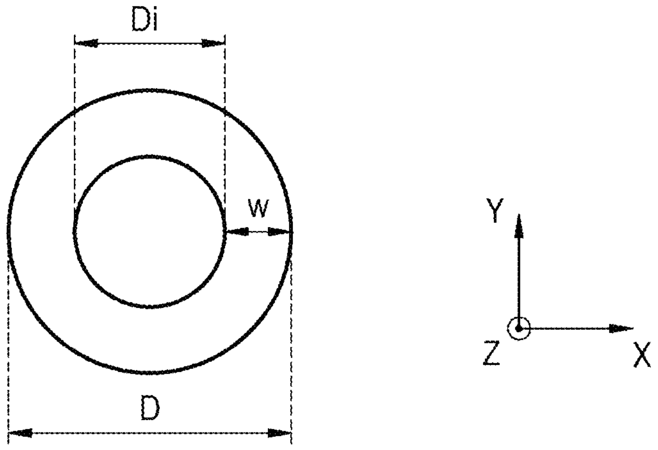
FIGS. 14A through 14H are plan views showing exemplary shapes of nanoposts that may be employed in a color separating lens array of an image sensor according to example embodiments.
Figure 14B:
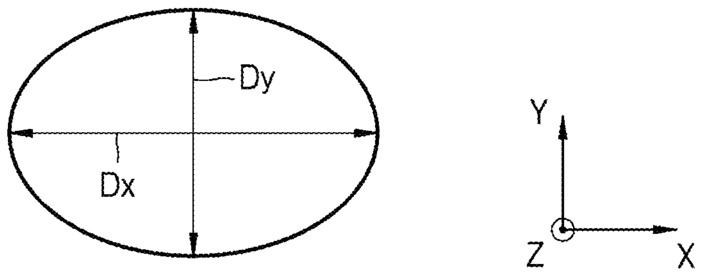

The cross-sectional shape of the nanoposts may be a circular ring shape with an outer diameter D and an inner diameter Di, as shown in FIG. 14A. The width w of the ring may have a value of a sub-wavelength. The cross-sectional shape of the nanoposts may be an oval shape with long-axis and short-axis lengths Dx and Dy that are different from each other in the first direction (X-direction) and the second direction (Y-direction), as shown in FIG. 14B. This shape may be provided in the first region 131 and the fourth region 134 that correspond to the green pixel, as mentioned when describing the embodiment of FIG. 5B.

Figure 14C:
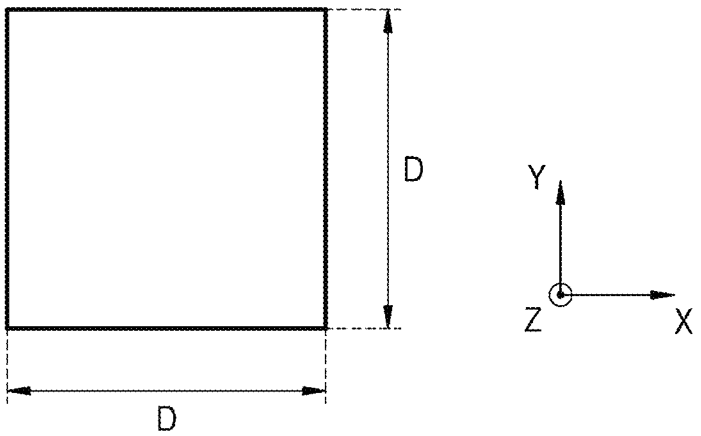
Figure 14D:
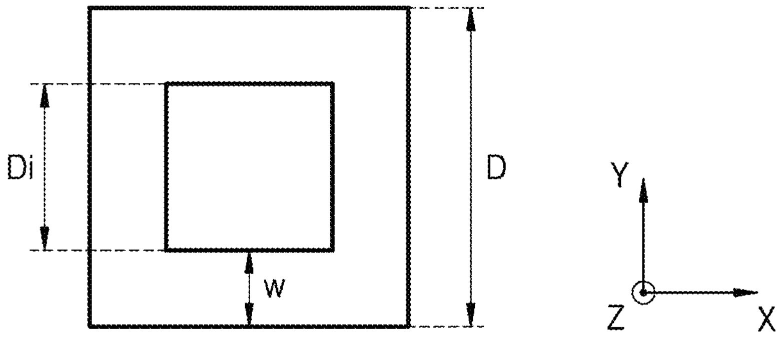
Figure 14E:
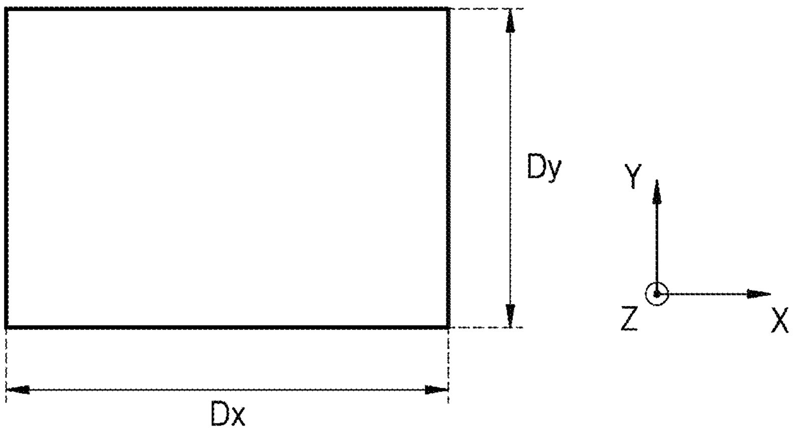
Figure 14F:
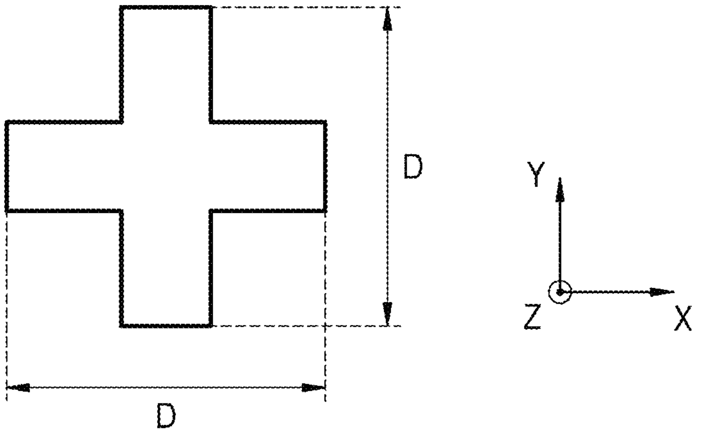
Figure 14G:
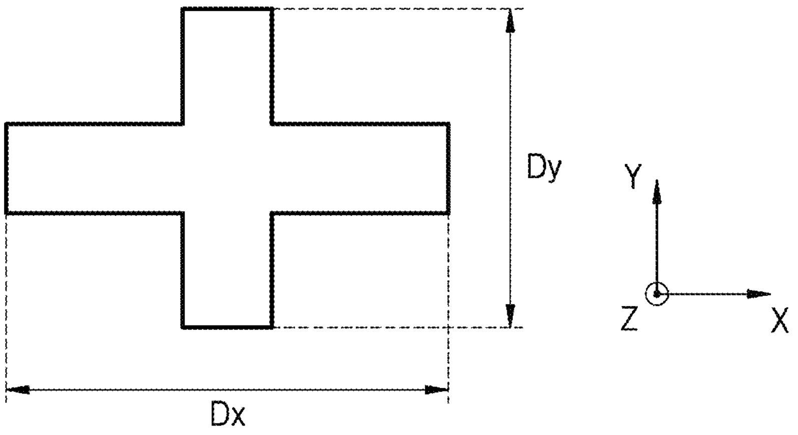

Additionally, the cross-sectional shape of the nanoposts may be a square shape, a square ring shape, or a cross shape, as shown in FIGS. 14C, 14D, and 14F, or a rectangular shape or cross shape in which lengths Dx and Dy are different from each other in the first direction (X-direction) and the second direction (Y-direction), as shown in FIGS. 14E and 14G. This rectangular or cross shape may be provided in the first region 131 and the fourth region 134 that correspond to the green pixel, as mentioned when describing the embodiment of FIG. 5B.

Figure 14H:
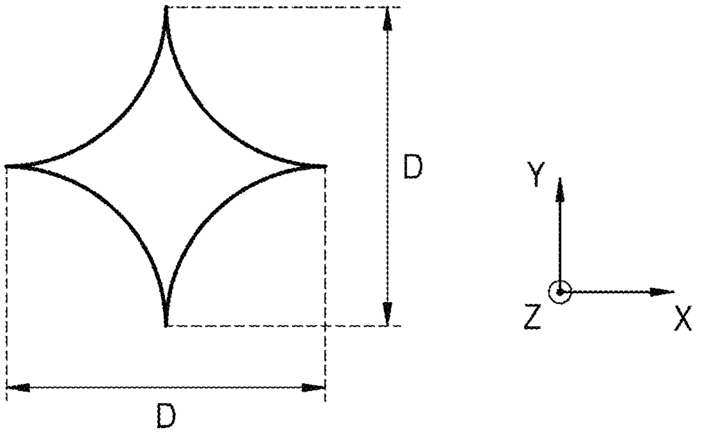

In another example, the cross-sectional shape of the nanoposts may have a shape with a plurality of concave arcs, as shown in FIG. 14H.

Figure 15:
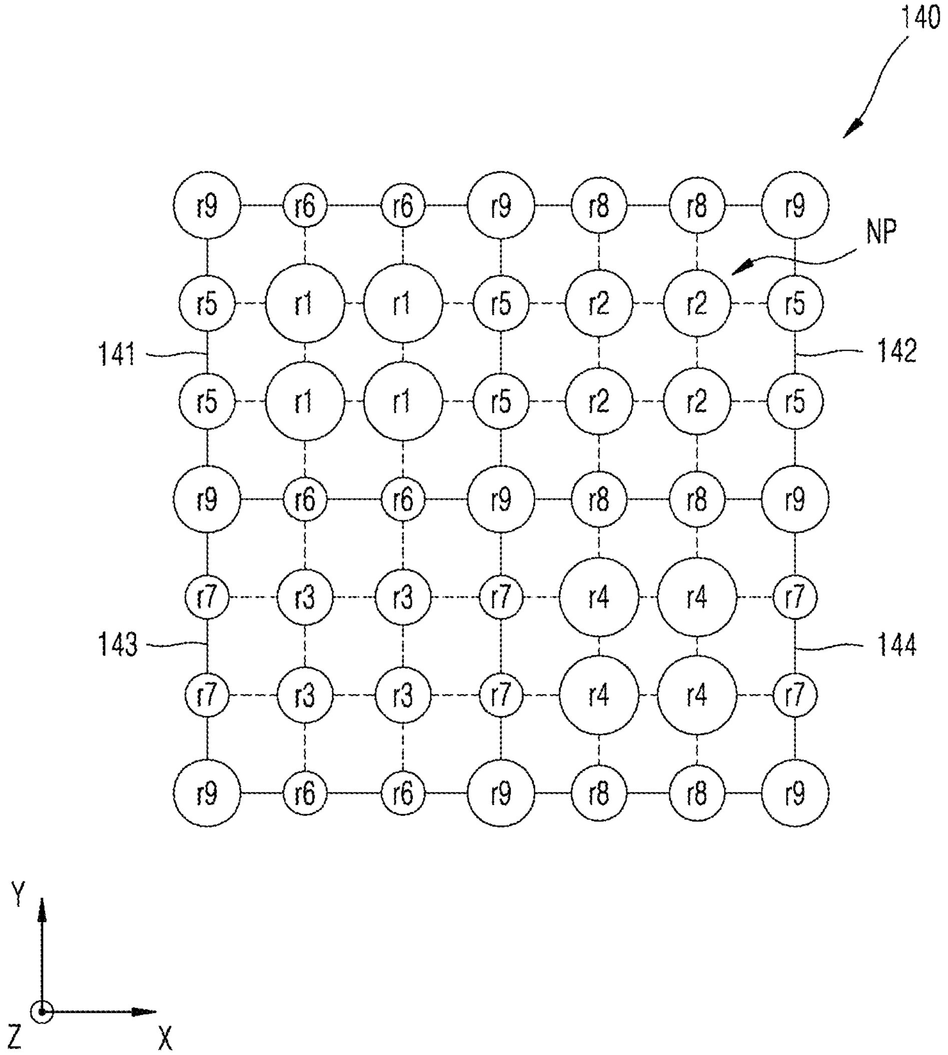
FIG. 15 is a plan view illustrating the arrangement shape of nanoposts that constitute a color separating lens array according to another example embodiment.

FIG. 15 is a plan view illustrating the arrangement shape of nanoposts that constitute a color separating lens array according to another example embodiment.

According to an example embodiment, a color separating lens array 140 may have a shape corresponding to the pixel arrangement of the Bayer pattern illustrated in FIG. 2A and may include a first region 141 corresponding to the green pixel G, a second region 142 corresponding to the blue pixel B, a third region 143 corresponding to the red pixel R, and a fourth region 144 corresponding to the green pixel G. Although not shown, this unit pattern array may be repeatedly arranged in the first direction (X-direction) and the second direction (Y-direction). Each region may be divided into a plurality of sub-regions, and nanoposts NP may be arranged at a crossing point of a boundary between the plurality of sub-regions. FIG. 15 illustrates an example in which the number of sub-regions is 9, and nanoposts NP are arranged on lattice points at which each region is divided into 9 sub-regions. Thus, the nanoposts NP are not arranged in the center of each of the regions 141, 142, 143, and 144, and four nanoposts NP with the same size constitute the center part. Nanoposts NP located on the periphery thereof are arranged on a boundary line with other regions. The nanoposts NP may be indicated by r1 to r9 according to detailed locations within the unit pattern array.

Referring to FIG. 15, nanoposts r1 arranged in the center of the first region 141 corresponding to the green pixel may have a cross-sectional area greater than nanoposts r5, r6, and r9 arranged around the first region 141, and nanoposts r4 arranged in the center of the fourth region 144 corresponding to the green pixel may also have a cross-sectional area greater than nanoposts r7, r8, and r9 arranged around the fourth region 144. The cross-sectional size of the nanoposts r1 and r4 arranged in the centers of the first region 141 and the fourth region 144 that correspond to the green pixel, may be greater than the cross-sectional size of the nanoposts r2 arranged in the center of the second region 142 corresponding to the blue pixel and the nanoposts r3 arranged in the center of the third region 143 corresponding to the red pixel. The cross-sectional area of the nanoposts r2 arranged in the center of the second region 142 corresponding to the blue pixel may be greater than the cross-sectional area of the nanoposts r3 arranged in the center of the third region 143 corresponding to the red pixel.

The nanoposts NP in the second region 142 and the third region 143 may be symmetrically arranged in the first direction (X-direction) and the second direction (Y-direction), and the nanoposts NP in the first region 141 and the fourth region 144 may be asymmetrically arranged in the first direction (X-direction) and the second direction (Y-direction). In other words, the nanoposts NP in the second region 142 and the third region 143 each corresponding to the blue pixel and the red pixel may have the same distribution rule in the first direction (X-direction) and the second direction (Y-direction), and the nanoposts NP in the first region 141 and the fourth region corresponding to the green pixel may have different distribution rules in the first direction (X-direction) and the second direction (Y-direction).

Among the nanoposts NP, the cross-sectional area of the nanoposts r5 located at a boundary between the first region 141 and the second region 142 adjacent to the first region 141 in the first direction (X-direction) and the cross-sectional area of the nanoposts r6 located at a boundary between the first region 141 and the third region 143 adjacent to the first region 141 in the second direction (Y-direction) may be different from each other. Also, the cross-sectional area of the nanoposts r7 located at a boundary between the fourth region 144 and the third region 143 adjacent to the first region 144 in the first direction (X-direction) and the cross-sectional area of the nanoposts r8 located at a boundary between the fourth region 144 and the second region 142 adjacent to the fourth region 144 in the second direction (Y-direction) may be different from each other.

On the other hand, the cross-sectional area of the nanoposts r5 located at a boundary between the first region 141 and the second region 142 adjacent to the first region 141 in the first direction (X-direction) and the cross-sectional area of the nanoposts r8 located at a boundary between the fourth region 144 and the second region 142 adjacent to the fourth region 144 in the second direction (Y-direction) may be the same, and the cross-sectional area of the nanoposts r6 located at a boundary between the first region 141 and the third region 143 adjacent to the first region 141 in the second direction (Y-direction) and the cross-sectional area of the nanoposts r7 located at a boundary between the fourth region 144 and the third region 143 adjacent to the fourth region 144 in the first direction (X-direction) may be the same.

Also, the nanoposts r9 arranged at a location where four edges of each of the first region 141, the second region 142, the third region 143 and the fourth region 144, i.e., four regions cross one another, may have the same cross-sectional area.

In this way, the nanoposts NP may be arranged in the form of 4-fold symmetry in the second region 142 and the third region 143 each corresponding to the blue pixel and the red pixel, and the nanoposts NP may be arranged in the form of 2-fold symmetry in the first and fourth regions 141 and 144 corresponding to the green pixel, and the first region 141 and the fourth region 144 may be rotated by 90 degrees with respect to each other. These shapes are shown in embodiments of FIGS. 16 and 17 to be described later.

Figure 16:
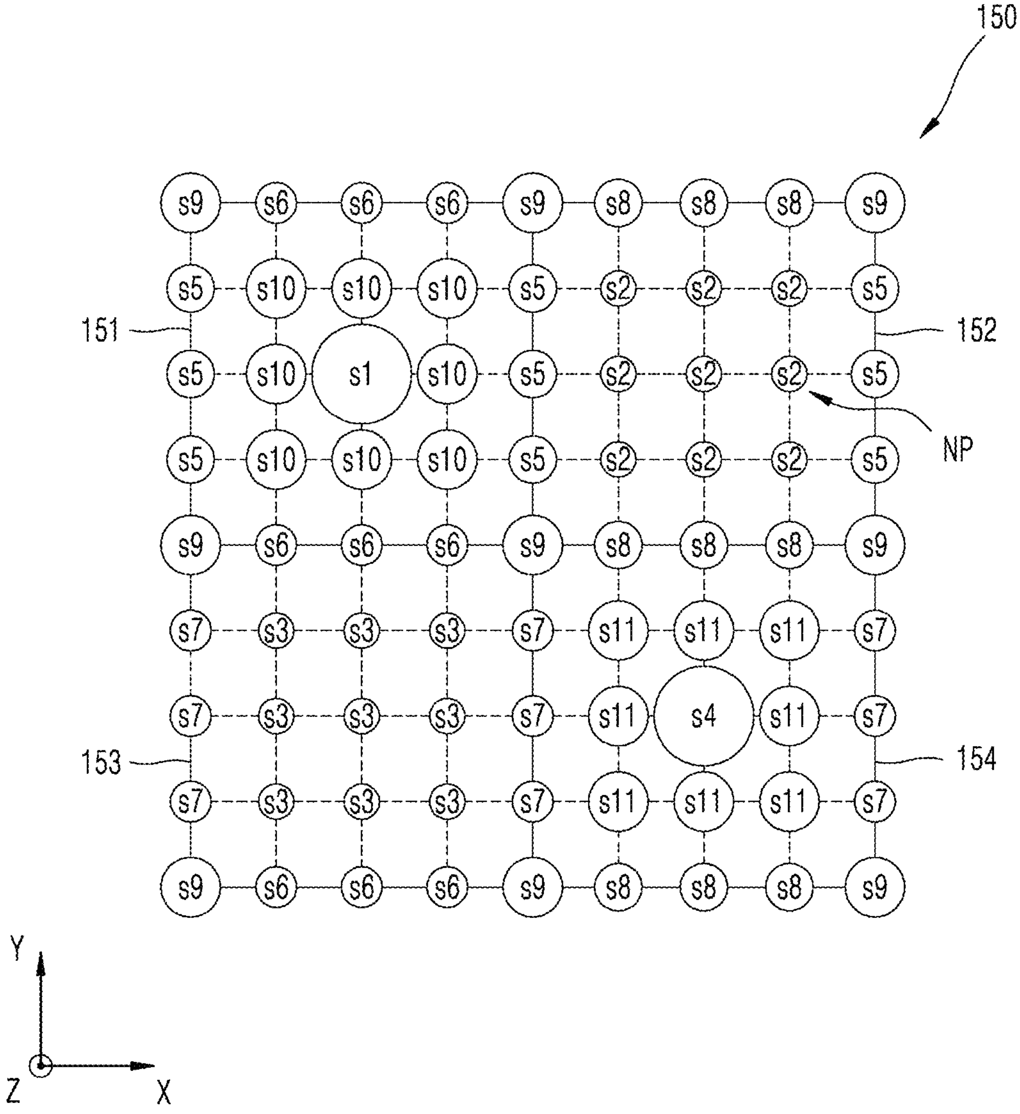
FIG. 16 is a plan view illustrating the arrangement shape of nanoposts that constitute a color separating lens array according to another example embodiment.

FIG. 16 is a plan view illustrating the arrangement shape of nanoposts that constitute a color separating lens array according to another example embodiment.

According to an example embodiment, a color separating lens array 150 may have a shape corresponding to the pixel arrangement of the Bayer pattern and may include a first region 151 corresponding to the green pixel, a second region 152 corresponding to the blue pixel, a third region 153 corresponding to the red pixel, and a fourth region 154 corresponding to the green pixel. Each region may be divided into a plurality of sub-regions, and nanoposts NP may be arranged at a crossing point of a boundary between the plurality of sub-regions. Since FIG. 16 illustrates an example in which the number of sub-regions is 16, FIG. 16 is different from the nanopost arrangement of FIG. 15. The nanoposts NP are arranged on lattice points at which each region is divided into 16 sub-regions, so that the nanoposts NP may be arranged in the center of each of the regions 151, 152, 153, and 154. The nanoposts NP are indicated by s1 to s11 according to detailed locations within a unit pattern array.

In the embodiment of FIG. 16, the nanoposts s1 located in the center of the first region 151 corresponding to the green pixel and nanoposts s4 located in the center of the fourth region 154 may have a cross-sectional area greater than the nanoposts NP arranged in the second region 152 corresponding to the blue pixel and in the third region 153 corresponding to the red pixel as well as the nanoposts NP located on the periphery thereof.

The nanoposts s1 having the largest cross-sectional area in the first region 151 may be arranged in the center, and the nanoposts s10, s5, and s6 having the cross-sectional areas gradually decreasing as they get closer to the periphery may be arranged. Even in the fourth region 154, the nanoposts s4 having the largest cross-sectional area may be arranged in the center, and nanoposts s11, s7, and s8 having the cross-sectional areas gradually decreasing as they get closer to the periphery may be arranged. Unlike this, in the second region 152, nine nanoposts s2 having the same cross-sectional area may be arranged in the center, and nanoposts s5 and s8 having larger cross-sectional areas than the nanoposts s2 may be arranged on the periphery thereof. Even in the third region 153, nine nanoposts s3 having the same cross-sectional area may be arranged in the center, and nanoposts s6 and s7 having larger cross-sectional areas may be arranged on the periphery thereof. In the second region 152 and the third region 153, the nanoposts NP located on the periphery thereof are arranged on a boundary line with other regions.

In the embodiment of FIG. 16, as in the embodiment of FIG. 15, the nanoposts NP in the second region 152 and the third region 153 may be symmetrically arranged in the first direction (X-direction) and the second direction (Y-direction), and the nanoposts NP in the first region 151 and the fourth region 154 may be asymmetrically arranged in the first direction (X-direction) and the second direction (Y-direction). Also, the nanoposts s9 arranged at a location where four edges of each of the first region 151, the second region 152, the third region 153, and the fourth region 154, i.e., four regions are adjacent to one another, may have the same cross-sectional area.

Figure 17:
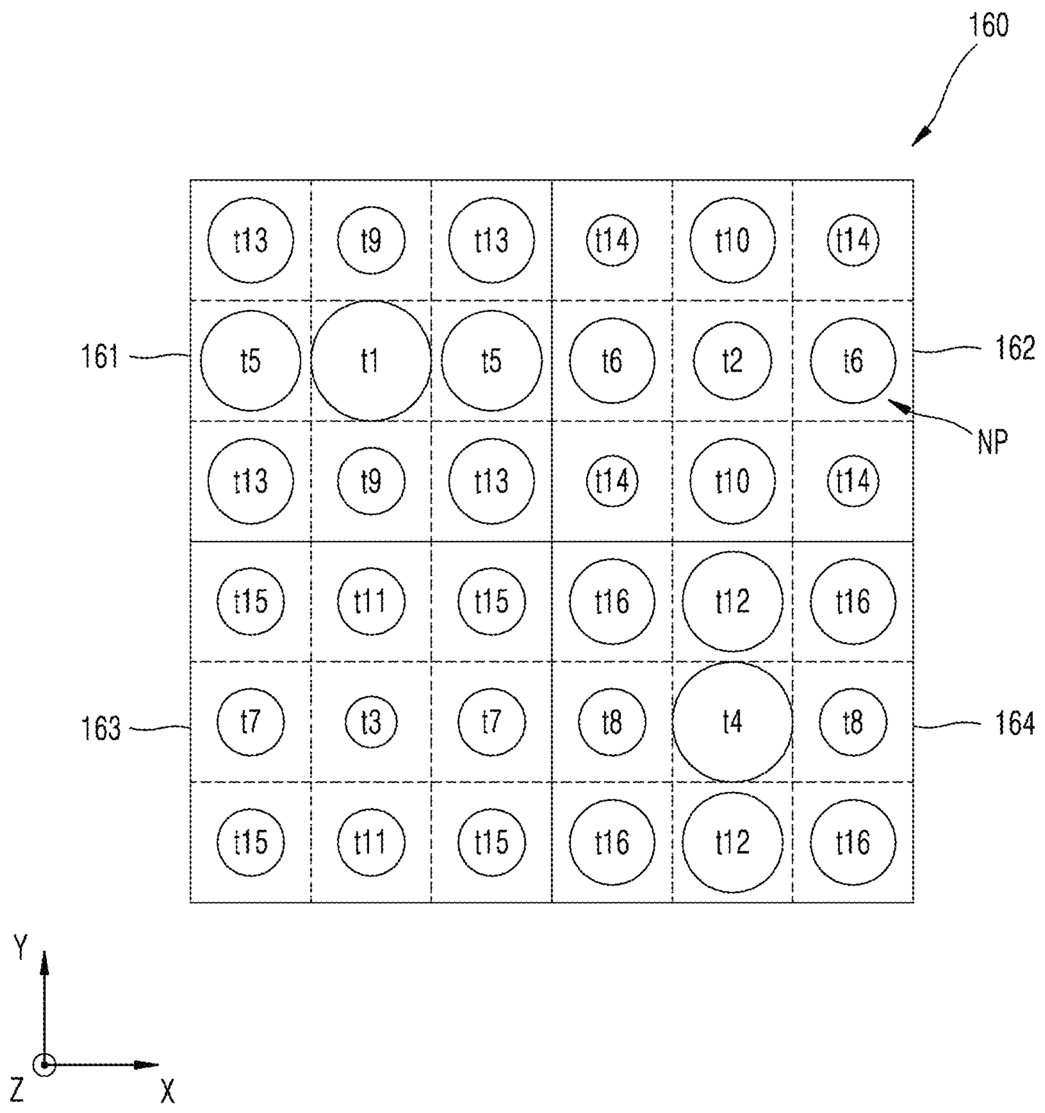
FIG. 17 is a plan view illustrating the arrangement shape of nanoposts that constitute a color separating lens array according to another example embodiment.

FIG. 17 is a plan view illustrating the arrangement shape of nanoposts that constitute a color separating lens array according to another example embodiment.

According to an example embodiment, color separating lens array 160 may have a shape corresponding to the pixel arrangement of the Bayer pattern and may include a first region 161 corresponding to the green pixel, a second region 162 corresponding to the blue pixel, a third region 163 corresponding to the red pixel, and a fourth region 164 corresponding to the green pixel. Each region may be divided into a plurality of sub-regions, and the nanoposts NP may be arranged within the plurality of sub-regions. In the color separating lens array 160, each region may be divided into nine sub-regions, as in FIG. 15, but there is a difference in that the nanoposts NP are arranged inside the sub-regions rather than a crossing point between the sub-regions. The nanoposts NP are indicated by t1 to t16 according to detailed locations within the unit pattern array.

According to the example embodiment of FIG. 17, nanoposts t1 located in the center of the first region 161 and nanoposts t4 located in the center of the fourth region 164 may have a cross-sectional area greater than the nanoposts NP arranged in the second region 162 and the third region 163 as well as the nanoposts NP located on the periphery of the first region 161 and the fourth region 164. The cross-sectional area of the nanoposts t2 arranged in the center of the second region 162 may be greater than the cross-sectional area of the nanoposts t3 arranged in the center of the third region 163. In the second region 162, the cross-sectional area of the nanoposts t6 and t10 located on the periphery thereof and spaced from the center in the first direction (X-direction) and the second direction (Y-direction) may be greater than the cross-sectional area of the nanoposts t2 located in the center. Unlike this, the cross-sectional area of the nanoposts t14 located on the periphery thereof and spaced from the center in a diagonal direction may be less than the cross-sectional area of the nanoposts t2 located in the center. In the third region 163, the cross-sectional area of the nanoposts t3 in the center may be smallest, and all of the nanoposts t7, t11, and t15 on the periphery thereof may have cross-sectional areas greater than the nanoposts t3 located in the center.

The nanoposts NP in the second region 162 and the third region 163 may be symmetrically arranged in the first direction (X-direction) and the second direction (Y-direction), and the nanoposts NP in the first region 161 and the fourth region 164 may be asymmetrically arranged in the first direction (X-direction) and the second direction (Y-direction). In other words, the nanoposts NP in the second region 162 and the third region 163 each corresponding to the blue pixel and the red pixel may represent the same distribution rule in the first direction (X-direction) and the second direction (Y-direction), and the nanoposts NP in the first region 161 and the fourth region 164 corresponding to the green pixel may represent different distribution rules in the first direction (X-direction) and the second direction (Y-direction).

In the first region 161, the nanoposts t1 in the center, the nanoposts t5 adjacent to the first region 161 in the first direction (X-direction), and the nanoposts t9 adjacent to the first region 161 in the second direction (Y-direction) may have different cross-sectional areas. Even in the fourth region 164, the nanoposts t4 in the center, the nanoposts t8 adjacent to the fourth region 164 in the first direction (X-direction), and the nanoposts t12 adjacent to the fourth region 165 in the second direction (Y-direction) may have different cross-sectional areas. In this case, the nanoposts t1 in the center of the first region 161 and the nanoposts t5 adjacent to the first region 161 in the first direction (X-direction) may have the same cross-sectional area as the nanoposts t4 in the center of the fourth region 164 and the nanoposts t12 adjacent to the fourth region 164 in the second direction (Y-direction), and the nanoposts t11 in the center of the first region 161 and the nanoposts t9 adjacent to the first region 161 in the second direction (Y-direction) may have the same cross-sectional area as the nanoposts t4 in the center of the fourth region 164 and the nanoposts t8 adjacent to the fourth region 164 in the first direction (X-direction). The nanoposts t13 adjacent to four edges of the first region 161 and the nanoposts t16 adjacent to four edges of the fourth region 164 may have the same cross-sectional area. In this way, the first region 161 and the fourth region 164 may be rotated by 90 degrees with respect to each other.

The nanoposts in the center of the second region 162, the nanoposts t6 adjacent to the second region 162 in the first direction (X-direction), and the nanoposts t10 adjacent to the second region 162 in the second direction (Y-direction) may have the same cross-sectional area. The nanoposts t14 adjacent to four edges of the second region 162 may also have the same cross-sectional area.

Even in the third region 163, the nanoposts t3 in the center, the nanoposts t7 adjacent to the third region 163 in the first direction (X-direction), and the nanoposts t11 adjacent to the third region 163 in the second direction (Y-direction) may have the same cross-sectional area. The nanoposts t15 adjacent to four edges of the third region 163 may have the same cross-sectional area.

Figure 18:
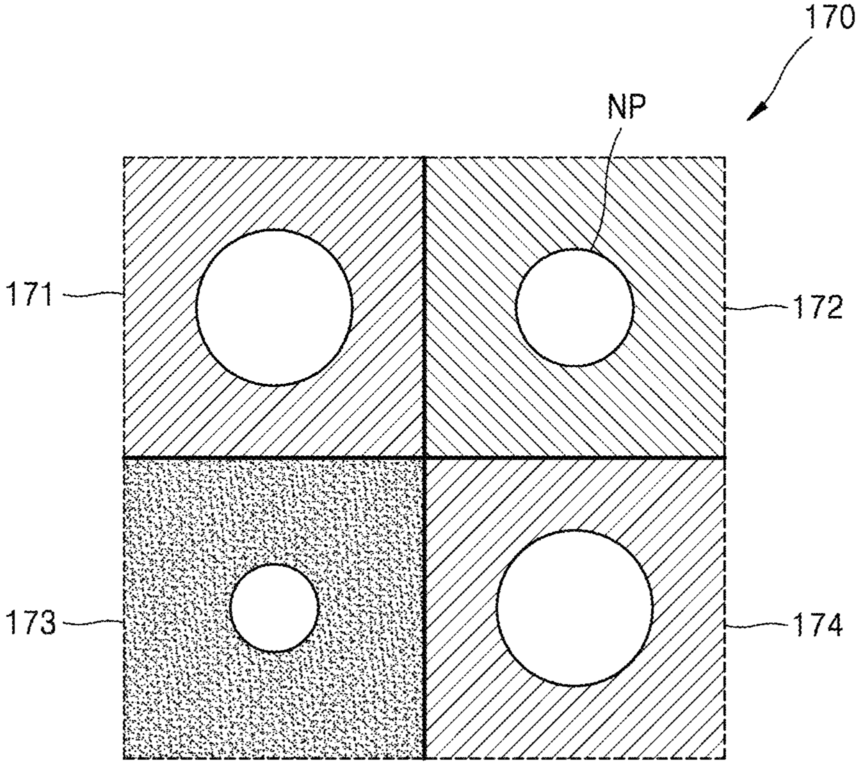
FIG. 18 is a plan view illustrating the arrangement shape of a plurality of nanoposts that constitute a color separating lens array according to another example embodiment.

FIG. 18 is a plan view illustrating the arrangement shape of a plurality of nanoposts that constitute a color separating lens array according to another example embodiment.

According to an example embodiment, a color separating lens array 170 of FIG. 18 may illustrate the simplest structure. One nanopost NP may be arranged in each of a first region 171 corresponding to the green pixel, a second region 172 corresponding to the blue pixel, a third region 173 corresponding to the red pixel, and a fourth region 174 corresponding to the green pixel. The cross-sectional area of the nanoposts NP in the first region 171 and the fourth region 174 may be the largest, the cross-sectional area of the nanoposts NP in the second region 172 may be less than the cross-sectional area of the nanoposts NP in the first region 171, and the cross-sectional area of the nanoposts NP in the third region 173 may be the smallest.

Figure 19:
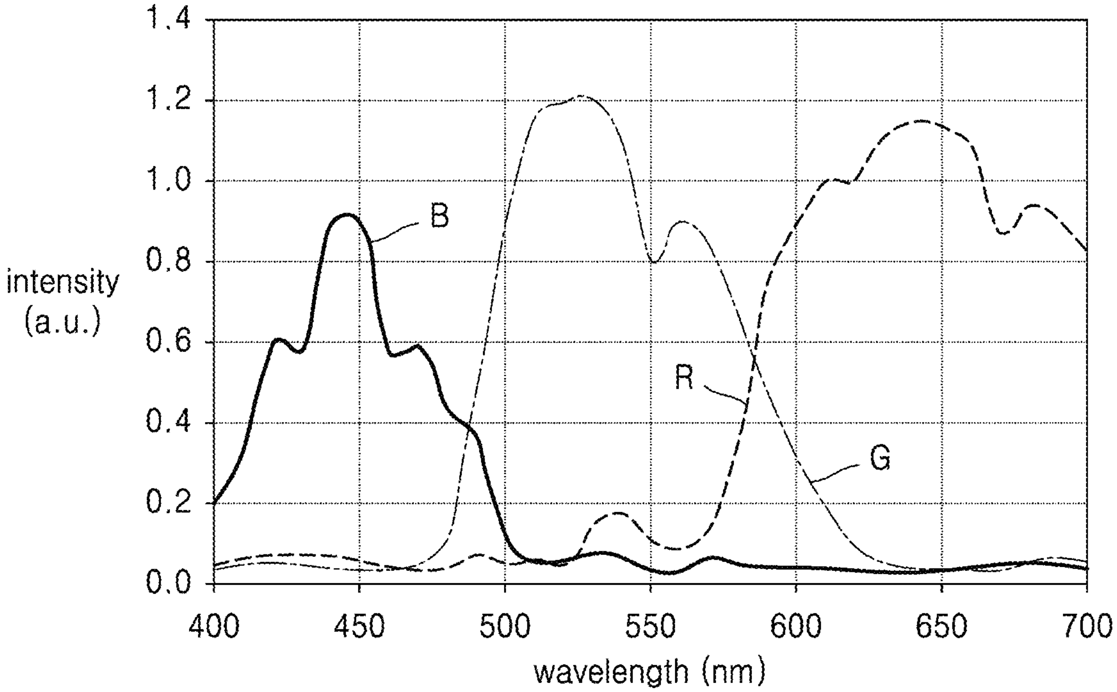
FIG. 19 is a graph illustrating a spectrum distribution of light incident on each of a red pixel, a green pixel, and a blue pixel of an image sensor including the color separating lens array of FIG. 18.

FIG. 19 is a graph illustrating a spectrum distribution of light incident on each of a red pixel R, a green pixel G, and a blue pixel B of an image sensor including the color separating lens array of FIG. 18.

Figure 20A:
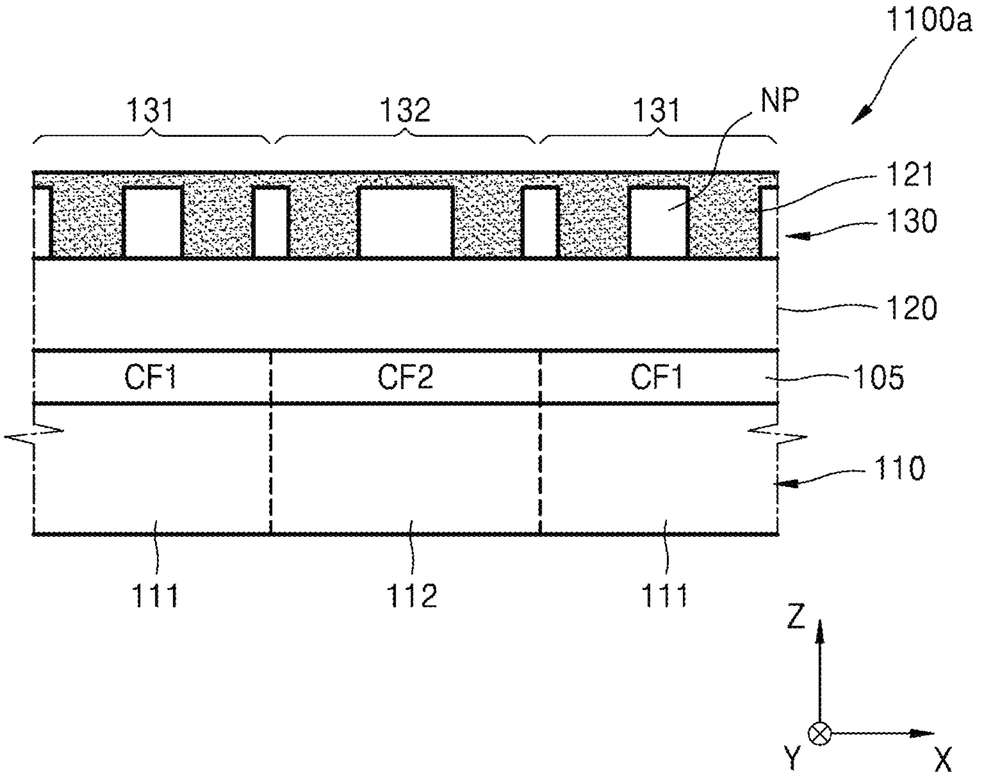
FIGS. 20A and 20B are cross-sectional views of a schematic structure of a pixel array according to another example embodiment.
Figure 20B:
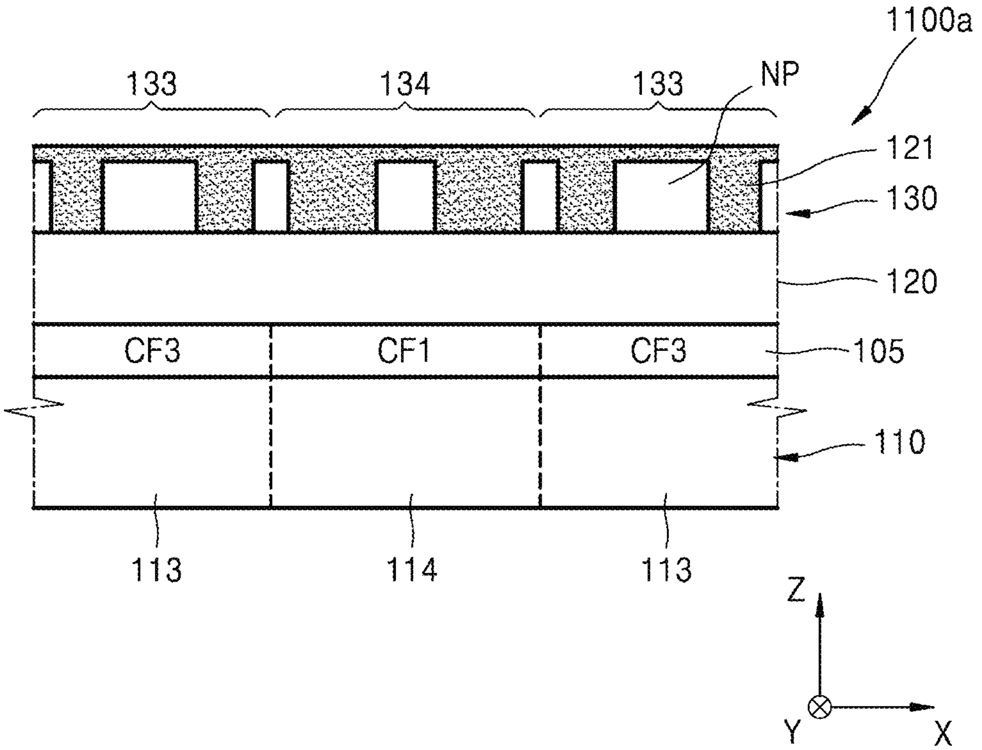

FIGS. 20A and 20B are cross-sectional views of a schematic structure of a pixel array according to another example embodiment. A pixel array 1100*a* is different from the above-described example embodiments of FIGS. 4A and 4B in that a color filter 105 is further provided between the sensor substrate 110 and the color separating lens array 130. The color filter 105 may be arranged between the sensor substrate 110 and the spacer layer 120. Specifically, FIG. 20A is cross-sectional view of the schematic structure of a first row of the pixel array and FIG. 20B is cross-sectional view of the schematic structure of a second row of the pixel array.

The pixel array 1100*a* may further include a transparent dielectric layer 121 that protects the color separating lens array 130. The dielectric layer 121 may be arranged to cover a space between adjacent nanoposts NP and the top surface of the nanoposts NP. The dielectric layer 121 may be made of a material having a refractive index lower than the refractive index of the nanoposts NP, for example, the same material as the spacer layer 120.

The color filter 105 may include a filter region having a shape corresponding to the pixel arrangement of the Bayer pattern. As shown in FIG. 20A, a green filter region CF1 and a blue filter region CF2 may be alternately arranged, and as shown in FIG. 20B, in the next row spaced in the Y-direction, a red filter region CF3 and the green filter region CF1 may be alternately arranged. Since the color separating lens array 130 branches and condenses light having different wavelengths into and onto a plurality of photosensitive cells 111, 112, 113 and 114, the configuration of the color filter 105 is not an essential component. However, in this way, the color filter 105 may be additionally provided so that color purity may be supplemented, and since the color-separated light to a considerable extent enters the color filter 105, light loss is not large.

Figure 21:
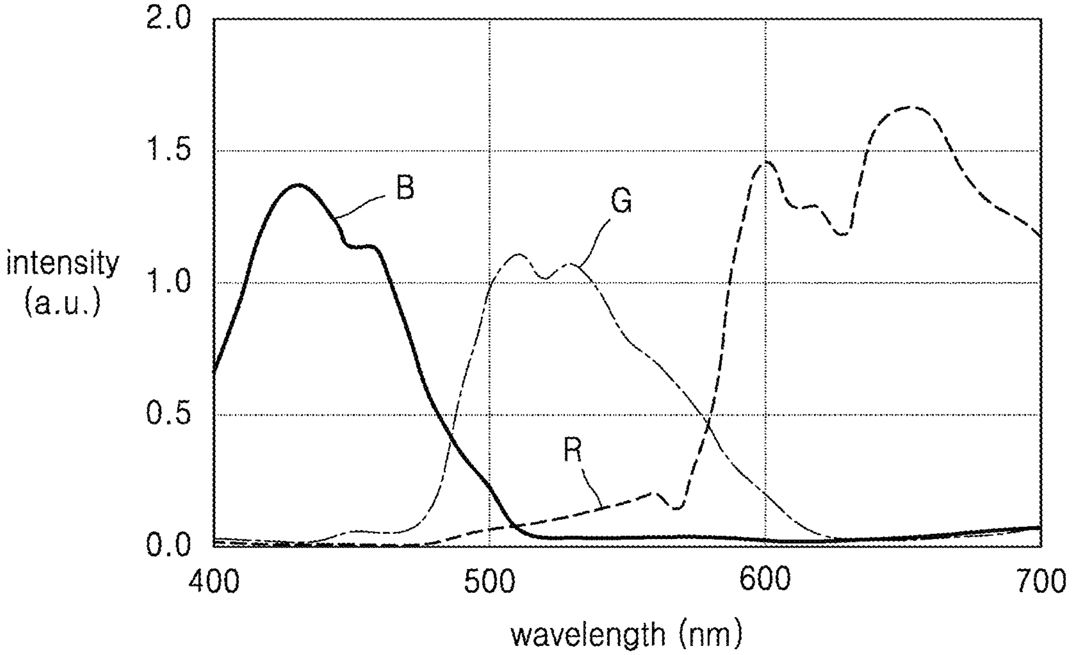
FIGS. 21 and 22 are graphs illustrating a spectrum distribution of light incident on a red pixel, a green pixel, and a blue pixel of an image sensor and show a spectrum distribution of an embodiment in which a color filer is provided, and an embodiment in which a color filer is not provided, respectively.
Figure 22:
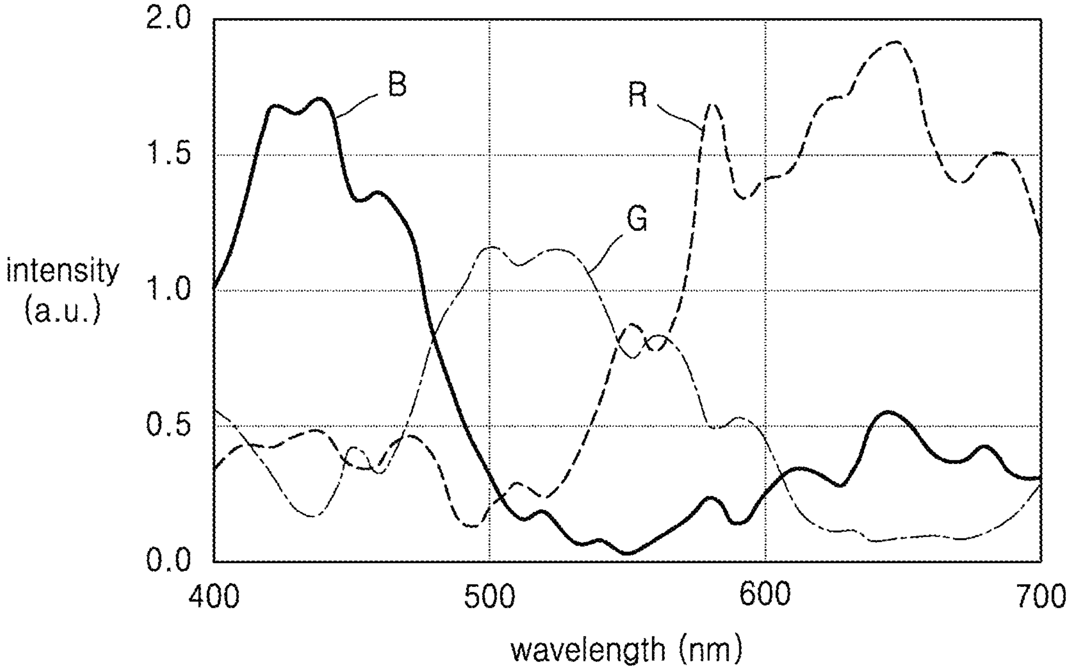

FIG. 21 is a graph illustrating a spectrum distribution of light incident on a red pixel R, a green pixel G, and a blue pixel B of an image sensor of an embodiment in which a color filer is provided, and FIG. 22 is a graph illustrating a spectrum distribution of light incident on a red pixel R, a green pixel G, and a blue pixel B of an image sensor of an embodiment in which a color filer is not provided.

The graph of FIG. 21 is spectrum of an image sensor including the color filter shown in FIGS. 20A and 20B, and the graph of FIG. 22 is spectrum of an image sensor having no color filter shown in FIGS. 4A and 4B. FIGS. 21 and 22 show the result of simulation of an image having a pixel width of about 0.7 μm, and when a color filter is provided, the total amount of light tends to decrease, but both show good color separating performance.

Figure 23:
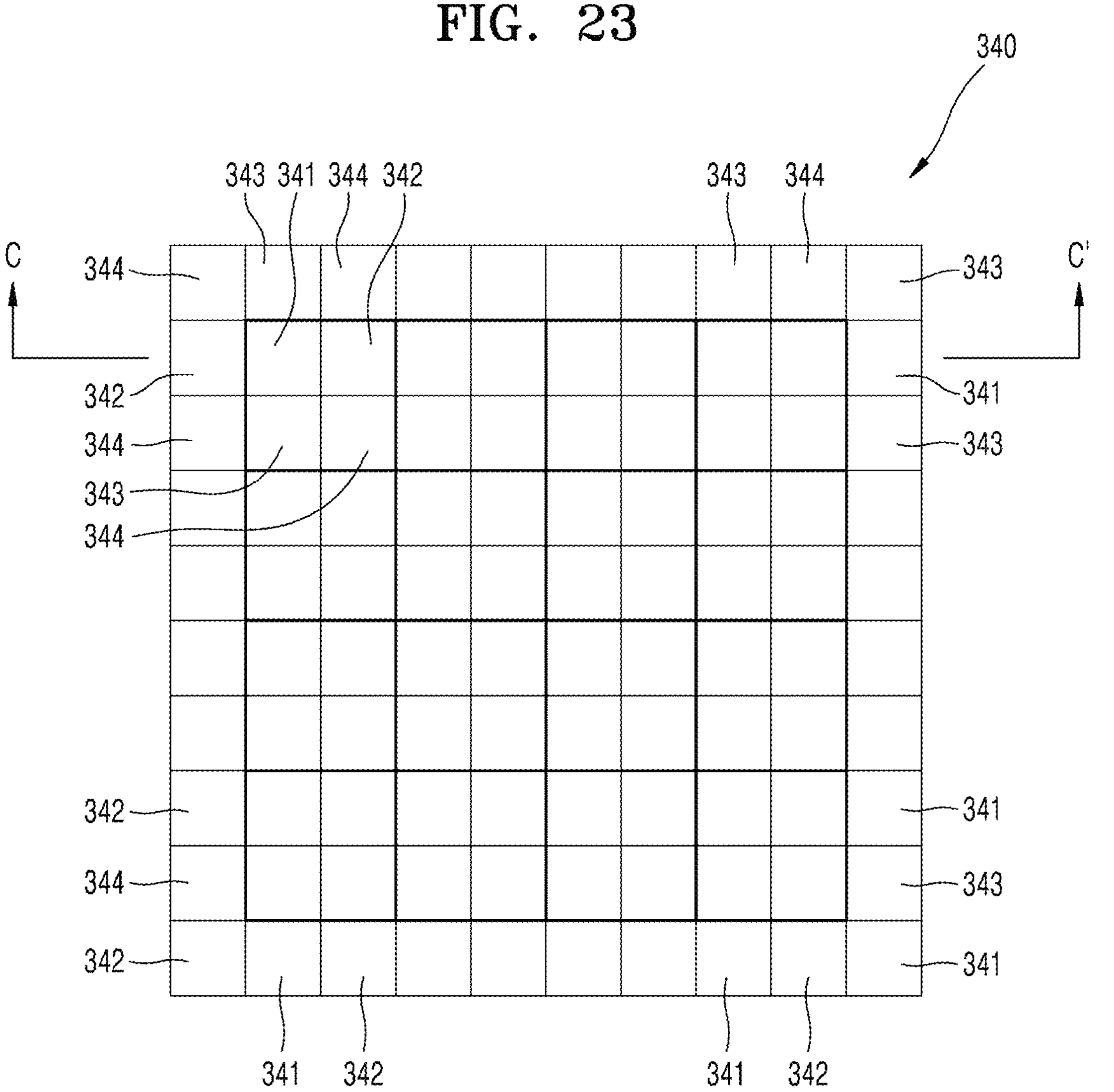
FIG. 23 is a plan view illustrating a color separating lens array according to another example embodiment.

FIG. 23 is a plan view illustrating a color separating lens array according to another example embodiment. Referring to FIG. 23, a color separating lens array 340 may include a plurality of unit pattern arrays indicated by thick lines. Each unit pattern array may be arranged in a two-dimensional form of 2×2 including a first region 341, a second region 342, a third region 343, and a fourth region 344. When describing the entire configuration of the color separating lens array 340, the first region 341 and the second region 342 may be alternately arranged in a horizontal direction in one row, and the third region 343 and the fourth region 344 may be alternately arranged in the horizontal direction in another row. Also, the first region 341 and the third region 343 may be alternately arranged in a vertical direction in one column, and a plurality of second regions 342 and a plurality of fourth regions 344 may be alternately arranged in the vertical direction in another column.

Also, the color separating lens array 340 may further include a plurality of first through fourth regions 341, 342, 343, and 344 that do not belong to any unit pattern array. The first through fourth regions 341, 342, 343, and 344 that do not belong to any unit pattern array may be arranged along an edge of the color separating lens array 340. In other words, a plurality of second regions 342 and a plurality of fourth regions 344 that constitute one column may be additionally arranged on the left edge of the color separating lens array 340, and a plurality of first regions 341 and a plurality of third regions 343 that constitute one column may be additionally arranged on the right edge of the color separating lens array 340, and a plurality of third regions 343 and a plurality of fourth regions 344 that constitute one row may be additionally arranged on the upper edge of the color separating lens array 340, and a plurality of first regions 341 and a plurality of second regions 342 that constitute one row may be additionally arranged on the lower edge of the color separating lens array 340.

Figure 24:
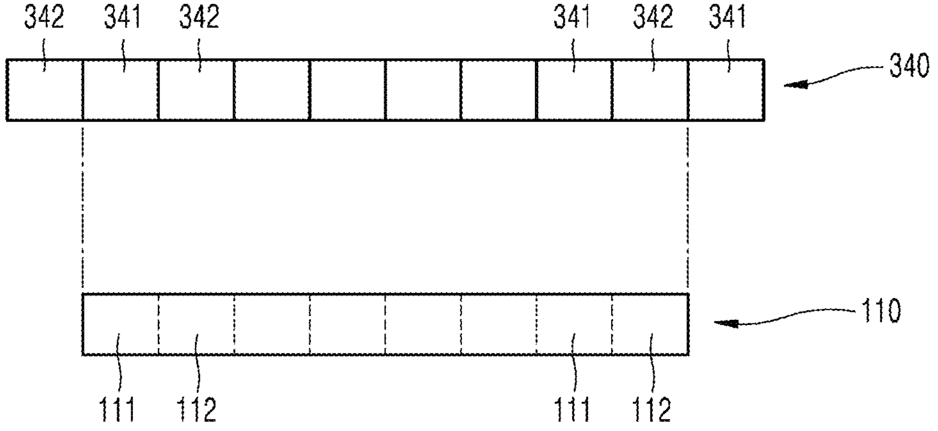
FIG. 24 is a cross-sectional view showing a schematic structure of a pixel array of an image sensor including the color separating lens array shown in FIG. 23.

FIG. 24 is a vertical cross-section of the color separating lens array 340 shown in FIG. 23 taken along line C-C'. Referring to FIG. 24, the color separating lens array 340 may include a plurality of first regions 341 and a plurality of second regions 342, which protrude in the horizontal direction with respect to the edge of the sensor substrate 110 and do not face any photosensitive cell of the sensor substrate 110 in the vertical direction. Although not all shown in FIG. 24, in FIG. 23, all of a plurality of first through fourth regions 341, 342, 343, and 344 that do not belong to any unit pattern array may protrude in the horizontal direction with respect to the edge of the sensor substrate 100 and may not face any photosensitive cell in the vertical direction.

As described in FIGS. 6A through 6D, FIGS. 7A through 7D, and FIGS. 8A through 8D, a photosensitive cell receives light from not only a region of the color separating lens array 340 corresponding to the vertical, but also a plurality of other regions surrounding the region. Thus, when the first through fourth regions 341, 342, 343 and 344 added along the edge of the color separating lens array 340 are absent, the amount of light incident on photosensitive cells arranged along the edge of the sensor substrate 110 may be reduced, and color purity may also be lowered. The first through fourth regions 341, 342, 343, and 344 may be additionally arranged along the edge of the color separating lens array 340, so that light may be provided to the photosensitive cells arranged along the edge of the sensor substrate 110 in the same manner as the photosensitive cells arranged inside the sensor substrate 110. The embodiments shown in FIGS. 23 and 24 may also be applied to the above-described color separating lens arrays 130, 140, 150, 160, and 170.

Figure 25:
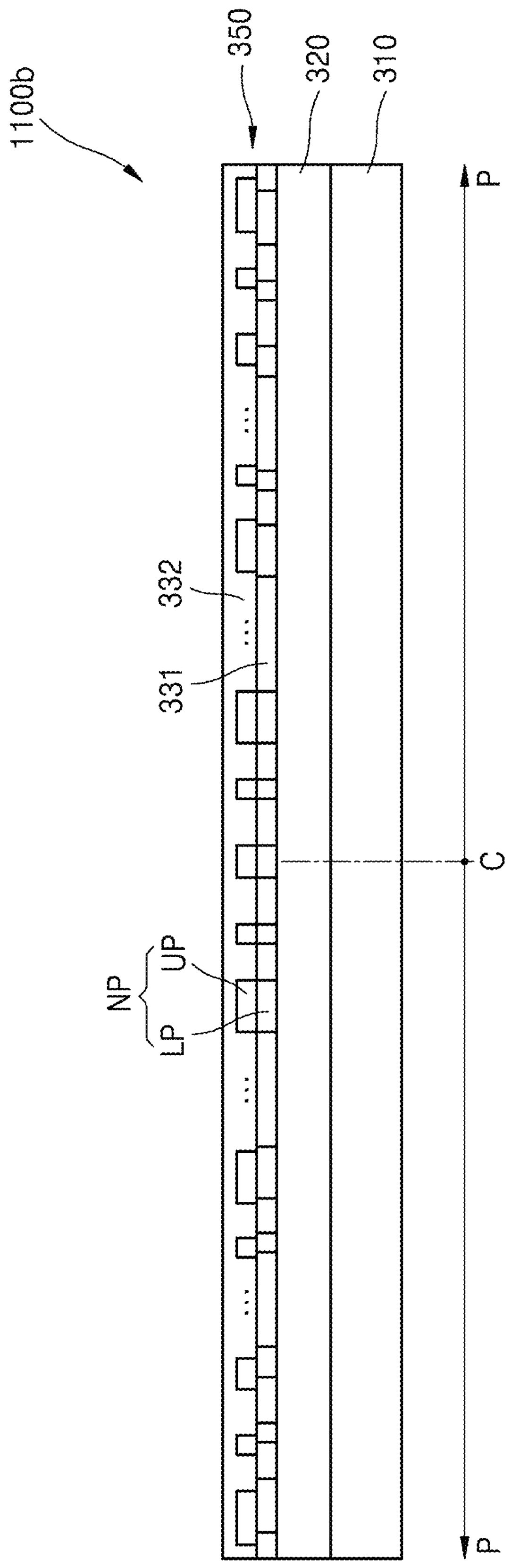
FIG. 25 is a cross-sectional view showing a schematic structure of an image sensor according to another example embodiment.
Figure 26:
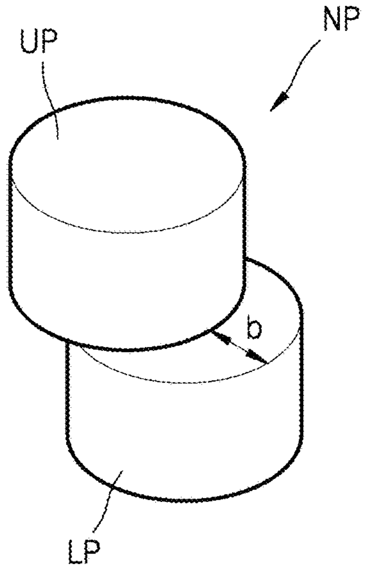
FIG. 26 is a perspective view showing an exemplary shape of nanoposts employed in the color separating lens array of the image sensor of FIG. 25.

FIG. 25 is a cross-sectional view showing a schematic structure of a pixel array according to another example embodiment, and FIG. 26 is a perspective view showing an exemplary shape of nanoposts NP employed in a color separating lens array of FIG. 25.

A pixel array 1100*b* includes a sensor substrate 310 for sensing light and a color separating lens array 350 arranged on the sensor substrate 310. A spacer layer 320 is arranged between the sensor substrate 310 and the color separating lens array 350. The color separating lens array 350 may include a plurality of nanoposts NP that are supported by the spacer layer 320 and are arranged according to a certain rule. The sensor substrate 310 may include a plurality of photosensitive cells for sensing light and may face in one-to-one correspondence with a plurality of regions of the color separating lens array 350. The indication of such a region division is omitted for convenience.

The color separating lens array 350 according to the example embodiment is different from the above-described example embodiments in that each of the plurality of nanoposts NP includes lower posts LP and upper posts UP stacked on the lower posts LP.

According to an example embodiment, part of the plurality of nanoposts NP may have a shape in which the lower posts LP and the upper posts UP are stacked so as to be shifted from one another. The degree of deviation is indicated by b in FIG. 26, and the size may increase from a central portion C to a peripheral portion P of the image sensor 302, i.e., along a radial direction. A direction in which the upper posts UP deviate from the lower posts LP, is a direction from the central portion C toward the peripheral portion P.

In order to manufacture the nanoposts NP with such a structure, a first material layer 331 that fills a region between the lower posts LP and supports the upper posts UP, and a second material layer 332 that covers the upper posts UP may be further provided. The first material layer 331 and the second material layer 332 may be formed of a material having a refractive index lower than the refractive index of a material for forming the upper posts UP and the lower posts LP.

This arrangement takes into account that light incidence angles at a peripheral portion P and a central portion C of the pixel array 1100*b* employed in an image capturing device are different from each other. Generally, light is vertically incident in the vicinity of the central portion C of the pixel array 1100*b*, and an incidence angle increases toward the peripheral portion P. The nanoposts NP may be configured in a shape corresponding to this incidence path so that color separation intended by the nanoposts NP may be more easily generated even for oblique rays incident on the image sensor 302.

Although the nanoposts NP illustrate a structure in which they are stacked in two layers, i.e., upper and lower layers, the nanoposts NP may have a structure of three or more layers, and the shape or size of the nanoposts of the upper and lower layers may be changed according to locations. The embodiments shown in FIGS. 25 and 26 may also be applied to the above-described color separating lens arrays 130, 140, 150, 160, 170, and 340.

Although the nanoposts NP illustrated in FIG. 25 have a structure in which some nanoposts NP are stacked without deviations and some nanoposts NP are stacked with deviations, the disclosure is not limited thereto. For instance, according to an example embodiment, all the nanoposts NP in pixel array may be stacked without deviations or all the nanoposts NP in pixel array may be stacked with deviations.

According to the above-described example embodiments, light loss due to the color filter is very minimal, and therefore a sufficient amount of light may be efficiently provided to a pixel even if the size of the pixel is reduced. Thus, an ultra-high resolution, ultra-small, and high-sensitivity image sensor having hundreds of millions of pixels or more may be manufactured. Such an ultra-high resolution, ultra-small, and high-sensitivity image sensor may be employed in various high performance optical devices or high performance electronic apparatuses. Such electronic apparatuses may be, for example, smart phones, mobile phones, personal digital assistants (PDAs), laptop computers, personal computers (PCs), various portable devices, home appliances, security cameras, medical cameras, automobiles, Internet of Things (IoT) devices, or other mobile or non-mobile computing devices and are not limited thereto.

Figure 27:
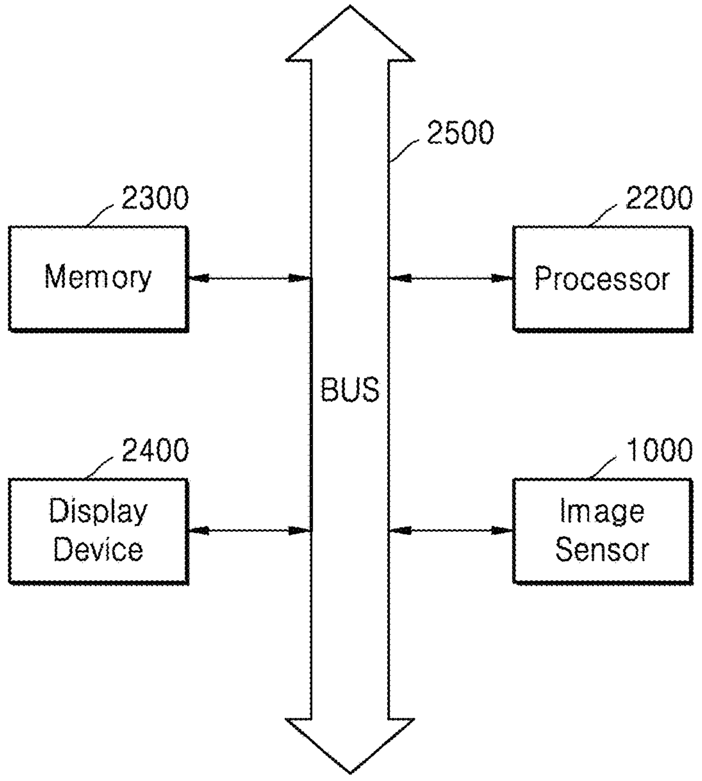
FIG. 27 is a block diagram schematically illustrating an electronic apparatus including an image sensor according to an example embodiment.
Figure 28:
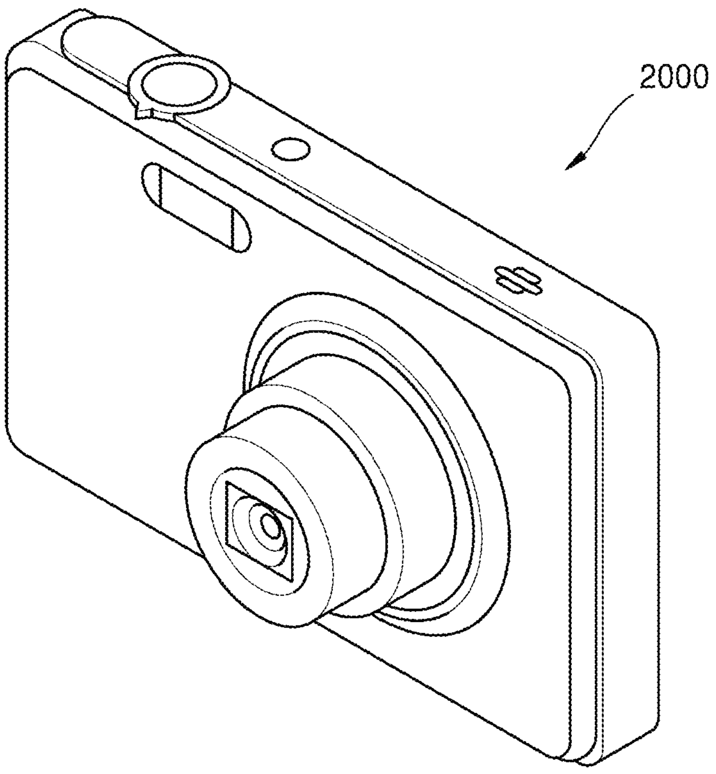
FIGS. 28 through 38 illustrate various examples of multimedia electronic apparatuses to which an image sensor according to example embodiments is applied.

FIG. 27 is a block diagram schematically illustrating an electronic apparatus including an image sensor according to embodiments. The electronic apparatus may include an image sensor 1000, a processor 2200, memory 2300, a display device 2400, and a bus 2500. The image sensor 1000 may obtain image information about an external object according to control of the processor 2200 and may provide the image information to the processor 2200. The processor 2200 may store the image information provided from the image sensor 1000 in the memory 2300 via the bus 2500 and may output the image information stored in the memory 2300 to the display device 2400 to display the image information to a user. Also, the processor 2200 may perform various image processing on the image information provided from the image sensor 1000.

FIGS. 28 through 38 illustrate various examples of multimedia electronic apparatuses to which an image sensor according to one or more example embodiments is applied.

According to one or more example embodiments, image sensors illustrated in this disclosure may be applied to various electronic devices having an image capturing function. For example, the image senor may be applied to a camera 2000 shown in FIG. 28. The camera 2000 may be a digital camera or digital camcorder.

Figure 29:
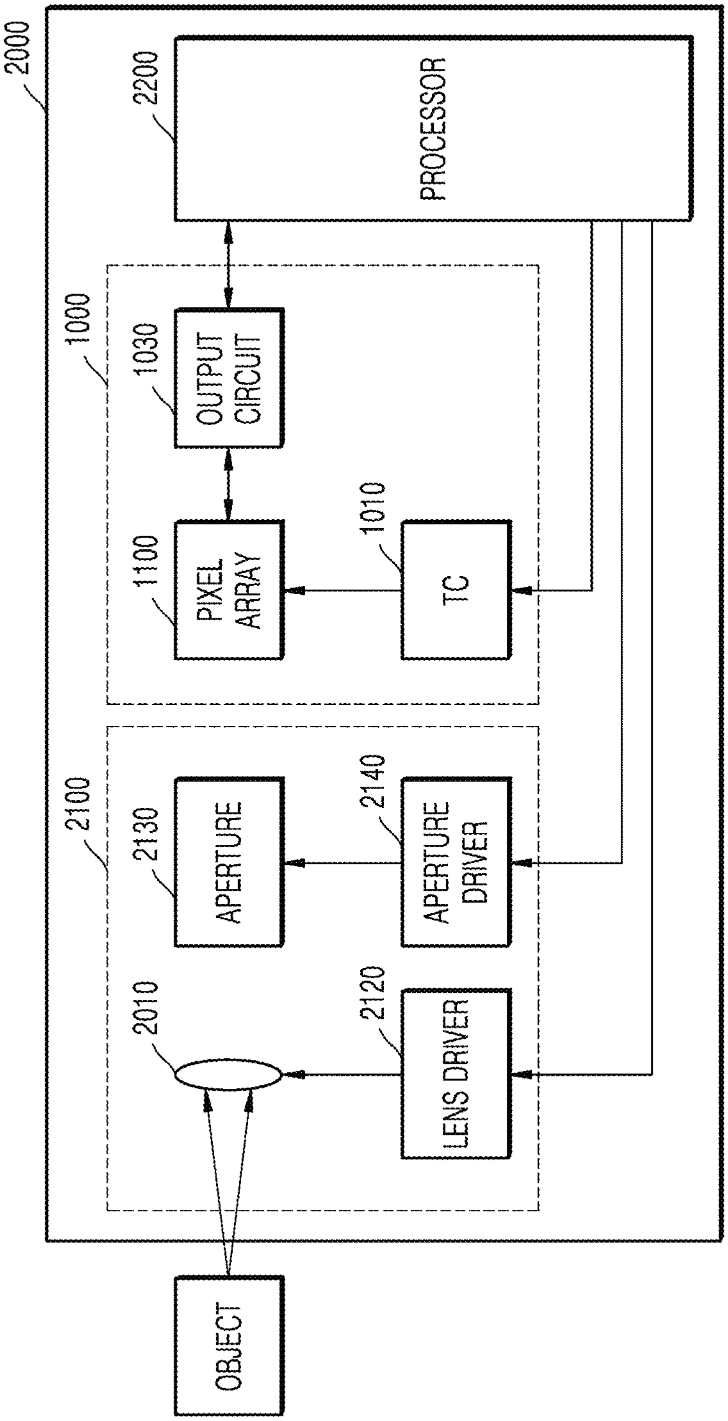

Referring to FIG. 29, the camera 2000 may include an image capturing unit 2100, an image sensor 1000, and a processor 2200.

The image capturing unit 2100 may focus light reflected from an object OBJ to form an optical image. The image capturing unit 2100 may include an objective lens 2010, a lens driver 2120, an aperture 2130, and an aperture driver 2140. Although only one lens is illustrated representatively for convenience in FIG. 29, the disclosure is not limited thereto. However, according to other example embodiments, the objective lens 2010 may include a plurality of lenses having different sizes and shapes. The lens driver 2120 may communicate information about focus detection with the processor 2200 and may adjust the location of the objective lens 2010 according to a control signal provided by the processor 2200. The lens driver 1120 may move the objective lens 2010 to adjust a distance between the objective lens 2010 and the object OBJ or to adjust locations of individual lenses in the objective lens 2010. The lens driver 2120 may drive the objective lens 2010 so that a focus on the object OBJ may be adjusted. The camera 2000 may have an auto focus (AF) function.

The aperture driver 2140 may communicate information about the amount of light with the processor 2200 and may adjust the aperture 2130 according to the control signal provided by the processor 2200. For example, the aperture driver 2140 may increase or decrease the aperture of the aperture 2130 according to the amount of light entering the camera 2000 through the objective lens 2010 and may adjust an opening time of the aperture 2130.

The image sensor 1000 may generate an electrical image signal based on the intensity of incident light. The image sensor 1000 may include a pixel array 1100, a timing controller 1010, and an output circuit 1030. According to an example embodiment, the image sensor 1000 may further include a row decoder shown in FIG. 1. Light that transmits through the objective lens 2010 and the aperture 2130 may form an image of the object OBJ on a light-receiving surface of the pixel array 1100. The pixel array 1100 may be a CCD or CMOS that converts an optical signal into an electrical signal. The pixel array 1100 may include additional pixels for performing an AF function or distance measurement function. Also, the pixel array 1100 may include the above-described color separating lens array.

The processor 2200 may control the overall operation of the camera 2000 and may have an image processing function. For example, the processor 2200 may provide a control signal for an operation of each component to the lens driving unit 2120, the aperture driving unit 2140, and the timing controller 1010.

Figure 30:
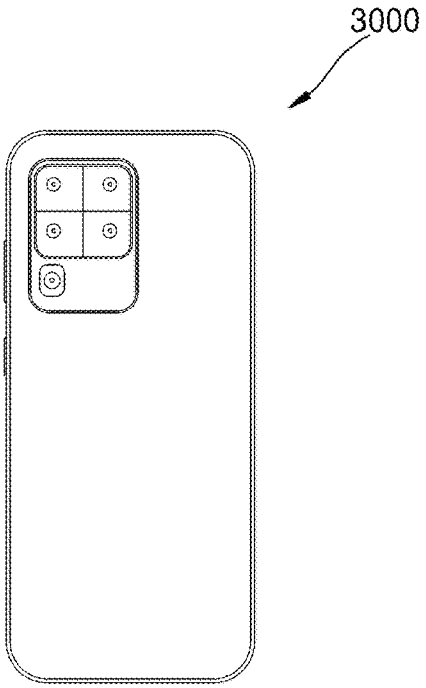
Figure 31:
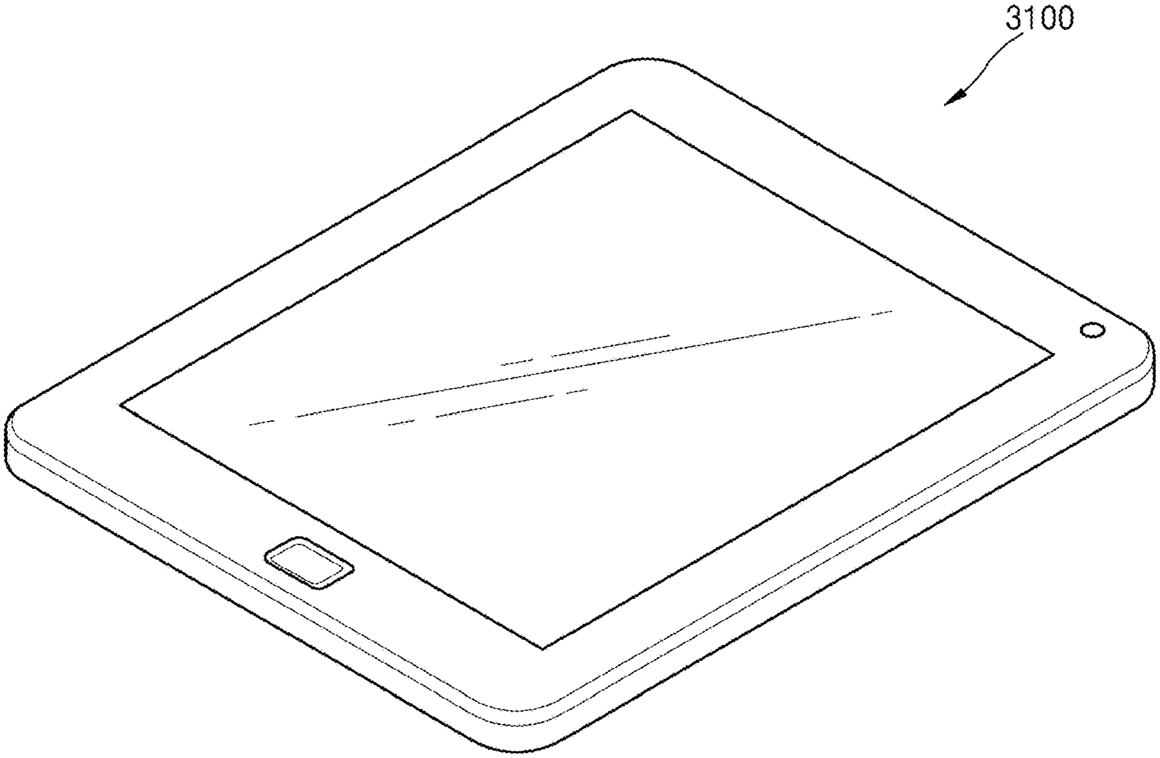
Figure 32:
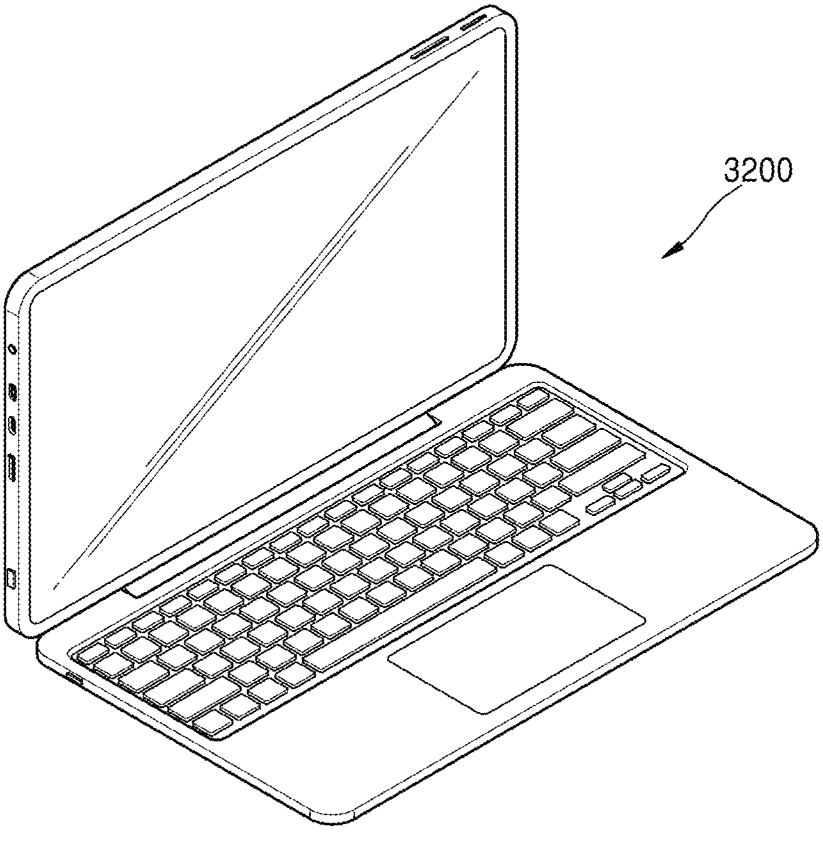
Figure 33:
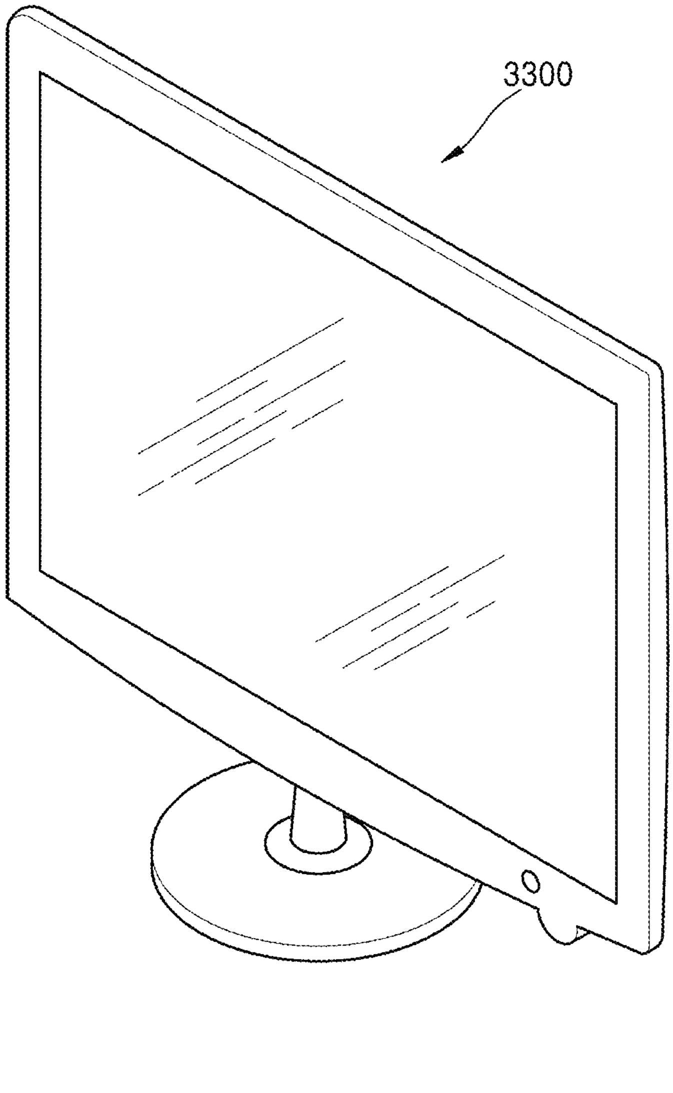

The image sensor according to example embodiments may be applied to a mobile phone or smartphone 3000 shown in FIG. 30, a tablet or smart tablet 3100 shown in FIG. 31, a laptop computer 3200 shown in FIG. 32, or a television or smart television 3300 shown in FIG. 33. For example, the smartphone 3000 or the smart table 3100 may include a plurality of high resolution cameras each equipped with a high resolution image sensor. Depth information about objects in an image may be extracted using high-resolution cameras, or out-focusing of the image may be adjusted, or the objects in the image may be automatically identified.

Figure 34:
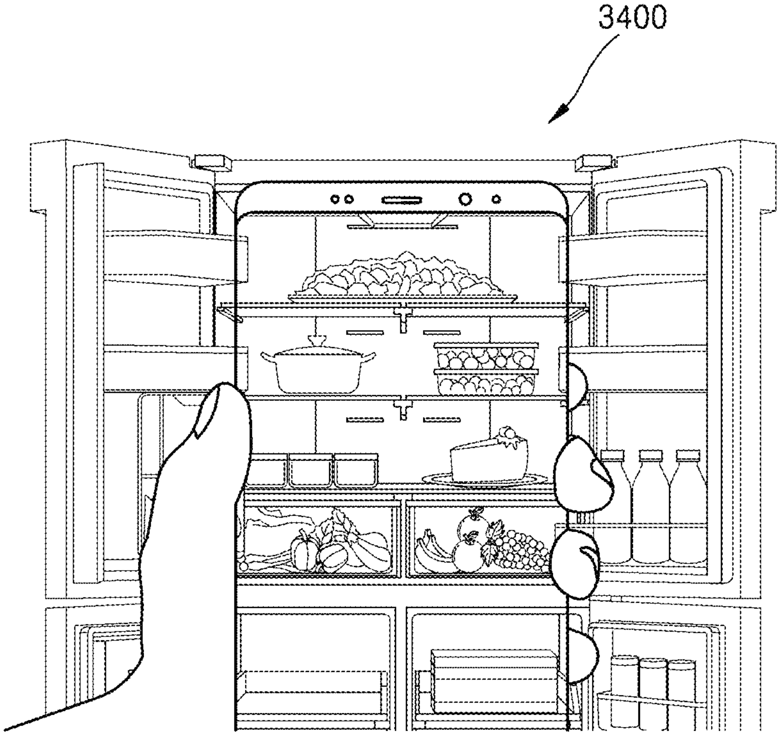
Figure 35:
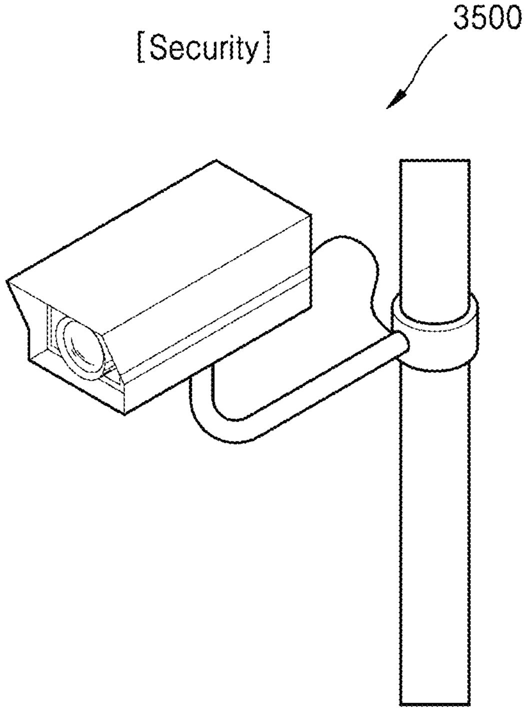
Figure 36:
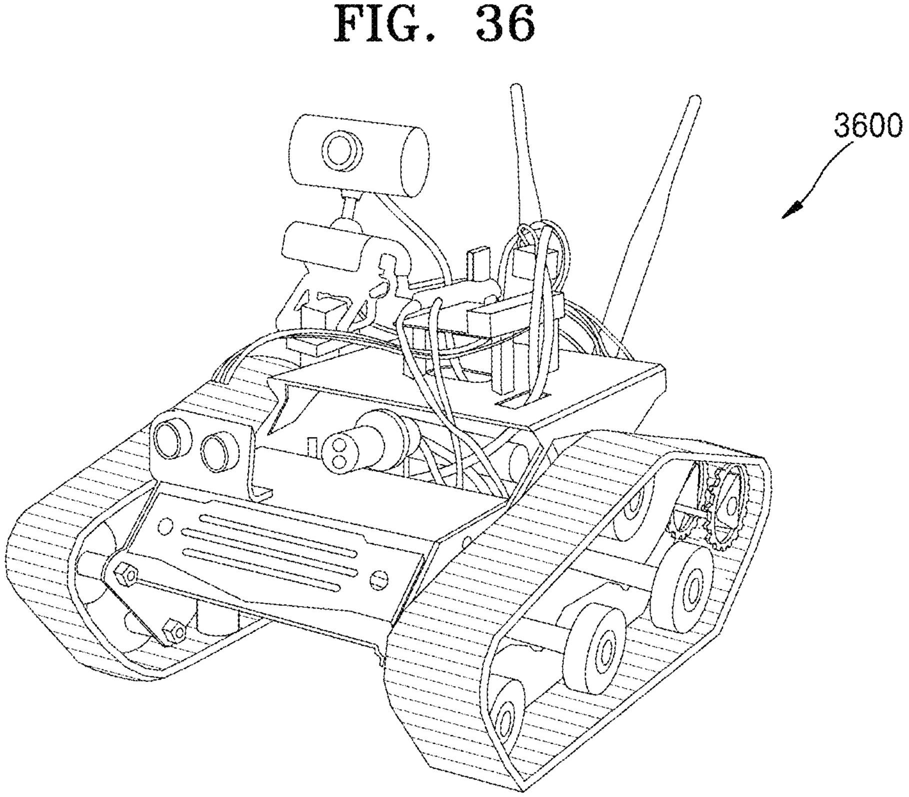
Figure 37:
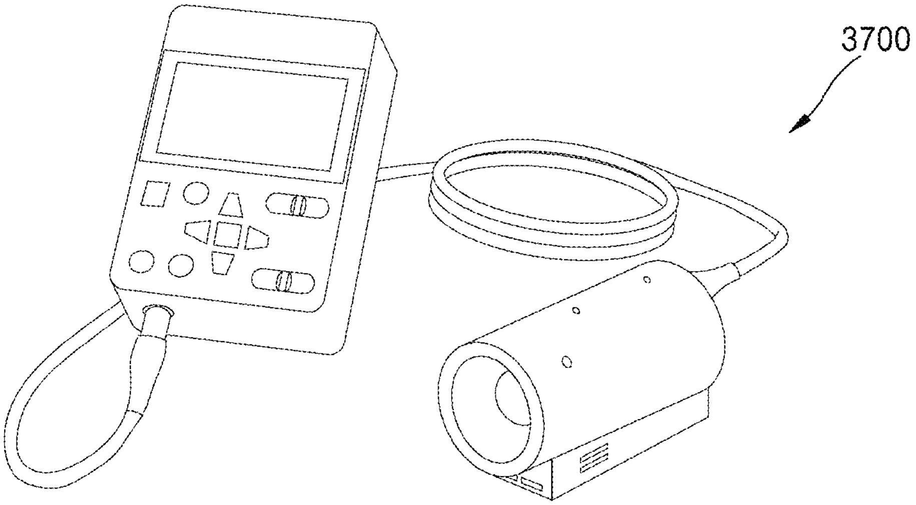

Also, the image sensor may be applied to a smart refrigerator 3400 shown in FIG. 34, a camera 3500 shown in FIG. 35, a robot 3600 shown in FIG. 36, and a medical camera 3700 shown in FIG. 35. For example, the smart refrigerator 3400 may automatically recognize food in the refrigerator using an image sensor, and inform the user of the existence of a specific food, the type of food that has been put in or released, and the like through the smartphone. The camera 3500 may be a security camera or a surveillance camera that may provide an ultra-high resolution image and may use a high sensitivity to recognize an object or person in the image even in a dark environment. The robot 3600 may be input at a disaster or industrial site that cannot be directly accessed by humans and may provide a high-resolution image. The medical camera 3700 may provide a high-resolution image for diagnosis or surgery and may dynamically adjust a field of view.

Figure 38:
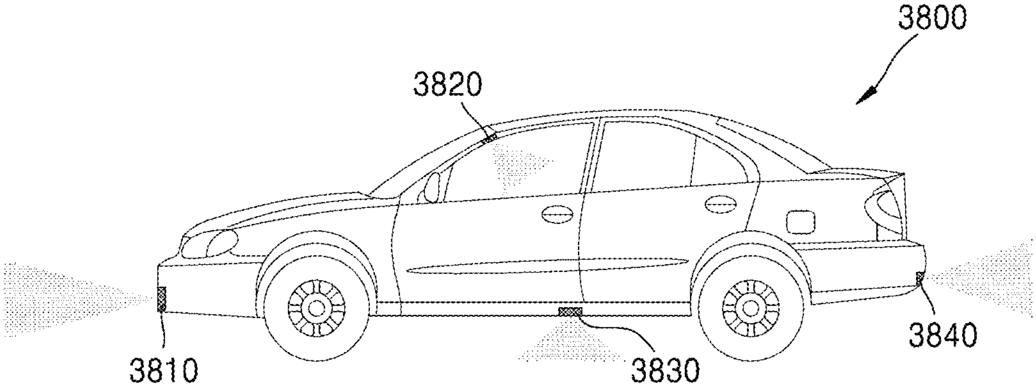

Also, the image sensor may be applied to a vehicle 3800, as shown in FIG. 38. The vehicle 3800 may include a plurality of vehicle cameras 3810, 3820, 3830, and 3840 arranged in various locations. Each of the plurality of vehicle cameras 3810, 3820, 3830, and 3840 may include an image sensor according to an example embodiment. The vehicle 3800 may provide a variety of information about the interior or surroundings of the vehicle 3800 to a driver using the plurality of vehicle cameras 3810, 3820, 3830, and 3840 and may automatically recognize objects or people in the image to provide information necessary for autonomous driving.

Since the disclosed color separating lens array may separate and condense light for each wavelength without absorbing or blocking incident light, the light usage efficiency of the image sensor may be enhanced. Also, the image sensor that employs the disclosed color separating lens array may maintain the Bayer pattern method that is generally adopted in the image sensor and thus, a pixel structure and an image processing algorithm for an existing image sensor may be utilized. Also, the image sensor employing the disclosed color separating lens array does not require a separate micro-lens for condensing light onto a pixel.

Although the image sensor including the above-described color separating lens array and the electronic apparatus including the same have been described with reference to the example embodiments shown in the drawings, the disclosure is not limited thereto, and it will be understood by those skilled in the art that variations and other equivalent embodiments are possible. Therefore, the example embodiments should be considered in a descriptive sense only and not for purposes of limitation. The scope of the rights is indicated in the claims rather than the above description, and all differences within the scope of the same should be interpreted as being included in the scope of the rights.

It should be understood that example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. An image sensor comprising:

a sensor substrate comprising a first photosensitive cell and a second photosensitive cell configured to sense light; and a color separating lens array comprising a first region and a second region, wherein the first region faces the first photosensitive cell and comprises a plurality of first nanoposts and the second region faces the second photosensitive cell and comprises a plurality of second nanoposts, wherein a first size of at least one of the plurality of first nanoposts is different from a second size of at least one of the plurality of second nanoposts or a first shape of the at least one of the plurality of first nanoposts is different from a second shape of the at least one of the plurality of second nanoposts, and wherein the first and the second nanoposts form a phase distribution at a location where the light pass through the first region and the second region, by the phase distribution, light having a first wavelength and light having a second wavelength different from each other from among incident light incident on the color separating lens array are branched in different directions and the light having the first wavelength is condensed onto the first photosensitive cell and the light having the second wavelength is condensed onto the second photosensitive cell.

2. The image sensor of claim 1, wherein, with respect to the light of the first wavelength, the plurality of first nanoposts and the plurality of second nanoposts form at a location immediately after the light passes through the color separating lens array, a phase distribution of $2N\pi$ at a position corresponding to a center of the first photosensitive cell, a phase distribution of $(2N-1)\pi$ at a position corresponding to a center of the second photosensitive cell, and Nis an integer greater than 0.

3. The image sensor of claim 2, wherein, with respect to a light of the second wavelength, the plurality of first nanoposts and the plurality of second nanoposts form, at the location immediately after the light passes through the color separating lens array, a phase distribution of $(2M-1)\pi$ at a position corresponding to a center of the first photosensitive cell, a phase distribution of $2M\pi$ at a position corresponding to a center of the second photosensitive cell, and M is an integer greater than 0.

4. The image sensor of claim 1, further comprising a spacer layer arranged between the sensor substrate and the color separating lens array.

5. The image sensor of claim 4, wherein the spacer layer has a thickness corresponding to a focal length of the color separating lens array with respect to a center wavelength of a wavelength band of incident light that is to be color separated by the color separating lens array.

6. The image sensor of claim 4, wherein, when a theoretical thickness of the spacer layer is ht, a pitch of each photosensitive cell is p, a refractive index of the spacer layer is n and a center wavelength of a wavelength band of light that is to be color separated by the color separating lens array is $\lambda_0$, the theoretical thickness $h_t$ of the spacer layer is expressed by the following equation:

$$h_t = \frac{np^2}{\lambda_0} - \frac{\lambda_0}{4n},$$

and an actual thickness h of the spacer layer is selected within a range of $h_t - p \leq h \leq h_t + p$.

7. The image sensor of claim 1, wherein the sensor substrate further comprises a third photosensitive cell and a fourth photosensitive cell configured to sense the light, and the color separating lens array further comprises a third region and a fourth region, wherein the third region faces the third photosensitive cell and comprises a plurality of third nanoposts and the fourth region faces the fourth photosensitive cell and comprises a plurality of fourth nanoposts, wherein at least one of a third size or a third shape of the plurality of third nanoposts is different from at least one of a fourth size or a fourth shape of the plurality of fourth nanoposts.

8. The image sensor of claim 7, wherein the first through fourth nanoposts form a phase distribution at a location where the light pass through the first through fourth regions, by the phase distribution, light having a first wavelength, light having a second wavelength and light having a third wavelength different from one another from among incident light incident on the color separating lens array are branched in different directions, light having a first wavelength is condensed onto the first photosensitive cell and the fourth photosensitive cell, light having a second wavelength is condensed onto the second photosensitive cell and light having a third wavelength is condensed onto the third photosensitive cell.

9. The image sensor of claim 8, wherein the light having the first wavelength is green light, the light having the second wavelength is blue light, and the light having the third wavelength is red light.

10. The image sensor of claim 7, wherein, with respect to the light of the first wavelength, the first through fourth nanoposts form, at a location immediately after the light passes through the color separating lens array, a phase distribution of $2N\pi$ at a position corresponding to a center of the first photosensitive cell and a center of the fourth photosensitive cell, a phase distribution of $(2N-1)\pi$ at a position corresponding to a center of the second photosensitive cell and a center of the third photosensitive cell, and N is an integer greater than 0.

11. The image sensor of claim 10, wherein, with respect to the light of the second wavelength, the first through fourth nanopost form, at the location immediately after the light passes through the color separating lens array, a phase distribution of $(2M-1)\pi$ at a position corresponding to a center of the first photosensitive cell and a center of the fourth photosensitive cell, a phase distribution of $2M\pi$ at a position corresponding to a center of the second photosensitive cell, a phase distribution that is greater than $(2M-2)\pi$ and less than $(2M-1)\pi$ at a position corresponding to a center of the third photosensitive cell, and M is an integer greater than 0.

12. The image sensor of claim 11, wherein, with respect to the light of the third wavelength, the first through fourth nanopost form, at the location immediately after the light passes through the color separating lens array, a phase distribution of $(2L-1)\pi$ at a position corresponding to a center of the first photosensitive cell and a center of the fourth photosensitive cell, a phase distribution of $2L\pi$ at a position corresponding to a center of the third photosensitive cell, a phase distribution that is greater than $(2L-2)\pi$ and less than $(2L-1)\pi$ at a position corresponding to a center of the second photosensitive cell, and L is an integer greater than 0.

13. The image sensor of claim 10, wherein the image sensor has a pixel arrangement structure in which a plurality of unit pixels including a red pixel, a green pixel and a blue pixel are arranged in a Bayer pattern, and among the first through fourth nanoposts, nanoposts in a region corresponding to the green pixel from among the first through fourth regions have different distribution rules in a first direction and a second direction perpendicular to the first direction.

14. The image sensor of claim 13, wherein among the first through fourth nanoposts, nanoposts in regions corresponding to the blue pixel and the red pixel from among the first through fourth regions have a symmetrical distribution rule in the first direction and the second direction.

15. The image sensor of claim 13, wherein one of the first through fourth nanoposts located in a center of a region corresponding to the green pixel from among the first through fourth regions has a greater cross-sectional area than another of the first through fourth nanoposts located in a region corresponding to a pixel of another color.

16. The image sensor of claim 13, wherein, in a region corresponding to the green pixel from among the first through fourth regions, one of the first through fourth nanoposts located in a center of the region have a greater cross-sectional area than another of the first through fourth nanoposts located on a periphery of the region.

17. The image sensor of claim 1, wherein the color separating lens array further comprises a plurality of first regions and a plurality of second regions, which are arranged to protrude from an edge of the sensor substrate and do not face any photosensitive cell of the sensor substrate in a vertical direction.

18. The image sensor of claim 1, wherein at least one of the plurality of first nanoposts and the plurality of second nanoposts comprises a lower post and an upper post stacked on the lower post, and wherein the lower post and the upper post are stacked to be offset from one another.

19. The image sensor of claim 18, wherein a degree of the offset between the lower post and the upper post increases from a central portion to a periphery portion of the image sensor.

20. An image sensor comprising:

a sensor substrate comprising a plurality of first photosensitive cells and a plurality of second photosensitive cells alternately arranged along a first row and a plurality of third photosensitive cells and a plurality of fourth photosensitive cells alternately arranged along a second row adjacent to the first row; and a color separating lens array comprising a plurality of first regions each facing the plurality of first photosensitive cells and comprising a plurality of first nanoposts, a plurality of second regions each facing the plurality of second photosensitive cells and comprising a plurality of second nanoposts, a plurality of third regions each facing the plurality of third photosensitive cells and comprising a plurality of third nanoposts, and a plurality of fourth regions each facing the plurality of fourth photosensitive cells and comprising a plurality of fourth nanoposts, wherein, in the first region, a first size of at least one of the plurality of first nanoposts or a first shape of the at least one of the plurality of first nanoposts are configured to: condense light having a first wavelength onto the first photosensitive cell located directly below the first region, branch light having a second wavelength onto the second photosensitive cell adjacent to the first photosensitive cell in a horizontal direction, and branch light having a third wavelength onto the third photosensitive cell adjacent to the first photosensitive cell in a vertical direction, and wherein, in the second region, a second size of at least one of the plurality of second nanoposts or a second shape of the at least one of the plurality of second nanoposts are configured to: condense light having the second wavelength onto the second photosensitive cell located directly below the second region, branch light having the first wavelength onto the first photosensitive cell adjacent to the second photosensitive cell in the horizontal direction and onto the fourth photosensitive cell adjacent to the second photosensitive cell in a vertical direction, and branch light having a third wavelength onto the third photosensitive cell adjacent to the second photosensitive cell in a diagonal direction.

21. The image sensor of claim 20, wherein the light having the first wavelength is green light, the light having the second wavelength is blue light, and the light having the third wavelength is red light.

22. An electronic apparatus comprising:

an image capturing unit configured to focus light reflected from an object and to form an optical image; and the image sensor of claim 1, configured to convert the optical image formed by the image capturing unit into an electrical signal.

23. The electronic apparatus of claim 22, wherein the electronic apparatus comprises a smart phone, a mobile phone, a personal digital assistant (PDA), a laptop computer, a personal computer (PC), a home appliance, a security camera, a medical camera, a vehicle, or an Internet of Things (IOT) device.

* * * * *